US012707951B2

(12) United States Patent
Seo et al.

(10) Patent No.: US 12,707,951 B2
(45) Date of Patent: Aug. 11, 2026

(54) SEMICONDUCTOR MEMORY DEVICE INCLUDING PAD SACRIFICE FILMS AND ELECTRONIC SYSTEM INCLUDING THE SAME

(71) Applicant: SAMSUNG ELECTRONICS CO., LTD., Suwon-si (KR)

(72) Inventors: Ji Youn Seo, Suwon-si (KR); Sang Ho Rha, Suwon-si (KR); Tae-Jong Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 799 days.

(21) Appl. No.: 17/981,119

(22) Filed: Nov. 4, 2022

(65) Prior Publication Data

US 2023/0307371 A1 Sep. 28, 2023

(30) Foreign Application Priority Data

Mar. 24, 2022 (KR) ........................ 10-2022-0036551

(51) Int. Cl.
*H10W 20/20* (2026.01)
*H10B 43/27* (2023.01)
*H10B 43/40* (2023.01)

(52) U.S. Cl.
CPC ............ *H10W 20/20* (2026.01); *H10B 43/27* (2023.02); *H10B 43/40* (2023.02)

(58) Field of Classification Search
CPC ........ H10B 43/27; H10B 43/40; H10B 43/35; H10B 43/10; H10B 43/50; H10B 41/23; H10B 43/23; H10B 41/40; H10B 41/50
See application file for complete search history.

(56) References Cited

U.S. PATENT DOCUMENTS 8,765,598 B2 7/2014 Smith et al.
9,768,233 B1 9/2017 Fukuda et al.
(Continued)

FOREIGN PATENT DOCUMENTS

KR 10-2021-0032271 A 3/2021
KR 10-2021-0039183 A 4/2021
KR 10-2021-0079087 A 6/2021

OTHER PUBLICATIONS

Communication dated Jan. 2, 2026, issued by the Korean Ministry of Intellectual Property in Korean Application No. 10-2022-0036551.

*Primary Examiner* — Julio J Maldonado
*Assistant Examiner* — Alexander Michael Miller
(74) *Attorney, Agent, or Firm* — Sughrue Mion, PLLC

(57) ABSTRACT

A semiconductor memory device includes a peripheral circuit structure including a peripheral circuit substrate, a peripheral circuit element on the peripheral circuit substrate, and a wiring structure connected to the peripheral circuit element and a memory cell structure provided on the peripheral circuit structure. The memory cell structure includes a cell substrate including a cell array region, an extended region, and a through region, a mold structure including a plurality of gate electrodes sequentially provided on the cell array region and on the extended region in a step form, and a plurality of mold sacrifice films sequentially provided on the through region, a channel structure intersecting the plurality of gate electrodes on the cell array region, and a cell contact penetrating the mold structure on the extended region and configured to connect at least one of the plurality of gate electrodes and the wiring structure.

17 Claims, 40 Drawing Sheets

(56) References Cited

U.S. PATENT DOCUMENTS

| | | | | |
|---|---|---|---|---|
| 9,953,999 | B2 | 4/2018 | Nam et al. | |
| 10,297,543 | B2 | 5/2019 | Park et al. | |
| 10,312,138 | B2 | 6/2019 | Hyun et al. | |
| 10,748,923 | B2 | 8/2020 | Son et al. | |
| 2020/0350249 | A1 | 11/2020 | Kim et al. | |
| 2020/0402996 | A1* | 12/2020 | Cheon | H10B 43/10 |
| 2021/0098367 | A1* | 4/2021 | Lee | H10B 43/50 |

* cited by examiner

FIG. 3

A1
THR
EXT
CA
DCH
CH
B
WLC
SC

A2
THR
EXT
E3
E2
E1
CA
DCH
CH
A2
WLC
SC
WLC
SC
WLC

CELL
PERI
112
110
101
260
240
200
A1
T2
T1
THR
CP2
104
103
100
CP1
EXT
101
PT
CA
A1
300
112
110
112
110
104
103
100
pMS1

SEMICONDUCTOR MEMORY DEVICE INCLUDING PAD SACRIFICE FILMS AND ELECTRONIC SYSTEM INCLUDING THE SAME

CROSS-REFERENCE TO RELATED APPLICATION

This application is based on and claims priority to Korean Patent Application No. 10-2022-0036551, filed on Mar. 24, 2022 in the Korean Intellectual Property Office, the disclosure of which are incorporated by reference herein in its entirety.

BACKGROUND

1. Field

Example embodiments of the present disclosure relate to a semiconductor memory device, a method for fabricating the same, and an electronic system including the same, and in particular, to a semiconductor memory device including a through-type cell contact, a method for fabricating the same, and an electronic system including the same.

2. Description of Related Art

There is a need to increase the degree of integration of semiconductor memory devices to satisfy excellent performance and low price required by consumers. In the case of the semiconductor memory device, because the degree of integration is an important factor in determining the price of a product, an increased degree of integration is particularly required.

On the other hand, in the case of a two-dimensional or planar semiconductor memory device, the degree of integration is mainly determined by an area occupied by unit memory cells, and is therefore greatly affected by the level of fine pattern forming technology. However, since expensive apparatuses are required to miniaturize the pattern, the degree of integration of the two-dimensional semiconductor memory device is increasing, but is still limited. Accordingly, three-dimensional semiconductor memory devices including memory cells arranged three-dimensionally have been proposed.

SUMMARY

Provided is a semiconductor memory device which is capable of improving defects and has reduced production costs.

Provided is a method for fabricating a semiconductor memory device which is capable of improving defects and has reduced production costs.

Provided is an electronic system including the semiconductor memory device which is capable of improving defects and has reduced production costs.

Additional aspects will be set forth in part in the description which follows and, in part, will be apparent from the description, or may be learned by practice of the presented embodiments.

According to an aspect of an example embodiment, a semiconductor memory device may include a peripheral circuit structure including a peripheral circuit substrate, a peripheral circuit element on the peripheral circuit substrate, and a wiring structure connected to the peripheral circuit element and a memory cell structure provided on the peripheral circuit structure. The memory cell structure may include a cell substrate including a cell array region, an extended region, and a through region, a mold structure including a plurality of gate electrodes sequentially provided on the cell array region and on the extended region in a step form, and a plurality of mold sacrifice films sequentially provided on the through region, a channel structure intersecting the plurality of gate electrodes on the cell array region, a cell contact penetrating the mold structure on the extended region and configured to connect at least one of the plurality of gate electrodes and the wiring structure, a pad sacrifice film extending along exposed upper surfaces of the plurality of mold sacrifice films, and a through via penetrating the mold structure and the pad sacrifice film on the through region, the through via being connected to the wiring structure. The plurality of mold sacrifice films may include a selective mold sacrifice film contacting the through via, and a non-selective mold sacrifice film different from the selective mold sacrifice film, and the pad sacrifice film may include an insulating film doped with an impurity element, or the selective mold sacrifice film may include material properties different from material properties of the non-selective mold sacrifice film.

According to an aspect of an example embodiment, a semiconductor may device may include a cell substrate including a cell array region, an extended region, and a through region, a mold structure including a plurality of gate electrodes sequentially provided on the cell array region and on the extended region in a step form, each of the plurality of gate electrodes including a pad region in which an upper surface is exposed, and a plurality of mold sacrifice films sequentially provided on the through region, a channel structure provided on the cell array region, extending in a vertical direction intersecting an upper surface of the cell substrate and intersecting the plurality of gate electrodes, a cell contact extending in the vertical direction, penetrating the mold structure on the extended region, and connected to the pad region, a pad sacrifice film extending along exposed upper surfaces of the plurality of mold sacrifice films, and a through via extending in the vertical direction, and penetrating the mold structure and the pad sacrifice film on the through region. Each the plurality of gate electrodes may have a first thickness in the pad region thicker than a second thickness in a region other than the pad region, and the pad sacrifice film may include an insulating film doped with at least one impurity element among carbon (C), nitrogen (N), oxygen (O), and silicon (Si).

According to an aspect of an example embodiment, an electronic system may include a main board, a semiconductor memory device on the main board, and a controller electrically connected to the semiconductor memory device on the main board. The semiconductor memory device may include a cell substrate including a cell array region, an extended region, and a through region, a mold structure including a plurality of gate electrodes sequentially provided on the cell array region and on the extended region in a step form, and a plurality of mold sacrifice films sequentially provided on the through region, a channel structure intersecting the plurality of gate electrodes on the cell array region, a cell contact penetrating the mold structure on the extended region and configured to connect at least one of the plurality of gate electrodes and the controller, a pad sacrifice film extending along exposed upper surfaces of the plurality of mold sacrifice films, and a through via penetrating the mold structure and the pad sacrifice film on the through region, the through via configured to be connected to the controller. The plurality of mold sacrifice films may include a selective mold sacrifice film contacting the through via, and a non-selective mold sacrifice film different from the selective mold sacrifice film, and the pad sacrifice film may include an insulating film doped with an impurity element, or the selective mold sacrifice film may include material properties different from material properties of the non-selective mold sacrifice film.

BRIEF DESCRIPTION OF DRAWINGS

The above and other aspects and features of the present disclosure will become more apparent by describing in detail exemplary embodiments thereof with reference to the attached drawings, in which:

FIG. 3 is a diagram of a semiconductor memory device according to an example embodiment;

FIG. 4 is a cross-sectional view taken along a line A1-A1 of FIG. 3 according to an example embodiment;

FIG. 16B is a cross-sectional view of a semiconductor memory device according to an example embodiment;

FIG. 17 is a diagram of the semiconductor memory device according to an example embodiment;

FIG. 18 is a cross-sectional view taken along A2-A2 of FIG. 17 according to an example embodiment;

FIGS. 20, 21, 22, 23, 24, 25, 26, 27, 28, 29, 30, 31, 32, 33, 34, 35 and 36 are diagrams of a method for fabricating a semiconductor memory device according to an example embodiment;

Figure 40:
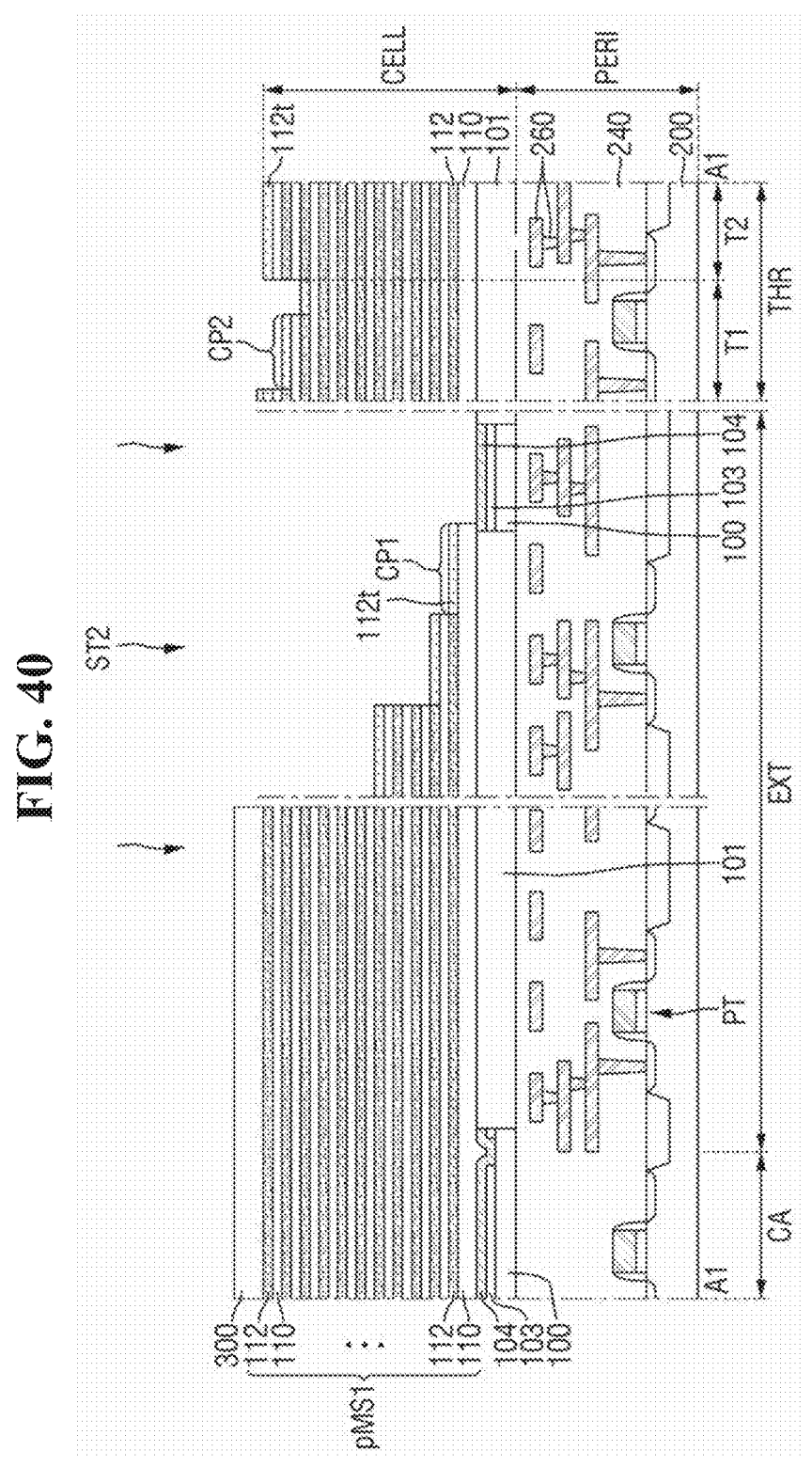
Figure 41:
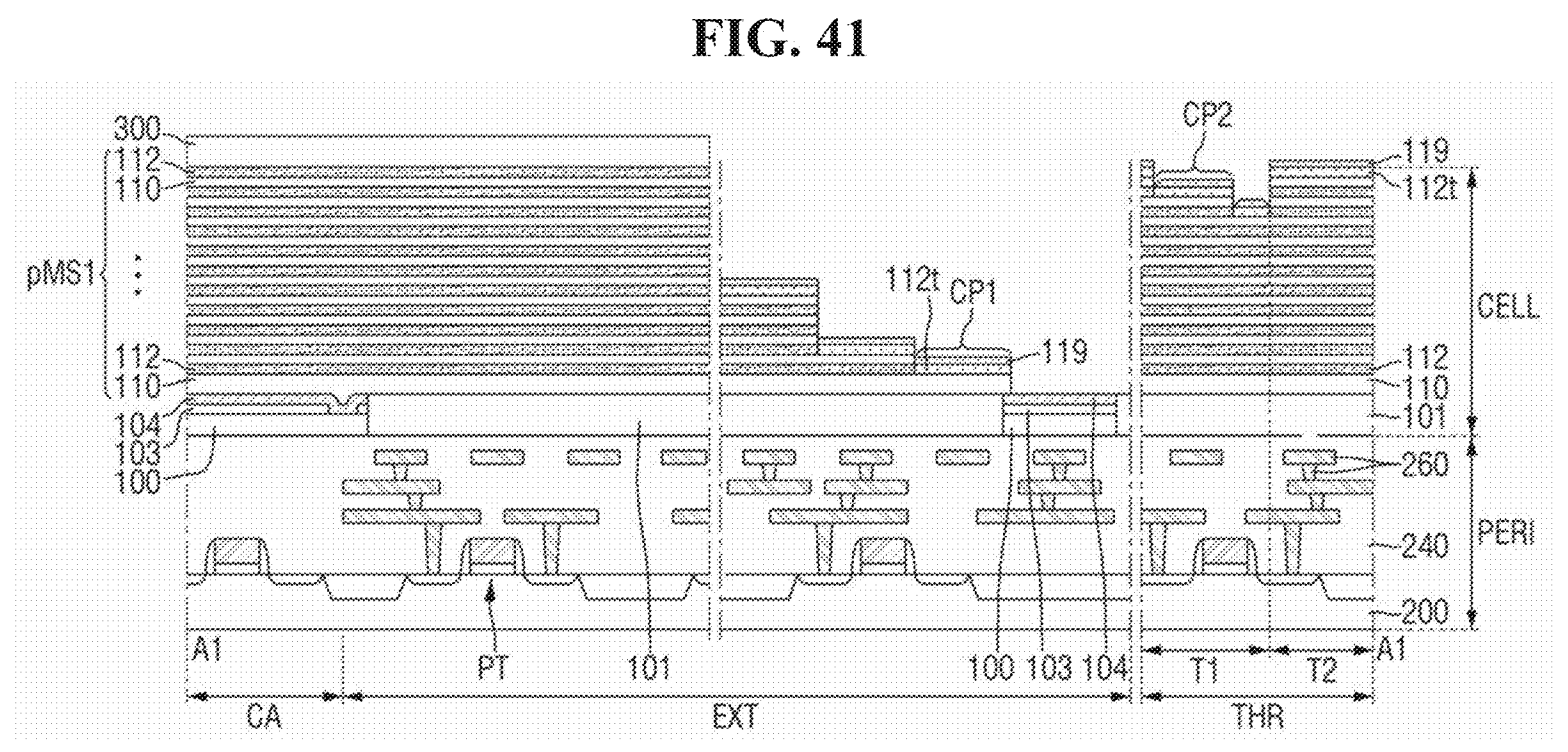

FIGS. 40 and 41 are diagrams of a method for fabricating a semiconductor memory device according to an example embodiment;

DETAILED DESCRIPTION

Hereinafter, a semiconductor memory device according to an exemplary embodiment will be described with reference to FIGS. 1 to 19.

Figure 1:
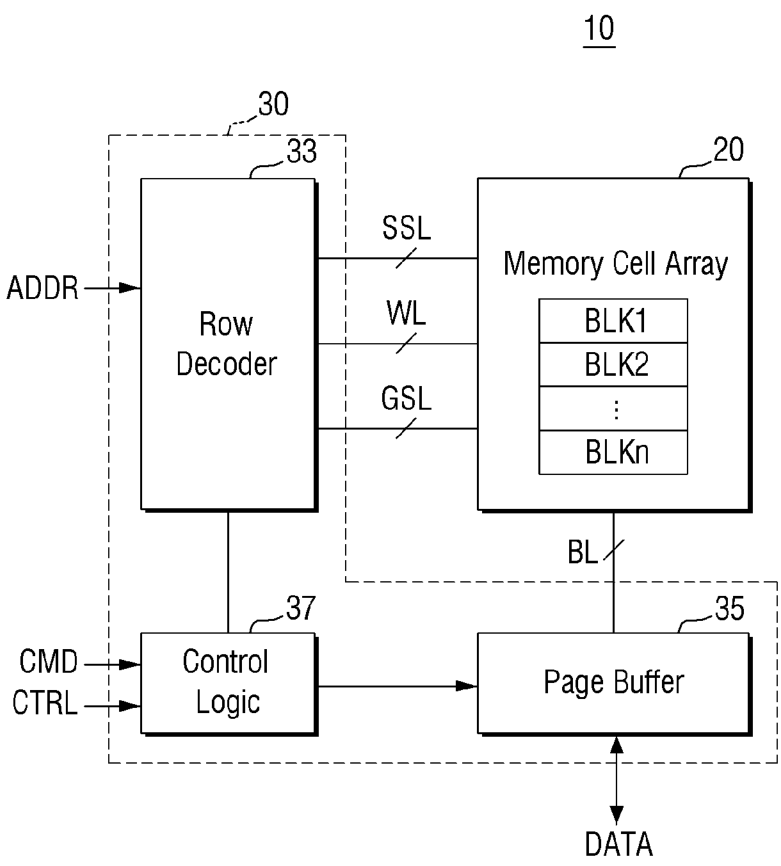
FIG. 1 is a block diagram of a semiconductor memory device according to an example embodiment.

FIG. 1 is a block diagram of a semiconductor memory device according to an example embodiment.

Referring to FIG. 1, a semiconductor memory device 10 according to some embodiments may include a memory cell array 20 and a peripheral circuit 30.

The memory cell array 20 may include a plurality of memory cell blocks BLK1 to BLKn. Each of the memory cell blocks BLK1 to BLKn may include a plurality of memory cells. The memory cell array 20 may be connected to the peripheral circuit 30 through a bit line BL, a word line WL, at least one string selection line SSL, and at least one ground selection line GSL. Specifically, the memory cell blocks BLK1 to BLKn may be connected to a row decoder 33 through the word line WL, the string selection line SSL, and the ground selection line GSL. Further, the memory cell blocks BLK1 to BLKn may be connected to a page buffer 35 through the bit line BL.

The peripheral circuit 30 may receive an address ADDR, a command CMD, and a control signal CTRL from the outside of the semiconductor memory device 10, and may transmit and receive data DATA to and from an external device of the semiconductor memory device 10. The peripheral circuit 30 may include a row decoder 33, a page buffer 35, and a control logic 37. The peripheral circuit 30 may further include various sub-circuits such as an I/O circuit, a voltage generation circuit that generates various voltages necessary for the operation of the semiconductor memory device 10, and an error correction circuit for correcting errors of the data DATA that is read from the memory cell array 20.

The control logic 37 may be connected to the row decoder 33, the page buffer 35, the I/O circuit, the voltage generation circuit and the like. The control logic 37 may control the overall operations of the semiconductor memory device 10. The control logic 37 may generate various internal control signals used inside the semiconductor memory device 10 in response to the control signal CTRL. For example, the control logic 37 may adjust the voltage levels provided to the word line WL and the bit line BL when performing a memory operation such as a program operation or an erasure operation.

The row decoder 33 may select at least one of the plurality of memory cell blocks BLK1 to BLKn in response to the address ADDR, and may select at least one word line WL, at least one string selection line SSL, and at least one ground selection line GSL of the selected memory cell blocks BLK1 to BLKn. Further, the row decoder 33 may transmit a voltage for performing the memory operation to the word line WL of the selected memory cell blocks BLK1 to BLKn.

The page buffer 35 may be connected to the memory cell array 20 through the bit line BL. The page buffer 35 may operate as a writer driver or a sense amplifier. Specifically, when the program operation is performed, the page buffer 35 may operate as the writer driver, and apply a voltage according to the data DATA to be stored in the memory cell array 20 to the bit line BL. On the other hand, when performing the read operation, the page buffer 35 may operate as a sense amplifier to sense the data DATA stored in the memory cell array 20.

Figure 2:
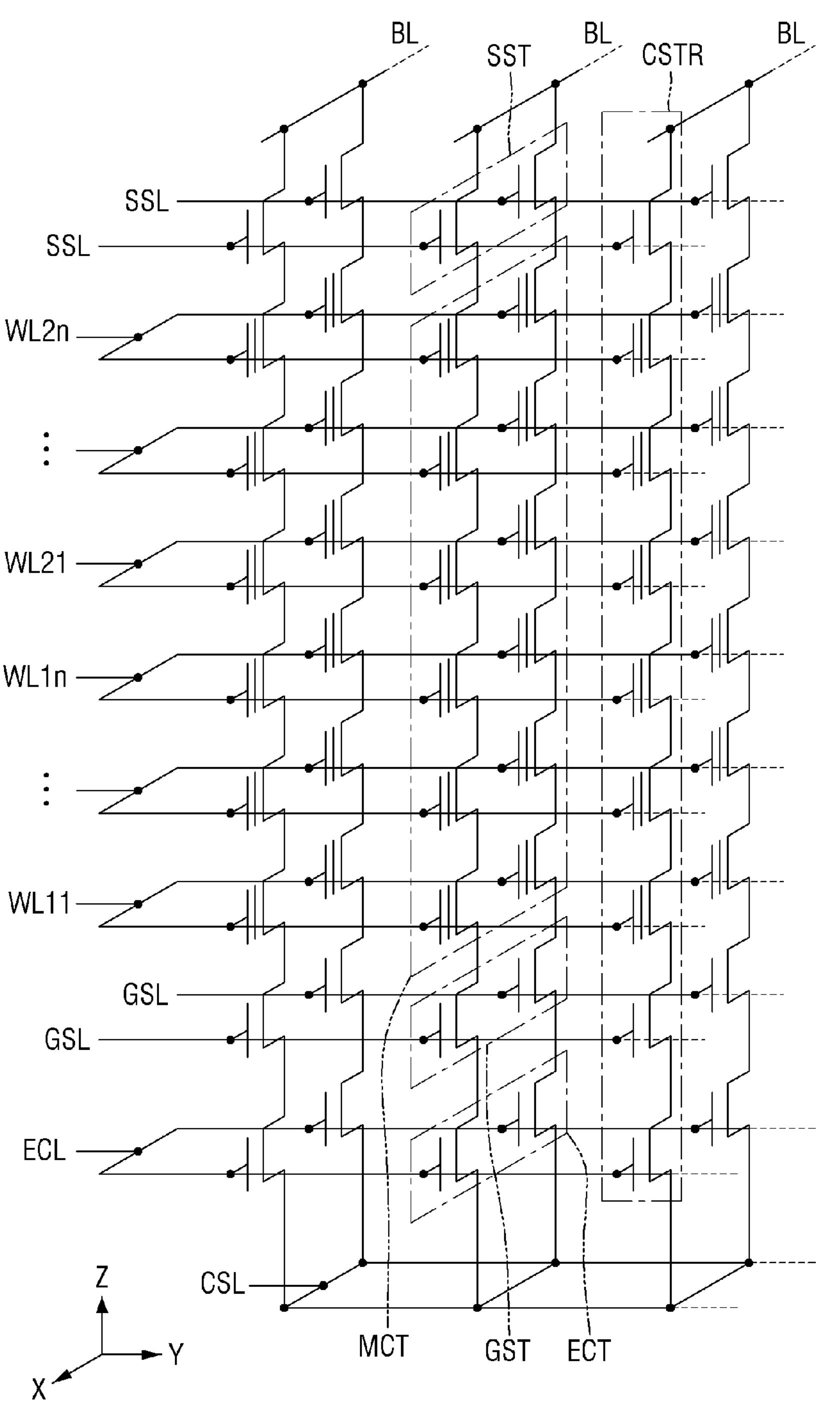
FIG. 2 is a circuit diagram of a semiconductor memory device according to an example embodiment.

FIG. 2 is a circuit diagram of a semiconductor memory device according to an example embodiment.

Referring to FIG. 2, the memory cell array (e.g., 20 of FIG. 1) of the semiconductor device according to some embodiments may include a common source line CSL, a plurality of bit lines BL, and a plurality of cell strings CSTR.

The common source line CSL may extend in a first direction X. In some embodiments, a plurality of common source lines CSL may be arranged two-dimensionally. For example, the plurality of common source lines CSL may be spaced apart from each other and each extend in the first direction X. The same voltage may be electrically applied to the common source lines CSL, or different voltages are applied to the common source lines CSL and the common source lines CSL may be controlled separately.

The plurality of bit lines BL may be arranged two-dimensionally. For example, the bit lines BL are spaced apart from each other, and may each extend in a second direction Y that intersects the first direction X. A plurality of cell strings CSTR may be connected in parallel to each bit line BL. The cell strings CSTR may be commonly connected to the common source line CSL. That is, the plurality of cell strings CSTR may be disposed between the bit lines BL and the common source line CSL.

Each cell string CSTR may include a ground selection transistor GST connected to the common source line CSL, a string selection transistor SST connected to the bit line BL, and a plurality of memory cell transistors MCT disposed between the ground selection transistor GST and the string selection transistor SST. Each memory cell transistor MCT may include a data storage element. The ground selection transistor GST, the string selection transistor SST and the memory cell transistors MCT may be connected in series.

The common source line CSL may be commonly connected to sources of the ground selection transistors GST. Also, the ground selection line GSL, a plurality of word lines WL11 to WL1*n* and WL21 to WL2*n*, and the string selection line SSL may be disposed between the common source line CSL and the bit line BL. The ground selection line GSL may be used as a gate electrode of the ground selection transistor GST, the word lines WL11 to WL1*n* and WL21 to WL2*n* may be used as gate electrodes of the memory cell transistors MCT, and the string selection line SSL may be used as the gate electrode of the string selection transistor SST.

In some embodiments, an erasure control transistor ECT may be disposed between the common source line CSL and the ground selection transistor GST. The common source line CSL may be commonly connected to the sources of the erasure control transistors ECT. Further, an erasure control line ECL may be disposed between the common source line CSL and the ground selection line GSL. The erasure control line ECL may be used as the gate electrode of the erasure control transistor ECT. The erasure control transistors ECT may generate a gate induced drain leakage (GIDL) to perform the erasure operation of the memory cell array.

Figure 3:
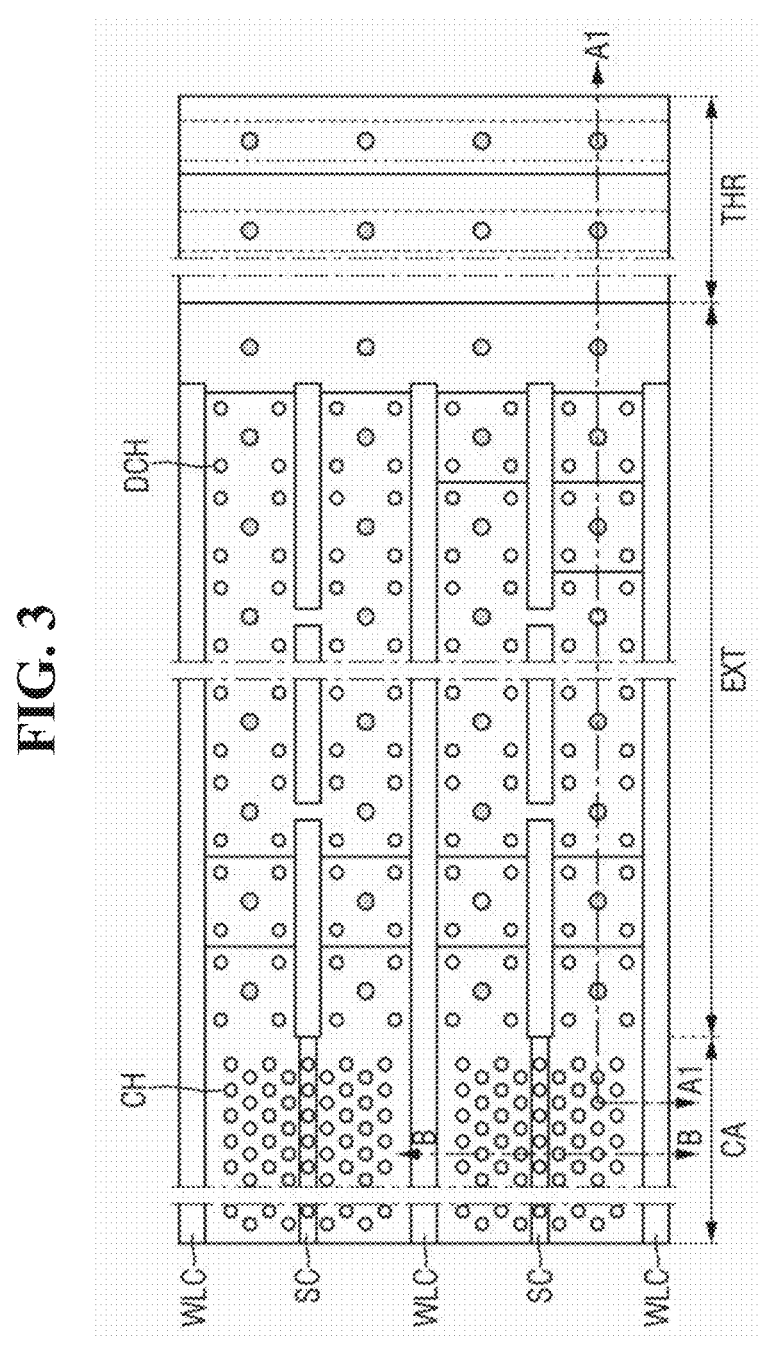
Figure 4:
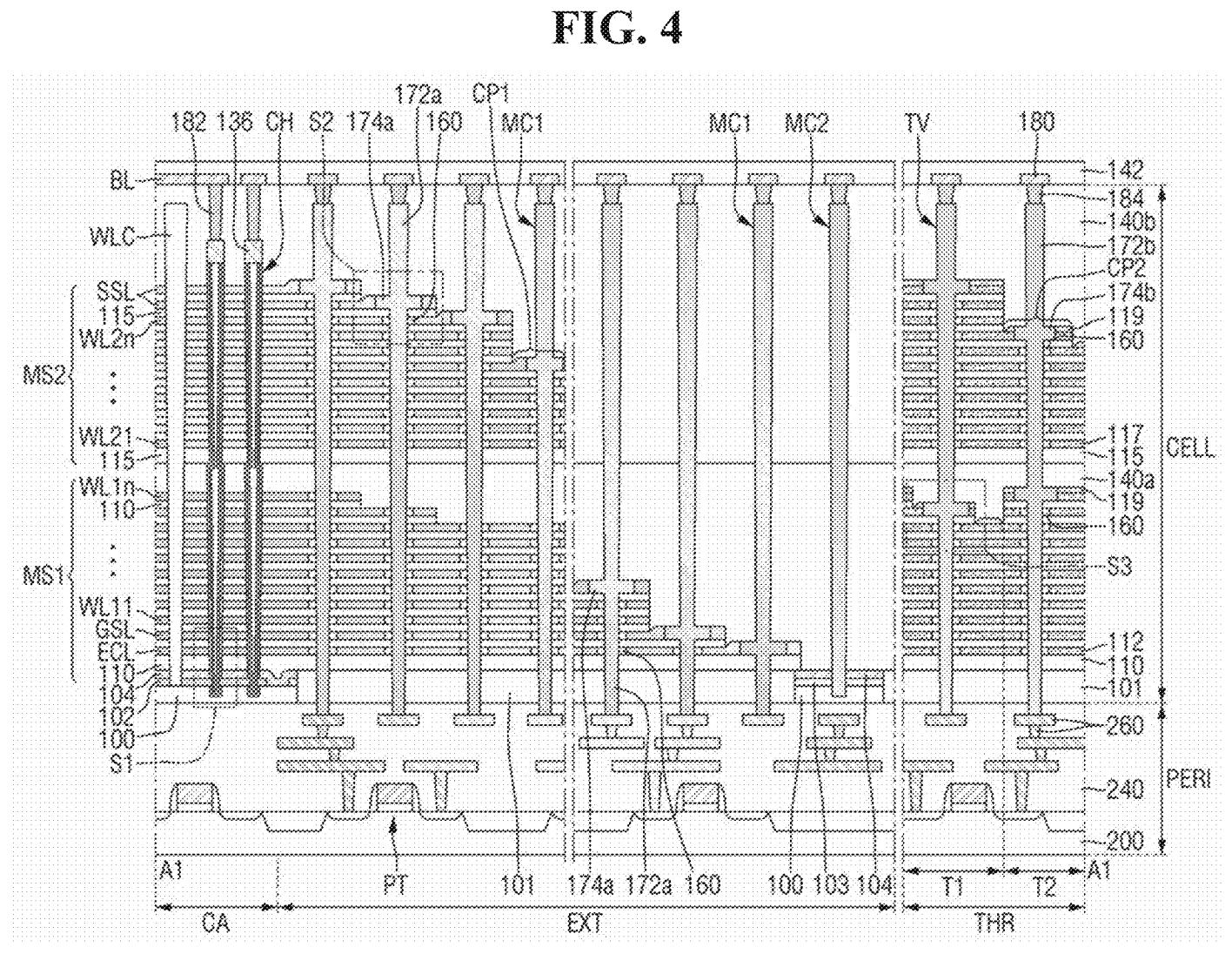
Figure 5:
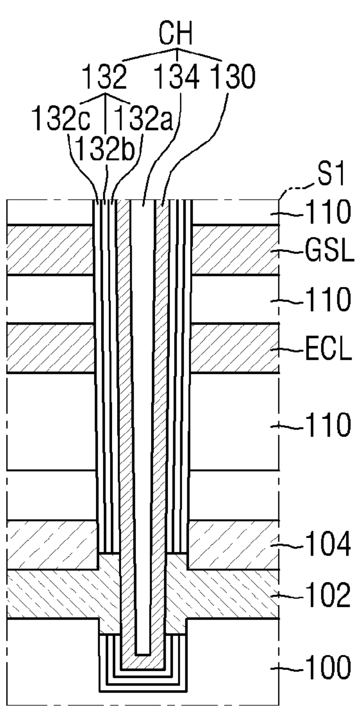
FIG. 5 is a cross-sectional view of a region S1 of FIG. 4 according to an example embodiment.
Figure 6A:
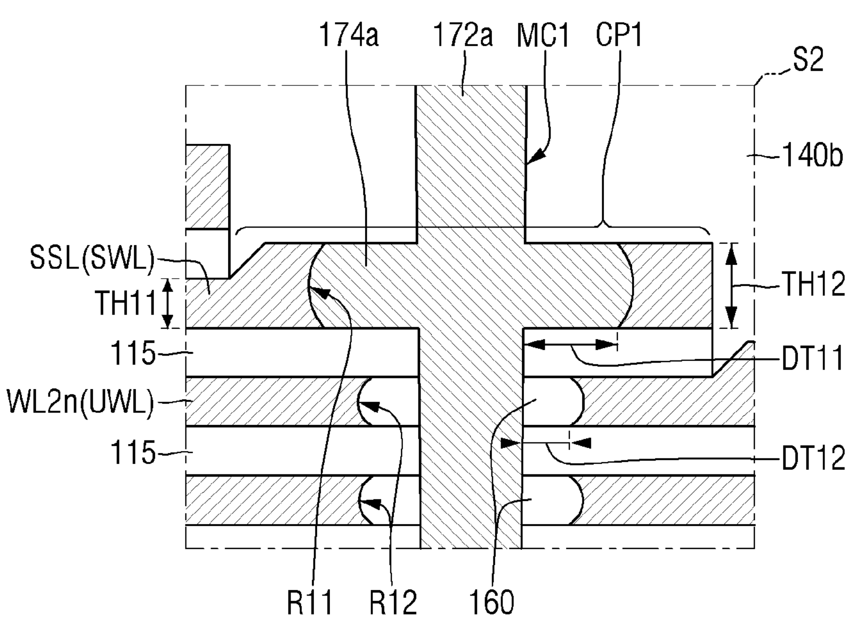
FIG. 6A is a cross-sectional view of a region S2 of FIG. 4 according to an example embodiment.
Figure 6B:
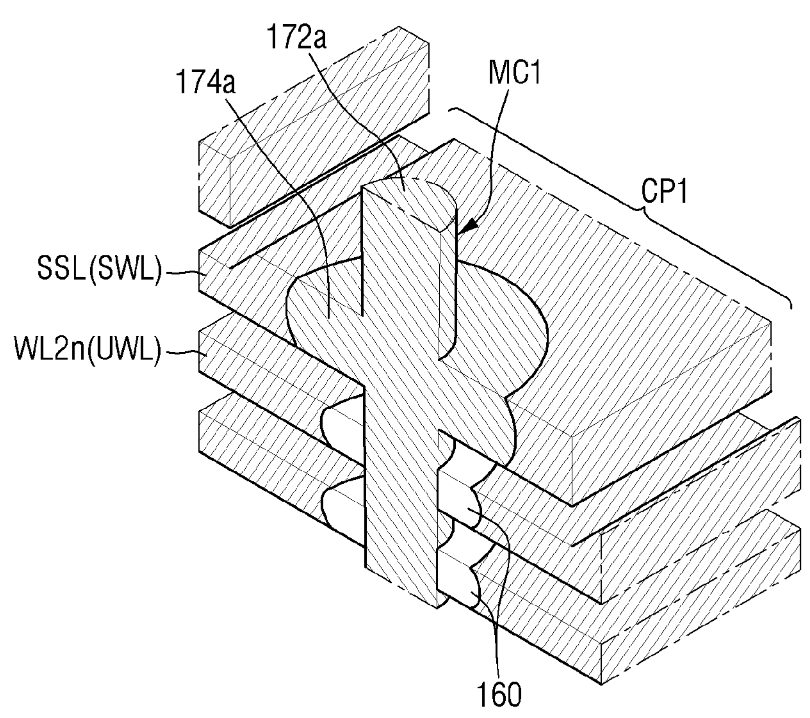
FIG. 6B is a perspective view of a region S2 of FIG. 4 according to an example embodiment.
Figure 7A:
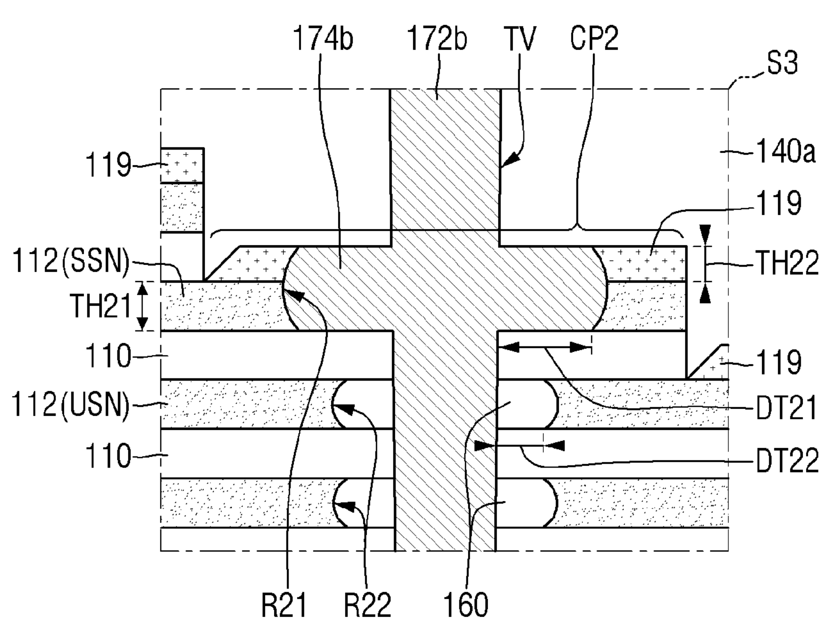
FIG. 7A is a cross-sectional view of a region S3 of FIG. 4 according to an example embodiment.
Figure 7B:
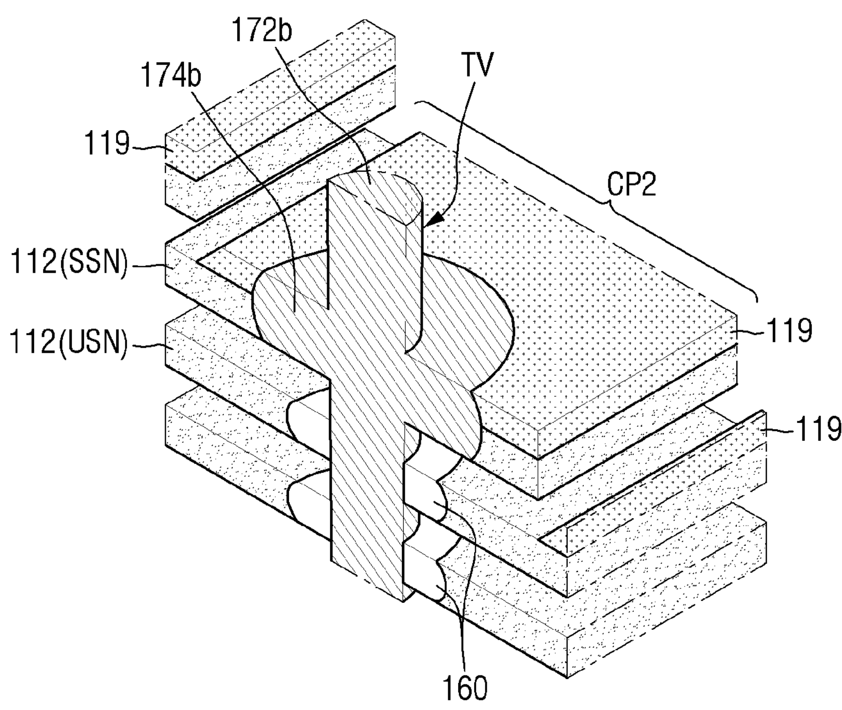
FIG. 7B is a perspective view of a region S3 of FIG. 4 according to an example embodiment.
Figure 8:
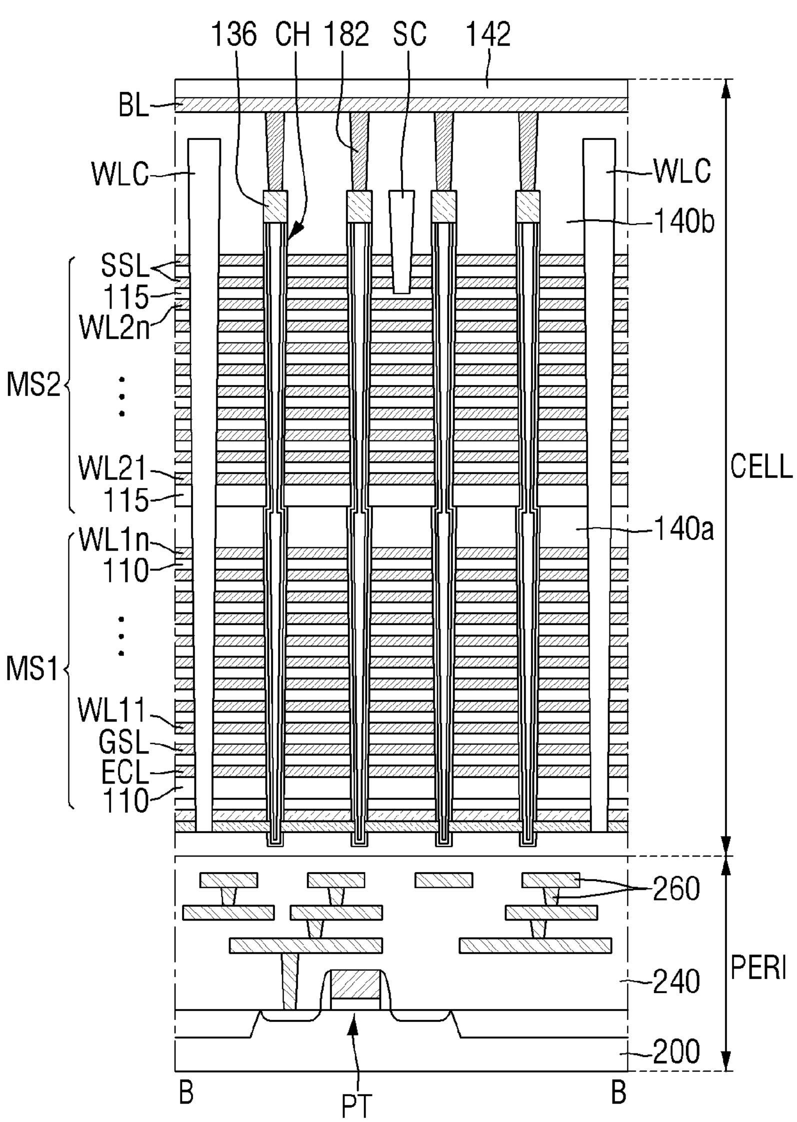
FIG. 8 is a cross-sectional view taken along a line B-B of FIG. 3 according to an example embodiment.

FIG. 3 is a diagram of a semiconductor memory device according to an example embodiment. FIG. 4 is a cross-sectional view taken along a line A1-A1 of FIG. 3 according to an example embodiment. FIG. 5 is a cross-sectional view of a region S1 of FIG. 4 according to an example embodiment. FIG. 6A is a cross-sectional view of a region S2 of FIG. 4 according to an example embodiment. FIG. 6B is a perspective view of a region S2 of FIG. 4 according to an example embodiment. FIG. 7A is a cross-sectional view of a region S3 of FIG. 4 according to an example embodiment. FIG. 7B is a perspective view of a region S3 of FIG. 4 according to an example embodiment. FIG. 8 is a cross-sectional view taken along a line B-B of FIG. 3 according to an example embodiment.

Referring to FIGS. 3 to 8, the semiconductor memory device according to some embodiments may include a memory cell structure CELL and a peripheral circuit structure PERI.

The memory cell structure CELL may include a cell substrate 100, an insulating substrate 101, mold structures MS1 and MS2, a source layer 102, a source sacrifice layer 103, a support layer 104, a pad sacrifice film 119, interlayer insulating films 140*a* and 140*b*, a channel structure CH, a word line cut region WLC, a bit line BL, a cell contact MC1, a substrate contact MC2, a through via TV, and a first wiring structure 180.

The cell substrate 100 may include, for example, a semiconductor substrate such as a silicon substrate, a germanium substrate or a silicon-germanium substrate. Alternatively, the cell substrate 100 may include a silicon-on-insulator (SOI) substrate, a germanium-on-insulator (GOI) substrate, and the like. In some embodiments, the cell substrate 100 may include impurities. For example, the cell substrate 100 may include n-type impurities (e.g., phosphorus (P), arsenic (As), etc.).

The cell substrate 100 may include a cell array region CA, an extended region EXT, and a through region THR.

A memory cell array (e.g., 20 of FIG. 1) including a plurality of memory cells may be formed on the cell array region CA. For example, a channel structure CH, a bit line BL, gate electrodes ECL, GSL, WL11 to WL1*n*, WL21 to WL2*n*, and SSL and the like, which will be described later, may be disposed on the cell array region CA. In the following description, a surface of the cell substrate 100 on which the memory cell array is disposed may be referred to as a front side of the cell substrate 100. In contrast, a surface of the cell substrate 100 opposite to the front side of the cell substrate 100 may be referred to as a back side of the cell substrate 100.

The extended region EXT may be disposed around the cell array region CA. The gate electrodes ECL, GSL, WL11 to WL1*n*, WL21 to WL2*n*, and SSL, which will be described later, may be stacked on the extended region EXT in a step form.

The through region THR may be disposed inside the cell array region CA and/or the extended region EXT, or may be disposed outside the cell array region CA and/or the extended region EXT. Mold sacrifice films 112 and 117, a pad sacrifice film 119, and a through via TV, which will be described later, may be disposed on the through region THR.

The insulating substrate 101 may be formed inside at least a part of the cell substrate 100 of the extended region EXT and/or the through region THR. The insulating substrate 101 may form an insulating region inside the cell substrate 100 of the extended region EXT and/or the through region THR. The insulating substrate 101 may include, but is not limited to, at least one of insulating materials such as silicon oxide, silicon nitride, silicon oxynitride and silicon carbide.

Although a lower surface of the insulating substrate 101 is only shown as being disposed on the same plane as a lower surface of the cell substrate 100, this is merely an example.

As another example, the lower surface of the insulating substrate 101 may be lower than the lower surface of the cell substrate 100.

The mold structures MS1 and MS2 may be formed on the front side of the cell substrate 100 and/or the insulating substrate 101. The mold structures MS1 and MS2 include a plurality of mold insulating films 110 and 115 and a plurality of gate electrodes ECL, GSL, WL11 to WL1*n*, WL21 to WL2*n*, and SSL which are stacked on the cell substrate 100. Each of the mold insulating films 110 and 115 and each of the gate electrodes ECL, GSL, WL11 to WL1*n*, WL21 to WL2*n*, and SSL may have a layered structure extending in parallel with the front side of the cell substrate 100. The gate electrodes ECL, GSL, WL11 to WL1*n*, WL21 to WL2*n*, and SSL are spaced apart from each other by the mold insulating films 110 and 115, and may be sequentially stacked on the cell substrate 100.

The gate electrodes ECL, GSL, WL11 to WL1*n*, WL21 to WL2*n*, and SSL may be stacked on the extended region EXT in a step form. For example, the gate electrodes ECL, GSL, WL11 to WL1*n*, WL21 to WL2*n*, and SSL may extend at different lengths in the first direction X and have a step. Therefore, each of the gate electrodes ECL, GSL, WL11 to WL1*n*, WL21 to WL2*n*, and SSL may include a first pad region CP1 whose upper surface is exposed on the extended region EXT.

Each of the gate electrodes ECL, GSL, WL11 to WL1*n*, WL21 to WL2*n*, and SSL may have a thickness greater than that of a region other than the first pad region CP1, in the first pad region CP1. As an example, as shown in FIG. 6A, the string selection line SSL may include a first pad region CP1 whose upper surface is exposed. A thickness TH12 of the string selection line SSL of the first pad region CP1 may be greater than a thickness TH11 of the string selection line SSL other than the first pad region CP1.

Further, the first pad region CP1 may have a thickness thicker than that of other gate electrodes disposed below the first pad region CP1. As an example, the thickness TH12 of the string selection line SSL of the first pad region CP1 may be greater than the thickness of an uppermost second word line WL2*n* other than the first pad region CP1.

In some embodiments, the mold structures MS1 and MS2 may include a first mold structure MS1 and a second mold structure MS2 that are sequentially stacked on the cell substrate 100 and/or the insulating substrate 101.

The first mold structure MS1 may include first mold insulating films 110 and first gate electrodes ECL, GSL1, GSL2, and WL11 to WL1*n* which are alternately stacked on the cell substrate 100. In some embodiments, the first gate electrodes ECL, GSL1, GSL2, and WL11 to WL1*n* may include an erasure control line ECL, a ground selection line GSL, and a plurality of first word lines WL11 to WL1*n* which are sequentially stacked on the cell substrate 100. The number and arrangement of the erasure control line ECL, the ground selection line GSL, and the first word lines WL11 to WL1*n* are merely exemplary and are not limited to those shown. In some other embodiments, the erasure control line ECL may be omitted.

The second mold structure MS2 may include a second mold insulating film 115 and second gate electrodes WL21 to WL2*n*, SSL1 and SSL2 which are alternately stacked on the first mold structure MS1. In some embodiments, the second gate electrodes WL21 to WL2*n*, SSL1, and SSL2 may include a plurality of second word lines WL21 to WL2*n* and string selection lines SSL which are sequentially stacked on the first mold structure MS1. The number and arrangement of the second word lines WL21 to WL2*n* and the string selection line SSL are merely exemplary and are not limited to those shown.

The mold insulating films 110 and 115 may include, but are not limited to, at least one of insulating materials, for example, silicon oxide, silicon nitride, and silicon oxynitride. As an example, each of the mold insulating films 110 and 115 may include a silicon oxide film.

The gate electrodes ECL, GSL, WL11 to WL1*n*, WL21 to WL2*n*, and SSL may each include, but are not limited to, a conductive material, for example, a metal such as tungsten (W), cobalt (Co), and nickel (Ni), or a semiconductor material such as silicon. As an example, each of the gate electrodes ECL, GSL, WL11 to WL1*n*, WL21 to WL2*n*, and SSL may include tungsten (W).

The mold structures MS1 and MS2 on the through region THR may include a plurality of mold insulating films 110 and 115 and a plurality of mold sacrifice films 112 and 117 which are alternately stacked on the cell substrate 100 and/or the insulating substrate 101. Each of the mold insulating films 110 and 115 and each of the mold sacrifice films 112 and 117 may have a layered structure extending in parallel with the upper surface of the cell substrate 100. The mold sacrifice films 112 and 117 are spaced apart from each other by the mold insulating films 110 and 115, and may be sequentially stacked on the cell substrate 100.

In some embodiments, the first mold structure MS1 of the through region THR may include first mold insulating films 110 and first mold sacrifice films 112 which are alternately stacked on the cell substrate 100 and/or the insulating substrate 101, and the second mold structure MS2 of the through region THR may include second mold insulating films 115 and second mold sacrifice films 117 which are alternately stacked on the first mold structure MS1.

The mold sacrifice films 112 and 117 may each include, but are not limited to, insulating materials, for example, silicon oxide, silicon nitride and silicon oxynitride. In some embodiments, the mold sacrifice films 112 and 117 may include a material having an etching selectivity with respect to the mold insulating films 110 and 115. As an example, each of the mold insulating films 110 and 115 may include a silicon oxide film, and each of the mold sacrifice films 112 and 117 may include a silicon nitride film.

In some embodiments, the first mold structure MS1 and the second mold structure MS2 on the through region THR may alternately have a stepped shape. For example, the through region THR may include a first sub-through region T1 and a second sub-through region T2. The first sub-through region T1 and the second sub-through region T2 may be regions adjacent to each other or may be regions separated from each other. The first mold structures MS1 on the first sub-through region T1 may be stacked in the step form, and the second mold structures MS2 on the first sub-through region T1 may not be stacked in the step form. In contrast, the first mold structures MS1 on the second sub-through region T2 may not be stacked in the step form, and the second mold structures MS2 on the second sub through region T2 may be stacked in the step form. Such an alternating stepped stacked structure may be used to reduce the area of the through region THR.

The interlayer insulating films 140*a* and 140*b* may be formed on the cell substrate 100 and/or the insulating substrate 101 to cover the mold structures MS1 and MS2. In some embodiments, the interlayer insulating films 140*a* and 140*b* may include a first interlayer insulating film 140*a* and a second interlayer insulating film 140*b* that are sequentially stacked on the cell substrate 100. The first interlayer insulating film 140*a* may cover the first mold structure MS1, and the second interlayer insulating film 140*b* may cover the second mold structure MS2. The interlayer insulating films 140*a* and 140*b* may include, for example, but are not limited to, at least one of a silicon oxide, a silicon oxynitride, and a low dielectric constant (low-k) material having a smaller dielectric constant than the silicon oxide.

The channel structure CH may be formed on the cell array region CA of the cell substrate 100. The plurality of channel structures CH may extend in a vertical direction (hereinafter, a third direction Z) intersecting the upper surface of the cell substrate 100 and penetrate the mold structures MS1 and MS2, respectively. In an example, the channel structure CH may be a pillar-shaped (e.g., columnar) structure extending in the third direction Z. Therefore, the channel structure CH may intersect each of the gate electrodes ECL, GSL, WL11 to WL1*n*, WL21 to WL2*n*, and SSL. In some embodiments, each channel structure CH may have a bent portion between the first mold structure MS1 and the second mold structure MS2.

As shown in FIG. 5, each channel structure CH may include a semiconductor pattern 130 and an information storage film 132.

The semiconductor pattern 130 may extend in the third direction Z and penetrate the first mold structure MS1. The semiconductor pattern 130 is only shown to have a cup shape, this is merely an example. For example, the semiconductor pattern 130 may have various shapes such as a cylindrical shape, a rectangular barrel shape, and a solid filler shape. The semiconductor pattern 130 may include, but is not limited to, a semiconductor material such as, for example, single crystal silicon, polycrystalline silicon, organic semiconductor substance and carbon nanostructure.

The information storage film 132 may be interposed between the semiconductor pattern 130 and each of the gate electrodes ECL, GSL, WL11 to WL1*n*, WL21 to WL2*n*, and SSL. For example, the information storage film 132 may extend along the outer side surface of the semiconductor pattern 130. The information storage film 132 may include, for example, at least one of silicon oxide, silicon nitride, silicon oxynitride, and high dielectric constant materials having a higher dielectric constant than silicon oxide. The high dielectric constant material may include, for example, at least one of aluminum oxide, hafnium oxide, lanthanum oxide, tantalum oxide, titanium oxide, lanthanum hafnium oxide, lanthanum aluminum oxide, dysprosium scandium oxide, and combinations thereof.

In some embodiments, the information storage film 132 may be formed of a multi-film. For example, as shown in FIG. 5, the information storage film 132 may include a tunnel insulating film 132*a*, a charge storage film 132*b*, and a blocking insulating film 132*c* that are sequentially stacked on the outer surface of the semiconductor pattern 130.

The tunnel insulating film 132*a* may include, for example, silicon oxide or a high dielectric constant material having a higher dielectric constant than silicon oxide (e.g., aluminum oxide ($Al_2O_3$), and hafnium oxide ($HfO_2$)). The charge storage film 132*b* may include, for example, silicon nitride. The blocking insulating film 132*c* may include, for example, silicon oxide or a high dielectric constant material having a higher dielectric constant than silicon oxide (e.g., aluminum oxide ($Al_2O_3$), and hafnium oxide ($HfO_2$)).

In some embodiments, the channel structure CH may further include a filling pattern 134. The filling pattern 134 may be formed to fill the inside of the cup-shaped semiconductor pattern 130. The filling pattern 134 may include, but is not limited to, an insulating material, for example, silicon oxide.

In some embodiments, the channel structure CH may further include a channel pad 136. The channel pad 136 may be formed to be connected to the upper part of the semiconductor pattern 130. The channel pad 136 may include, for example, but is not limited to, impurity-doped polysilicon.

In some embodiments, the plurality of channel structures CH may be arranged in a zigzag form or a honeycomb form. For example, as shown in FIG. 3, a plurality of channel structures CH may be arranged alternately in the first direction X and the second direction Y parallel to the upper surface of the cell substrate 100. Such a channel structure CH may further improve the degree of integration of the semiconductor memory device. The number and arrangement of channel structures CH are merely exemplary and are not limited to those shown.

The source layer 102 may be formed on the cell substrate 100. The source layer 102 may be interposed between the cell substrate 100 and the mold structures MS1 and MS2. For example, the source layer 102 may conformally extend along the upper surface of the cell substrate 100. In some embodiments, the source layer 102 may be formed on the cell array region CA and may not be formed on the extended region EXT.

The source layer 102 may be connected to the semiconductor pattern 130 of each channel structure CH. For example, as shown in FIG. 5, the source layer 102 may penetrate the information storage film 132 and come into contact with the side surface of the semiconductor pattern 130. Such a source layer 102 may be provided as a common source line (e.g., CSL of FIG. 2) of the semiconductor memory device. The source layer 102 may include, but is not limited to, conductive materials, for example, polyvinyl or metal doped with impurities.

In some embodiments, a part of the source layer 102 adjacent to the semiconductor pattern 130 may have a form that protrudes toward the information storage film 132. For example, in the region adjacent to the semiconductor pattern 130, the length of the source layer 102 extending in the third direction Z may further increase. As a result, the source layer 102 may be brought into contact with the semiconductor pattern 130 in a wider area.

In some embodiments, the channel structure CH may penetrate the source layer 102. For example, the lower part of the channel structure CH may be disposed inside the cell substrate 100 below the source layer 102.

A base insulating film may be interposed between the cell substrate 100 and the source layer 102. The base insulating film may include, for example, but is not limited to, at least one of silicon oxide, silicon nitride and silicon oxynitride.

In some embodiments, the cell substrate 100 may include a conductive film (not shown). The conductive film may include, for example, impurity-doped polysilicon, metal, metal silicide, or the like. The conductive film may be formed by multiple layers. As an example, the cell substrate 100 may include a first conductive film including a metal silicide such as tungsten silicide (WSi), and a second conductive film stacked on the first conductive film and including doped polysilicon. The source layer 102 and the conductive film may be provided as a common source line (e.g., CSL of FIG. 2) of the semiconductor memory device.

The source sacrifice layer 103 may be formed on the extended region EXT of the cell substrate 100. The source sacrifice layer 103 may be interposed between the cell substrate 100 and the mold structures MS1 and MS2. For example, the source sacrifice layer 103 may conformally extend along the upper surface of the cell substrate 100. In some embodiments, the source sacrifice layer 103 may be formed on the extended region EXT and may not be formed on the cell array region CA.

The source sacrifice layer 103 may be disposed at the same level as that of the source layer 102. In the present specification, the expression "disposed at the same level" may mean that they are disposed at the same height on the basis of the upper surface of the cell substrate 100. For example, the lower surface of the source sacrifice layer 103 may be disposed at the same height as the lower surface of the source layer 102.

In some embodiments, the source layer 102 and/or the source sacrifice layer 103 may not be formed on the insulating substrate 101. Although the upper surface of the insulating substrate 101 is only shown as being disposed on the same plane as the upper surface of the source layer 102 and/or the upper surface of the source sacrifice layer 103, this is merely an example. As another example, the upper surface of the insulating substrate 101 may be formed to be higher than the upper surface of the source layer 102 and/or the upper surface of the source sacrifice layer 103.

The source sacrifice layer 103 may be a layer that remains after a part thereof is replaced by the source layer 102. In such a case, the thickness of the source layer 102 may be the same as the thickness of the source sacrifice layer 103. In the present specification, the meaning of the term "same" includes not only exactly the same thing but also minute differences that may occur due to process margins and the like. For example, the upper surface of the source sacrifice layer 103 may be disposed at the same height as the upper surface of the source layer 102.

The source sacrifice layer 103 may include, but is not limited to, at least one of insulating materials such as silicon oxide, silicon nitride and silicon oxynitride. In some embodiments, the source sacrifice layer 103 may include a material having an etching selectivity with respect to the mold insulating films 110 and 115. As an example, each of the mold insulating films 110 and 115 may include a silicon oxide film, and the source sacrifice layer 103 may include a silicon nitride film.

The support layer 104 may be formed on the cell substrate 100, the source layer 102, and the source sacrifice layer 103. The support layer 104 may be interposed between the source layer 102 and the mold structures MS1 and MS2, and between the source sacrifice layer 103 and the mold structures MS1 and MS2. For example, the support layer 104 may conformally extend along the upper surface of the cell substrate 100, the upper surface of the source layer 102, and the upper surface of the source sacrifice layer 103.

The support layer 104 may include a material having an etching selectivity with respect to the source sacrifice layer 103. As an example, the source sacrifice layer 103 may include a silicon nitride film, and the support layer 104 may include a polysilicon film.

The support layer 104 may be used as a support base to prevent the mold stack from falling or collapsing in a replacement process for forming the source layer 102. For example, the source layer 102 and/or the source sacrifice layer 103 may expose a part of the upper surface of the cell substrate 100, and a part of the support layer 104 may extend along the exposed upper surface of the cell substrate 100, and come into contact with the upper surface of the cell substrate 100.

The pad sacrifice film 119 may be formed on the mold structures MS1 and MS2 on the through region THR. The pad sacrifice film 119 may extend along the exposed upper surfaces of the plurality of mold sacrifice films 112 and 117. For example, at least a part of the pad sacrifice film 119 may extend along the upper surface of the first mold sacrifice film (112 of the uppermost part) disposed at the uppermost part in the first mold structure MS1 and the upper surface of the second mold sacrifice film (117 of the uppermost part) disposed at the uppermost part in the second mold structure MS2.

In some embodiments, at least a part of the mold structures MS1 and MS2 on the through region THR may be stacked in the step form. For example, at least a part of the mold sacrifice films 112 and 117 may extend in the first direction X to different lengths and have a step. Therefore, at least a part of the mold sacrifice films 112 and 117 may include a second pad region CP2 whose upper surface is exposed on the through region THR. In some embodiments, at least a part of the pad sacrifice film 119 may be formed on the second pad region CP2. For example, at least a part of the pad sacrifice film 119 may extend along the upper surface of the second pad region CP2.

A thickness of the pad sacrifice film 119 (e.g., TH22 of FIG. 7A) may be, but is not limited to, about 20% to about 110% of a thickness (e.g., TH21 of FIG. 7A) of the respective mold sacrifice films 112 and 117.

The pad sacrifice film 119 may include, but is not limited to, at least one of insulating materials, for example, silicon oxide, silicon nitride and silicon oxynitride. In some embodiments, the pad sacrifice film 119 may include a material having an etching selectivity with respect to the mold insulating films 110 and 115. As an example, each of the mold insulating films 110 and 115 may include a silicon oxide film, and the pad sacrifice film 119 may include a silicon nitride film.

A word line cut region WLC may extend in the first direction X and cut the mold structures MS1 and MS2 on the cell array region CA and the extended region EXT. Further, the plurality of word line cut regions WLC may be separated from each other and extend side by side in the first direction X. The mold structures MS1 and MS2 may be divided by the word line cut regions WLC to form a plurality of memory cell blocks (e.g., BLK1 to BLKn of FIG. 1). For example, two adjacent word line cut regions WLC may define one memory cell block between them. A plurality of channel structures CH may be disposed inside each memory cell block defined by the word line cut region WLC.

In some embodiments, the word line cut region WLC may extend in the first direction X to cut the source layer 102 and the support layer 104. Although a lower surface of the word line cut region WLC is shown only to be disposed on the same plane as the lower surface of the source layer 102, this is only an example. As another example, the lower surface of the word line cut region WLC may be lower than the upper surface of the cell substrate 100.

In some embodiments, the word line cut region WLC may include an insulating material. For example, the word line cut region WLC may include, but is not limited to, at least one of silicon oxide, silicon nitride and silicon oxynitride.

In some embodiments, the string separation structure SC may be formed inside the second mold structure MS2. As shown in FIGS. 3 and 8, the string separation structure SC may extend in the first direction X to cut the string selection line SSL. Each memory cell block defined by the word line cut region WLC may be divided by the string separation structure SC to form a plurality of string regions. As an example, the string separation structure SC may define two string regions inside one memory cell block. The string separation structure SC may include, but is not limited to, at least one of insulating materials, for example, silicon oxide, silicon nitride and silicon oxynitride.

The bit line BL may be formed on the mold structures MS1 and MS2. The plurality of bit lines BL may be separated from each other and extend side by side in the second direction Y. Each bit line BL may be connected to at least a part of a plurality of channel structures CH. For example, a bit line contact 182 connected to the upper part of each channel structure CH may be formed inside the second interlayer insulating film 140*b*. The bit line BL may be electrically connected to the channel structure CH arranged along the second direction Y through the bit line contact 182.

The cell contact MC1 may be formed on the extended region EXT. The cell contact MC1 may extend in the third direction Z and penetrate the mold structures MS1 and MS2 on the extended region EXT. Further, the cell contact MC1 may be electrically connected to each of the gate electrodes ECL, GSL, WL11 to WL1*n*, WL21 to WL2*n*, and SSL through the first pad region CP1. For example, the cell contact MC1 may penetrate the first pad region CP1, and the side surface of the cell contact MC1 may come into contact with the inner surface of the first pad region CP1. The cell contact MC1 may include, but is not limited to, conductive materials, for example, metals such as tungsten (W), cobalt (Co), and nickel (Ni) or semiconductor materials such as silicon.

In the following description, the gate electrode electrically connected to one specific cell contact MC1 among the gate electrodes ECL, GSL, WL11 to WL1*n*, WL21 to WL2*n*, and SSL may be referred to as a selective gate electrode SWL, and different gate electrodes other than the selective gate electrode SWL may be referred to as a non-selective gate electrode UWL.

In some embodiments, the cell contact MC1 may include a first penetration 172*a* and a first protrusion 174*a*, as shown in FIGS. 6A and 6B.

The first penetration part 172*a* may extend in the third direction Z and penetrate the mold structures MS1 and MS2 on the extended region EXT. As an example, the first penetration part 172*a* may be a pillar-shaped structure (e.g., a columnar structure) extending in the third direction Z. In some embodiments, a width of the first penetration part 172*a* may gradually decrease toward the peripheral circuit substrate 200. This may be due to the features of the etching process for forming the first penetration part 172*a*.

The first protrusion part 174*a* may protrude from the side surface of the first penetration part 172*a* and come into contact with the first pad region CP1. For example, an inner surface of the first pad region CP1 may define a first recess R11 that is spaced apart from the side surface of the first penetration part 172*a*. The first protrusion part 174*a* may protrude from the side surface of the first penetration part 172*a* to fill the first recess R11. As an example, the first protrusion part 174*a* may have an annular structure that surrounds the side surface of the first penetration part 172*a* in the first pad region CP1. Accordingly, the selective gate electrode SWL may be electrically connected to the cell contact MC1.

In some embodiments, an insulating ring 160 may be formed in the mold structures MS1 and MS2 on the extended region EXT. The insulating ring 160 may be interposed between a non-selective gate electrode UWL and the cell contact MC1. For example, the inner surface of the non-selective gate electrode UWL may define a second recess R12 that is spaced apart from the side surface of the first penetration part 172*a*. The insulating ring 160 may fill the second recess R12. As an example, the insulating ring 160 may have an annular structure that surrounds the side surface of the first penetration part 172*a* inside the non-selective gate electrode UWL. Therefore, the non-selective gate electrode UWL may be electrically separated from the cell contact MC1. The insulating ring 160 may include, but is not limited to, an insulating material, for example, at least one of silicon oxide, silicon nitride and silicon oxynitride. As an example, the insulating ring 160 may include a silicon oxide film.

In some embodiments, a depth DT11 of the first recess R11 may be greater than a depth DT12 of the second recess R12, on the basis of the side surface of the first penetration part 172*a*. This may be due to the fact that the first pad region CP1 has a thicker thickness than other gate electrodes disposed below it.

In some embodiments, the height of the first protrusion part 174*a* may be greater than the height of the insulating ring 160. Here, the height may refer to a height in the third direction Z. This may be due to the fact that the first pad region CP1 has a thicker thickness than other gate electrodes disposed below it.

In some embodiments, the first recess R11 and/or the second recess R12 may each have a concave shape. This may be due to the features of the etching process for forming the first recess R11 and/or the second recess R12. However, this is only exemplary, and the first recess R11 and/or the second recess R12 may each, of course, be flat or convex, depending on the features of the etching process for forming the first recess R11 and/or the second recess R12.

The substrate contact MC2 may be connected to the cell substrate 100. For example, the substrate contact MC2 may extend in the third direction Z and penetrate the interlayer insulating films 140*a* and 140*b*. In some embodiments, the mold structures MS1 and MS2 may expose a part of the upper surface of the support layer 104. The substrate contact MC2 may penetrate the upper surface of the support layer 104 and be connected to the cell substrate 100. In some embodiments, the width of the substrate contact MC2 may gradually decrease toward the peripheral circuit substrate 200. This may be due to the features of the etching process for forming the substrate contact MC2.

The through via TV may be formed on the through region THR. The through via TV may extend in the third direction Z and penetrate the mold structures MS1 and MS2 and the pad sacrifice film 119 on the through region THR. Further, the through via TV may come into contact with at least a part of the plurality of mold sacrifice films 112 and 117 and the pad sacrifice film 119. For example, the side surface of the through via TV may come into contact with the inner surface of the second pad region CP2 and the inner surface of the pad sacrifice film 119 formed on the second pad region CP2. The through via TV may include, but is not limited to, conductive materials, for example, metals such as tungsten (W), cobalt (Co), and nickel (Ni) and semiconductor materials such as silicon.

In the following description, the mold sacrifice film that is (physically) in contact with one particular through via TV among the mold sacrifice films 112 and 117 may be referred to as a selective mold sacrifice film SSN, and different mold sacrifice films other than the selective mold sacrifice film SSN may be referred to as non-selective mold sacrifice film USN.

In some embodiments, the through via TV may include a second penetration 172*b* and a second protrusion 174*b*, as shown in FIGS. 7A and 7B.

The second penetration part 172*b* may extend in the third direction Z and penetrate the mold structures MS1 and MS2 on the through region THR. As an example, the second penetration part 172*b* may have a pillar-shaped (e.g., a columnar shape) structure extending in the third direction Z. In some embodiments, the width of the second penetration part 172*b* may gradually decrease toward the peripheral circuit substrate 200. This may be due to the features of the etching process for forming the second penetration part 172*b*.

The second protrusion part 174*b* may protrude from the side surface of the second penetration part 172*b* and come into contact with the selective mold sacrifice film SSN and the pad sacrifice film 119. For example, the inner surface of the selective mold sacrifice film SSN and the inner surface of the pad sacrifice film 119 may define a third recess R21 that is spaced apart from the side surface of the second penetration part 172*b*. The second protrusion part 174*b* may protrude from the side surface of the second penetration part 172*b* to fill the third recess R21. As an example, the second protrusion part 174*b* may have an annular structure that surrounds the side surface of the second penetration part 172*b* inside the selective mold sacrifice film SSN and the pad sacrifice film 119. Accordingly, the selective mold sacrifice film SSN and the pad sacrifice film 119 may come into (physically) contact with the through via TV.

In some embodiments, the insulating ring 160 may be formed inside the mold structures MS1 and MS2 on the through region THR. The insulating ring 160 may be interposed between the non-selective mold sacrifice film USN and the through via TV. For example, the inner surface of the non-selective mold sacrifice film USN may define a fourth recess R22 that is spaced apart from the side surface of the second penetration part 172*b*. The insulating ring 160 may fill the fourth recess R22. As an example, the insulating ring 160 may be an annular structure that surrounds the side surface of the second penetration part 172*b* inside the non-selective mold sacrifice film USN. Accordingly, the non-selective mold sacrifice film USN may be spaced apart from the through via TV. The insulating ring 160 may include, but is not limited to, an insulating material, for example, at least one of silicon oxide, silicon nitride and silicon oxynitride. As an example, the insulating ring 160 may include a silicon oxide film.

In some embodiments, a depth DT21 of the third recess R21 may be greater than a depth DT22 of the fourth recess R22, on the basis of the side surface of the second penetration part 172*b*. Further, in some embodiments, the height of the second protrusion part 174*b* may be greater than the height of the insulating ring 160. Here, the height may refer to a height in the third direction Z. These may be due to the fact that the sum of the thickness TH21 of the selective mold sacrifice film SSN and the thickness TH22 of the pad sacrifice film 119 is greater than the thickness of the non-selective mold sacrifice film USN.

In some embodiments, the third recess R21 and/or the fourth recess R22 may each have a concave shape. This may be due to the features of the etching process for forming the third recess R21 and/or the fourth recess R22. However, this is only exemplary, and each of the third recess R21 and/or the fourth recess R22 may, of course, be flat or convex, depending on the features of the etching process for forming the third recess R21 and/or the fourth recess R22.

The mold sacrifice films 112 and 117 and the pad sacrifice film 119 may be layers that remain after a part thereof is replaced with the gate electrodes ECL, GSL, WL11 to WL1*n*, WL21 to WL2*n*, and SSL. Therefore, the thickness of each of the mold sacrifice films 112 and 117 and/or the pad sacrifice film 119 may be the same as the thickness of each of the gate electrodes ECL, GSL, WL11 to WL1*n*, WL21 to WL2*n*, and SSL.

For example, the thickness (TH11 of FIG. 6A) of the selective gate electrode SWL other than the first pad region CP1 may be the same as the thickness (TH21 of FIG. 7A) of the selective mold sacrifice film SSN. For example, the thickness (TH12 of FIG. 6A) of the first pad region CP1 may be the same as the sum of the thickness (TH21 of FIG. 7A) of the selective mold sacrifice film SSN and the thickness (TH22 of FIG. 7A) of the pad sacrifice film 119. For example, the depth (DT11 of FIG. 6A) of the first recess R11 may be the same as the depth (DT21 of FIG. 7A) of the third recess R21, and the depth (DT12 of FIG. 6A) of the second recess R12 may be the same as the depth (DT22 of FIG. 7A) of the fourth recess R22.

The pad sacrifice film 119 may have material properties similar to those of the selective mold sacrifice film SSN. For example, in a replacement process for forming the gate electrodes ECL, GSL, WL11 to WL1*n*, WL21 to WL2*n*, and SSL from the mold sacrifice films 112 and 117 and the pad sacrifice films 119, the etching rate of the pad sacrifice film 119 may be similar to the etching rate of the selective mold sacrifice film SSN. This makes it possible to provide a semiconductor memory in which defects can be improved and producing costs are reduced. This will be described more specifically in the description of FIGS. 20 to 38.

In some embodiments, in a wet etching process that uses phosphoric acid, the etching rate of the pad sacrifice film 119 may be similar to the etching rate of the selective mold sacrifice film SSN.

In some embodiments, the pad sacrifice film 119 may include an insulating film doped with impurity elements. The impurity elements may include, but are not limited to, for example, at least one of carbon (C), nitrogen (N), oxygen (O), and silicon (Si). As an example, the pad sacrifice film 119 may include a silicon nitride film doped with at least one impurity element among carbon (C), nitrogen (N), oxygen (O), and silicon (Si). The impurity elements may be provided inside the pad sacrifice film 119, for example, by an ion implantation process. As the pad sacrifice film 119 is doped with the impurity elements, the material properties of the pad sacrifice film 119 may be adjusted to the level similar to those of the selective mold sacrifice film SSN.

The cell contact MC1, the substrate contact MC2, and the through via TV may each be connected to the first wiring structure 180 on the interlayer insulating films 140*a* and 140*b*. For example, a first inter-wiring insulating film 142 that covers the second interlayer insulating film 140*b* may be formed. The first wiring structure 180 may be formed inside the first inter-wiring insulating film 142. The cell contact MC1, the substrate contact MC2, and the through via TV may each be electrically connected to the first wiring structure 180 by the contact via 184. The first wiring structure 180 may be connected to the bit line BL.

The peripheral circuit structure PER may include a peripheral circuit substrate 200, a peripheral circuit element PT, and a second wiring structure 260.

The peripheral circuit substrate 200 may include, for example, a semiconductor substrate such as a silicon substrate, a germanium substrate or a silicon-germanium substrate. Alternatively, the peripheral circuit substrate 200 may include an SOI substrate, a GOI substrate, and the like.

The peripheral circuit element PT may be formed on the peripheral circuit substrate 200. The peripheral circuit element PT may form a peripheral circuit (e.g., 30 of FIG. 1)

that controls the operation of the semiconductor memory device. For example, the peripheral circuit element PT may include a control logic (e.g., 37 of FIG. 1), a row decoder (e.g., 33 of FIG. 1), a page buffer (e.g., 35 of FIG. 1), and the like. In the following description, the surface of the peripheral circuit substrate 200 on which the peripheral circuit element PT is disposed may be referred to as a front side of the peripheral circuit substrate 200. In contrast, the surface of the peripheral circuit substrate 200 opposite to the front side of the peripheral circuit substrate 200 may be referred to as a back side of the peripheral circuit substrate 200.

The peripheral circuit element PT may include, for example, but is not limited to, a transistor. For example, the peripheral circuit element PT may include not only various active elements such as a transistor, but also various passive elements such as a capacitor, a resistor, and an inductor.

In some embodiments, the back side of the cell substrate 100 may be opposite to the front side of the peripheral circuit substrate 200. For example, a second inter-wiring insulating film 240 that covers the peripheral circuit element PT may be formed on the front side of the peripheral circuit substrate 200. The cell substrate 100 and/or the insulating substrate 101 may be stacked on the upper surface of the second inter-wiring insulating film 240.

The first wiring structure 180 may be connected to the peripheral circuit element PT through the through via TV. For example, the second wiring structure 260 connected to the peripheral circuit element PT may be formed in the second inter-wiring insulating film 240. The through via TV may extend in the third direction Z to connect the first wiring structure 180 and the second wiring structure 260. Therefore, the bit line BL and/or each of the gate electrodes ECL, GSL, WL11 to WL1*n*, WL21 to WL2*n*, and SSL may be electrically connected to the peripheral circuit element PT.

In some embodiments, the through via TV may penetrate the insulating substrate 101 to connect the first wiring structure 180 and the second wiring structure 260. As a result, the through via TV may be electrically separated from the cell substrate 100.

Figure 9:
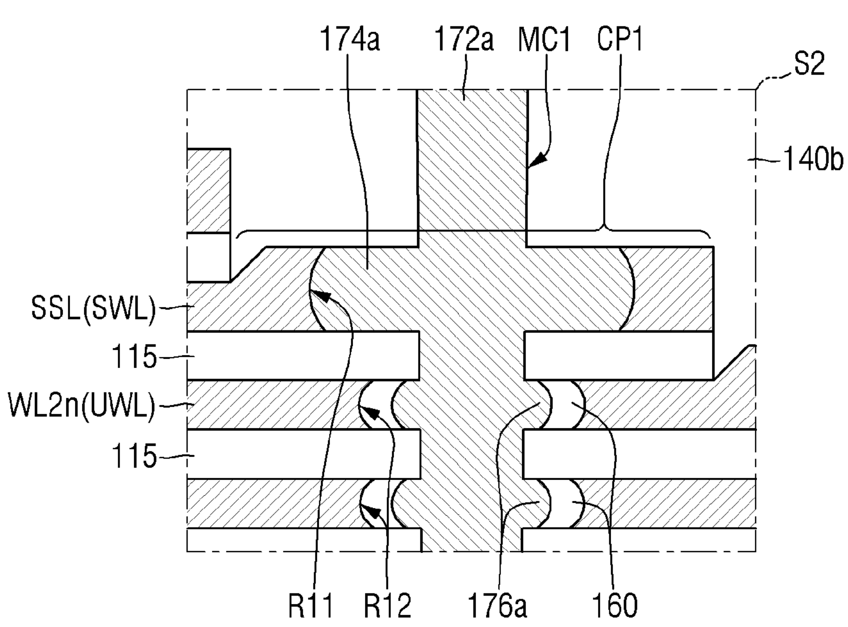
FIGS. 9 and 10 are cross-sectional views of a semiconductor memory device according to an example embodiment.
Figure 10:
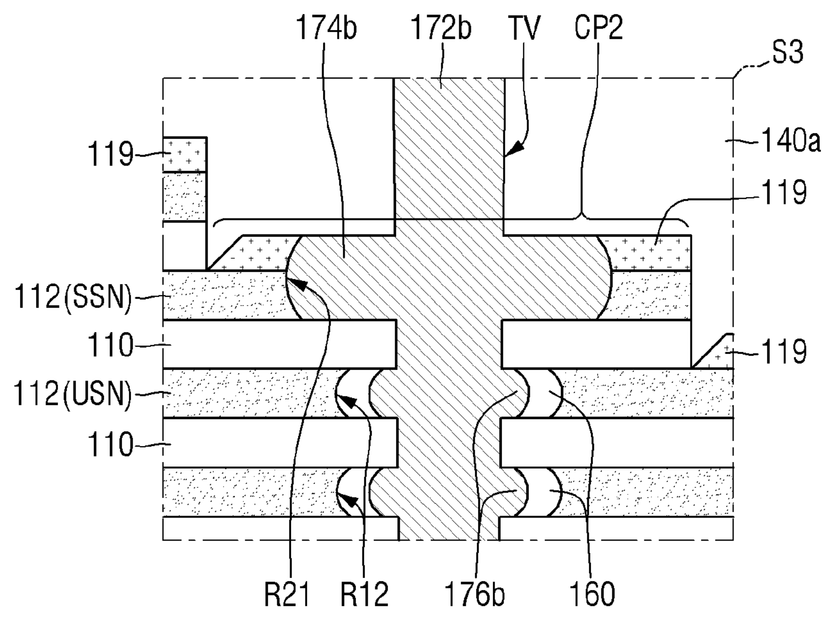

FIGS. 9 and 10 are cross-sectional views of a semiconductor memory device according to an example embodiment. For reference, FIG. 9 is a partial cross-sectional view of a region S2 of FIG. 4, and FIG. 10 is a partial cross-sectional view of a region S3 of FIG. 4. For convenience of explanation, repeated parts of contents explained above using FIGS. 1 to 8 will be briefly described or omitted.

Referring to FIGS. 9 and 10, in a semiconductor memory device according to some embodiments, the cell contact MC1 may further include a third protrusion part 176*a*, and the through via TV further includes a fourth protrusion part 176*b*.

The third protrusion part 176*a* may protrude from the side surface of the first penetration part 172*a* to come into contact with the insulating ring 160. As an example, the third protrusion part 176*a* may be an annular structure that surrounds the side surface of the first penetration part 172*a* inside the insulating ring 160 on the extended region EXT. The insulating ring 160 on the extended region EXT may be an annular structure that surrounds the third protrusion part 176*a* inside the non-selective gate electrode UWL.

The fourth protrusion part 176*b* may protrude from the side surface of the second penetration part 172*b* to come into contact with the insulating ring 160. As an example, the fourth protrusion part 176*b* may be an annular structure that surrounds the side surface of the second penetration part 172*b* inside the insulating ring 160 on the through region THR. The insulating ring 160 on the through region THR may be an annular structure that surrounds the fourth protrusion part 176*b* inside the non-selective gate electrode UWL.

Figure 11:
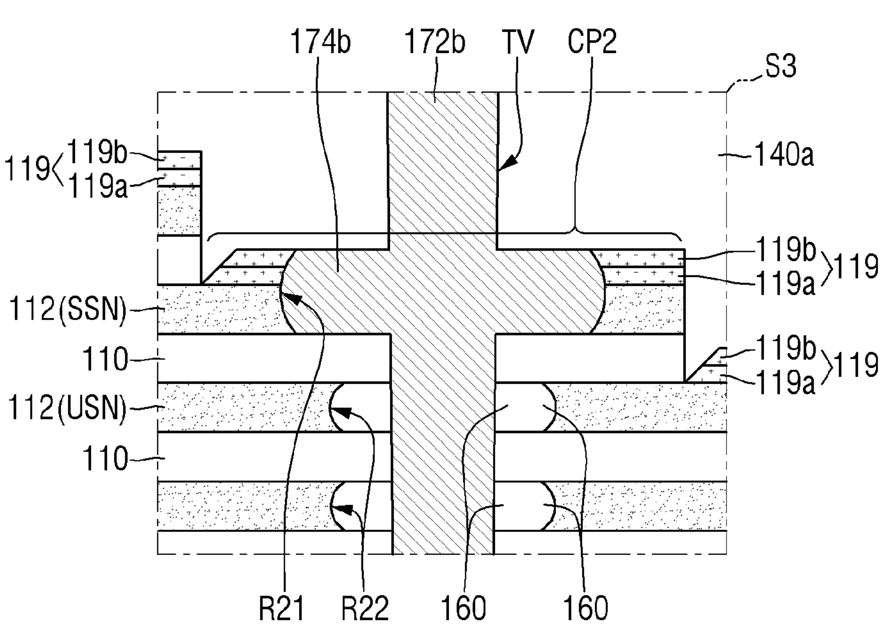
FIG. 11 is a cross-sectional view of a semiconductor memory device according to an example embodiment.

FIG. 11 is a cross-sectional view of a semiconductor memory device according to an example embodiment. For reference, FIG. 11 is a partial cross-sectional view of a region S3 of FIG. 4. For convenience of explanation, repeated parts of contents explained above using FIGS. 1 to 8 will be briefly described or omitted.

Referring to FIG. 11, in the semiconductor memory device according to some embodiments, the pad sacrifice film 119 may be formed by multiple layers.

For example, the pad sacrifice film 119 may include a first sub-pad sacrifice film 119*a* and a second sub-pad sacrifice film 119*b* that are sequentially stacked on the selective mold sacrifice film SSN. The first sub-pad sacrifice film 119*a* and the second sub-pad sacrifice film 119*b* may each include, but are not limited to, insulating materials, for example, at least one of silicon oxide, silicon nitride and silicon oxynitride nitride.

In some embodiments, the first sub-pad sacrifice film 119*a* and the second sub-pad sacrifice film 119*b* may have different material properties from each other. For example, in an replacement process for forming the gate electrodes ECL, GSL, WL11 to WL1*n*, WL21 to WL2*n*, and SSL from the mold sacrifice films 112 and 117 and the pad sacrifice film 119, the etching rate of the first sub-pad sacrifice film 119*a* and the etching rates of the second sub-pad sacrifice film 119*b* may be different from each other.

In some embodiments, in a wet etching process that uses phosphoric acid, the etching rate of the first sub-pad sacrifice film 119*a* may be higher than the etching rate of the second sub-pad sacrifice film 119*b*.

The material properties of the pad sacrifice film 119 may be adjusted by, for example, but are not limited to, the ratio of the constituent elements included in the pad sacrifice film 119, the concentration of the impurity elements doped in the pad sacrifice film 119, the process conditions for forming the pad sacrifice film 119. As an example, the temperature of the deposition process for forming the first sub-pad sacrifice film 119*a* may be lower than the temperature of the deposition process for forming the second sub-pad sacrifice film 119*b*.

Figure 12:
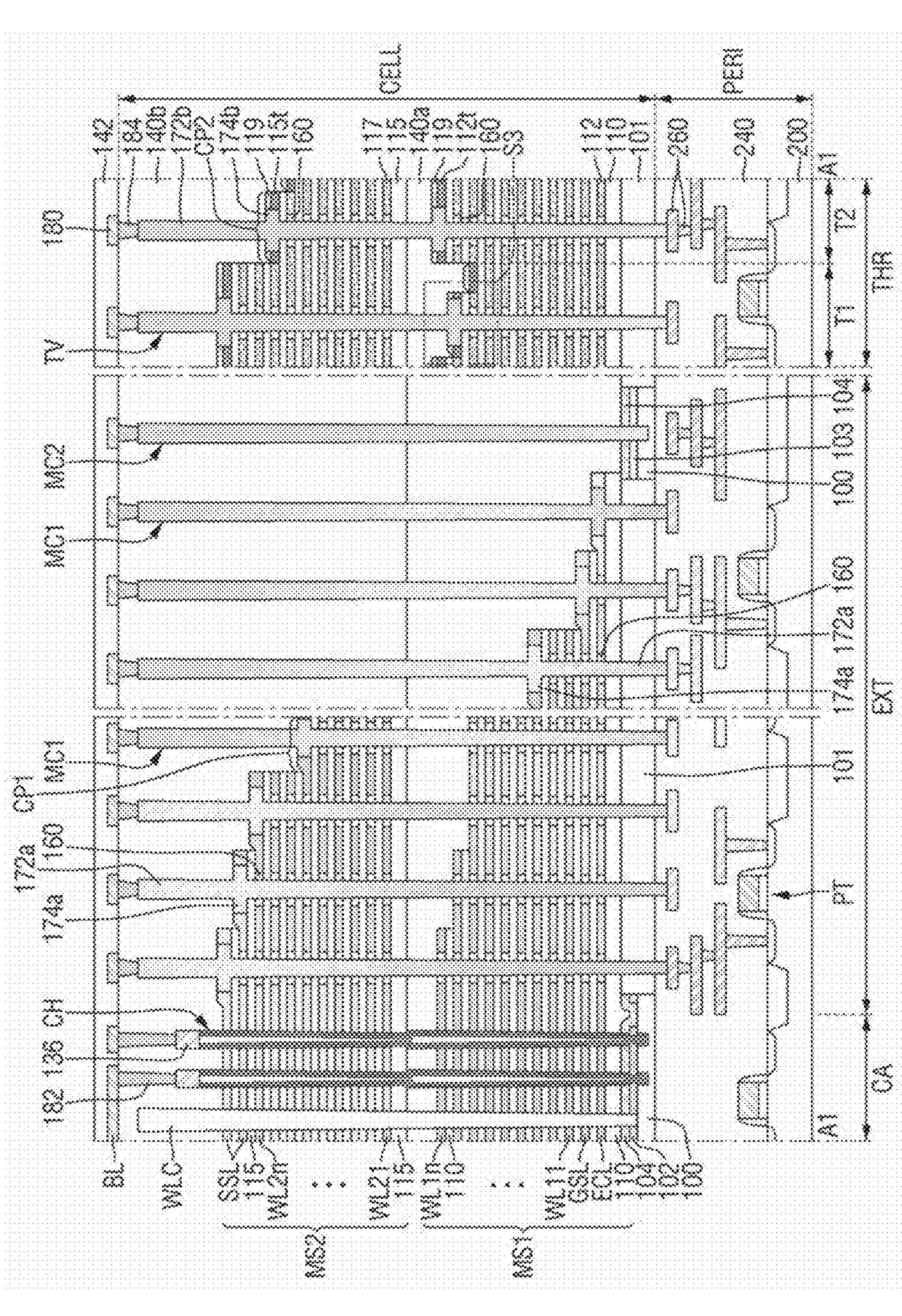
FIG. 12 is a cross-sectional view of a semiconductor memory device according to an example embodiment.
Figure 13:
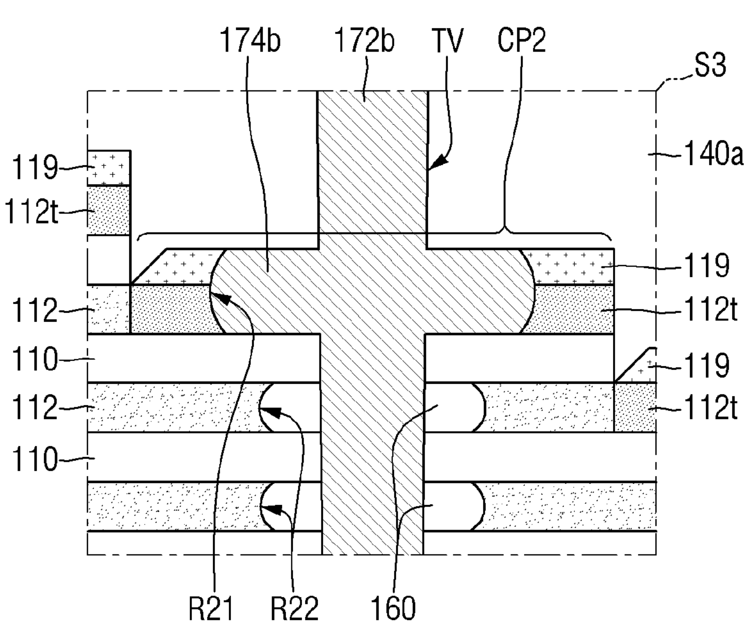
FIG. 13 is a cross-sectional view of a region S3 of FIG. 12 according to an example embodiment.

FIG. 12 is a cross-sectional view of a semiconductor memory device according to an example embodiment. FIG. 13 is a cross-sectional view of a region S3 of FIG. 12 according to an example embodiment. For reference, FIG. 12 is a cross-sectional view taken along A1-A1 of FIG. 3. For convenience of explanation, repeated parts of contents explained above using FIGS. 1 to 8 will be briefly described or omitted.

Referring to FIGS. 12 and 13, in the semiconductor memory device according to some embodiments, at least a part of the mold sacrifice films 112 and 117 may include pad portions 112*t* and 117*t*.

The pad portions 112*t* and 117*t* may be a part of each of the mold sacrifice films 112 and 117 disposed below the pad sacrifice film 119. For example, the first mold sacrifice film (112 of the uppermost part) disposed at the uppermost part in the first mold structure MS1 and the second mold sacrifice film (117 of the uppermost part) disposed at the uppermost part in the second mold structure MS2 may each include pad portions 112*t* and 117*t*. Alternatively, for example, the second pad region CP2 may include the pad portions 112*t* and 117*t*.

The pad portions 112*t* and 117*t* may have material properties similar to those of the pad sacrifice film 119. For example, in a replacement process for forming the gate electrodes ECL, GSL, WL11 to WL1*n*, WL21 to WL2*n*, and SSL from the mold sacrifice films 112 and 117 and the pad sacrifice film 119, the etching rate of the pad portions 112*t* and 117*t* may be similar to the etching rate of the pad sacrifice film 119.

In some embodiments, in a wet etching process that uses phosphoric acid, the etching rate of the pad portions 112*t* and 117*t* may be similar to the etching rate of the pad sacrifice film 119.

The pad portions 112*t* and 117*t* and the pad sacrifice film 119 may have material properties different from those of the non-selective mold sacrifice film USN. For example, in the replacement process for forming the gate electrodes ECL, GSL, WL11 to WL1*n*, WL21 to WL2*n*, and SSL from the mold sacrifice films 112 and 117 and the pad sacrifice film 119, the etching rate of the pad portions 112*t* and 117*t* may be greater than the etching rate of the non-selective mold sacrifice film USN.

In some embodiments, in the wet etching process that uses phosphoric acid, the etching rate of the pad portions 112*t* and 117*t* and the etching rate of the pad sacrifice film 119 may be greater than the etching rate of the non-selective mold sacrifice film USN.

In some embodiments, the pad portions 112*t* and 117*t* may be regions formed by a surface treatment process on a part of the mold sacrifice films 112 and 117. The surface treatment process may include, but is not limited to, for example, an ion implantation process, a heat treatment process, a $UV/O_3$ (ultraviolet/ozone) treatment process, and the like. As the surface treatment process is performed on a part of the mold sacrifice films 112 and 117, the material properties of the pad portions 112*t* and 117*t* may be adjusted to the level similar to that of the pad sacrifice film 119.

Figure 14:
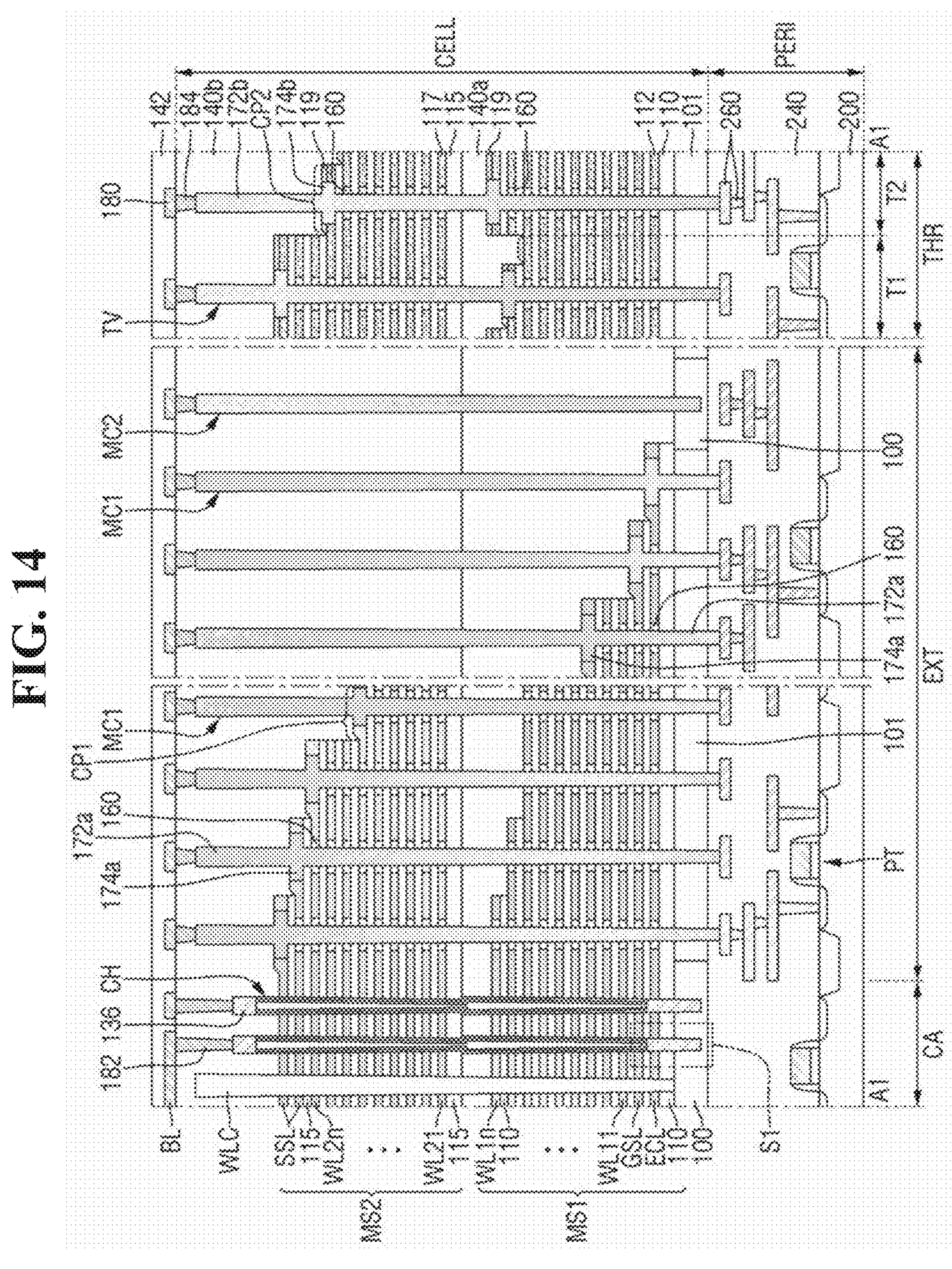
FIG. 14 is a cross-sectional view of a semiconductor memory device according to an example embodiment.
Figure 15:
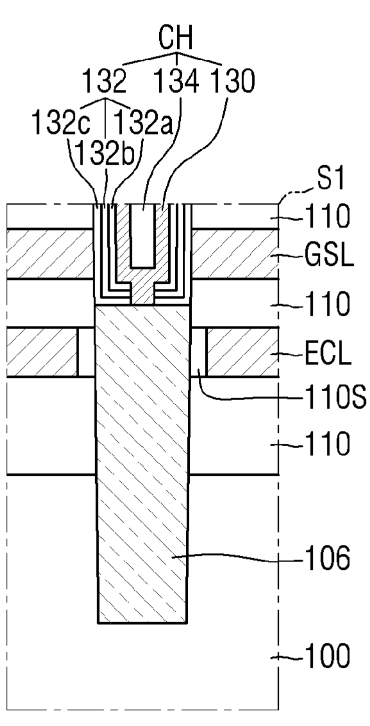
FIG. 15 is a cross-sectional view of a region S1 of FIG. 14 according to an example embodiment.

FIG. 14 is a cross-sectional view of a semiconductor memory device according to an example embodiment. FIG. 15 is a cross-sectional view of a region S1 of FIG. 14 according to an example embodiment. For reference, FIG. 14 is a cross-sectional view taken along A1-A1 of FIG. 3. For convenience of explanation, repeated parts of contents explained above using FIGS. 1 to 8 will be briefly described or omitted.

Referring to FIGS. 14 and 15, a semiconductor memory device according to some embodiments may include a source pattern 106.

The source pattern 106 may be formed on the cell substrate 100. The source pattern 106 may be connected to the semiconductor pattern 130 of the channel structure CH. For example, the semiconductor pattern 130 may penetrate the information storage film 132 to come into contact with the upper surface of the source pattern 106. The source pattern 106 and the cell substrate 100 may be provided as a common source line (e.g., CSL of FIG. 2) of the semiconductor memory device.

The source pattern 106 may include, but is not limited to, conductive materials, for example, polysilicon or metal doped with impurities. The source pattern 106 may be formed from the cell substrate 100, for example, but is not limited to, by a selective epitaxial growth method.

Although the lower part of the source pattern 106 is only shown as being embedded inside the cell substrate 100, this is only an example. As another example, the lower surface of the source pattern 106 may be disposed on the same plane as the upper surface of the cell substrate 100.

In some embodiments, the upper surface of the source pattern 106 may intersect a part of the gate electrodes ECL, GSL, WL11 to WL1*n*, WL21 to WL2*n*, and SSL. In an example, the upper surface of the source pattern 106 may be formed to be higher than the upper surface of the erasure control line ECL. In this case, the gate insulating film 110S may be interposed between the gate electrode (e.g., the erasure control line ECL) intersecting the source pattern 106 and the source pattern 106.

Figure 16A:
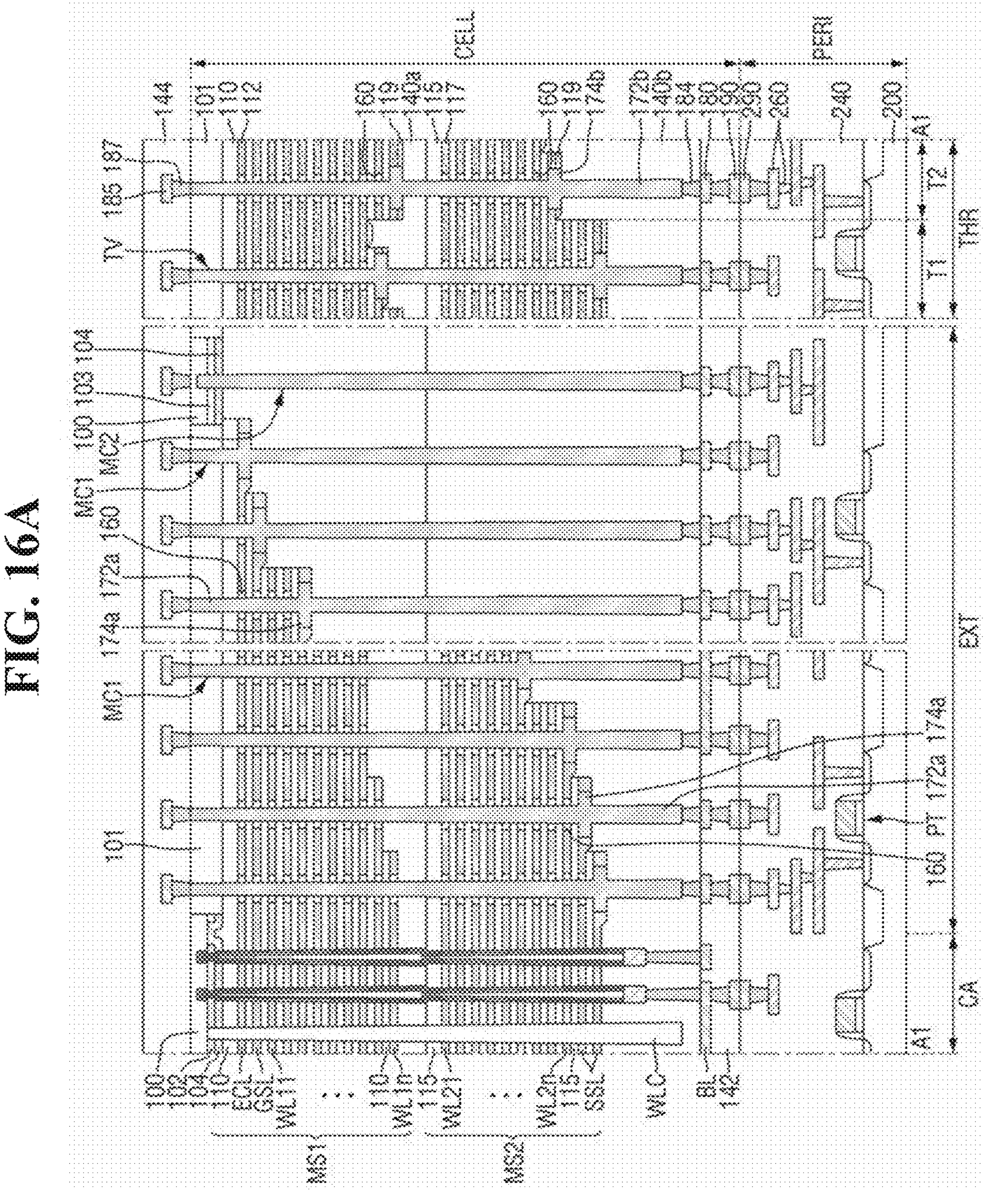
FIG. 16A is a cross-sectional view of a semiconductor memory device according to an example embodiment.

FIG. 16A is a cross-sectional view of a semiconductor memory device according to an example embodiment. For reference, FIG. 16A is a cross-sectional view taken along A1-A1 of FIG. 3. For convenience of explanation, repeated parts of contents explained above using FIGS. 1 to 8 will be briefly described or omitted.

Referring to FIG. 16A, the front side of the cell substrate 100 may be opposite to the front side of the peripheral circuit substrate 200.

For example, the semiconductor memory device according to some embodiments may have a chip to chip (C2C) structure. The C2C structure may mean a structure in which an upper chip including a memory cell structure CELL is fabricated on a first wafer (e.g., the cell substrate 100), and a lower chip including a peripheral circuit structure PERI is fabricated on a second wafer (e.g., the peripheral circuit substrate 200) different from the first wafer, and then, the upper chip and the lower chip are connected to each other by a bonding way.

As an example, the bonding way may mean a way of electrically connecting the first bonding metal 190 formed on an uppermost metal layer of the upper chip and the second bonding metal 290 formed on an uppermost metal layer of the lower chip to each other. For example, when the first bonding metal 190 and the second bonding metal 290 are formed of copper (Cu), the bonding way may be a Cu—Cu bonding way. However, this is only exemplary, and the first bonding metal 190 and the second bonding metal 290 may, of course, be made of various other metals such as aluminum (Al) or tungsten (W).

As the first bonding metal 190 and the second bonding metal 290 are bonded, the first wiring structure 180 may be connected to the second wiring structure 260. Therefore, the bit line BL and/or each of the gate electrodes ECL, GSL, WL11 to WL1*n*, WL21 to WL2*n*, and SSL may be electrically connected to the peripheral circuit element PT.

Figure 16B:
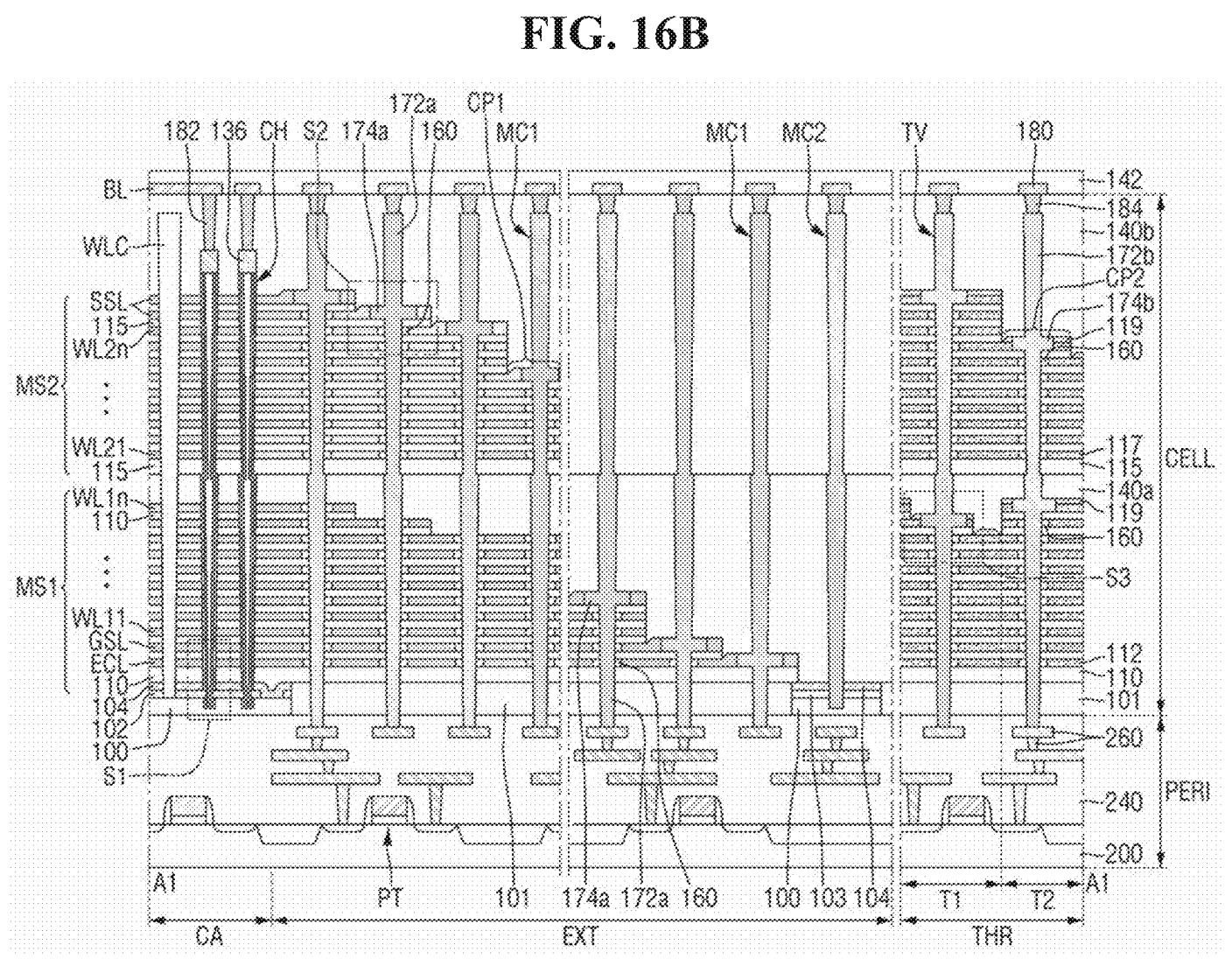

FIG. 16B is another exemplary cross-sectional view for explaining a semiconductor memory device according to some embodiments. For reference, FIG. 16B is a cross-sectional view taken along A1-A1 of FIG. 3. For convenience of explanation, repeated parts of contents explained above using FIGS. 1 to 8 will be briefly described or omitted.

Referring to FIG. 16B, the first penetration 172*a* and the second penetration 172*b* may each have a bent portion between the first mold structure MS1 and the second mold structure MS2.

For example, the first penetration 172*a* and/or the second penetration 172*b* penetrating the second mold structure MS2 may be formed, after the first penetration 172*a* and/or the second penetration 172*b* penetrating the first mold structure MS1 is formed. In some embodiments, the substrate contact MC2 may have a bent portion between the first mold structure MS1 and the second mold structure MS2.

Figure 17:
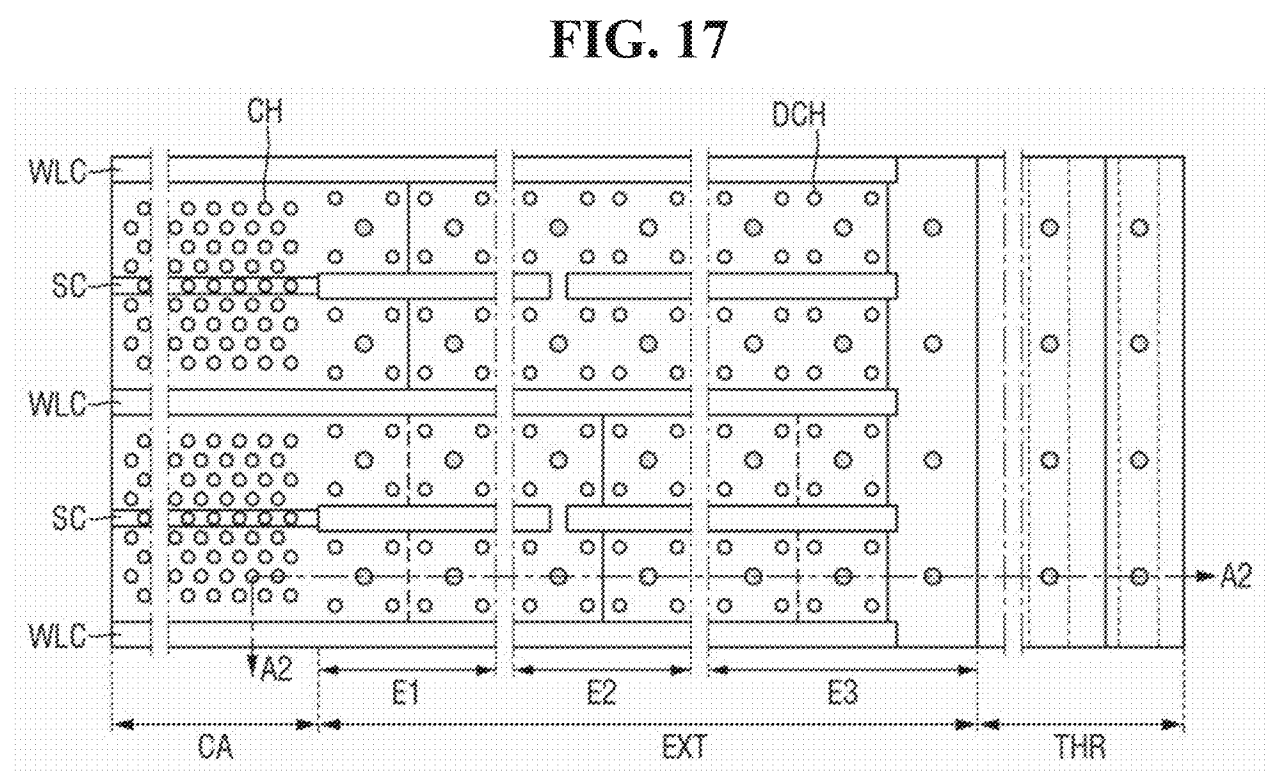
Figure 18:
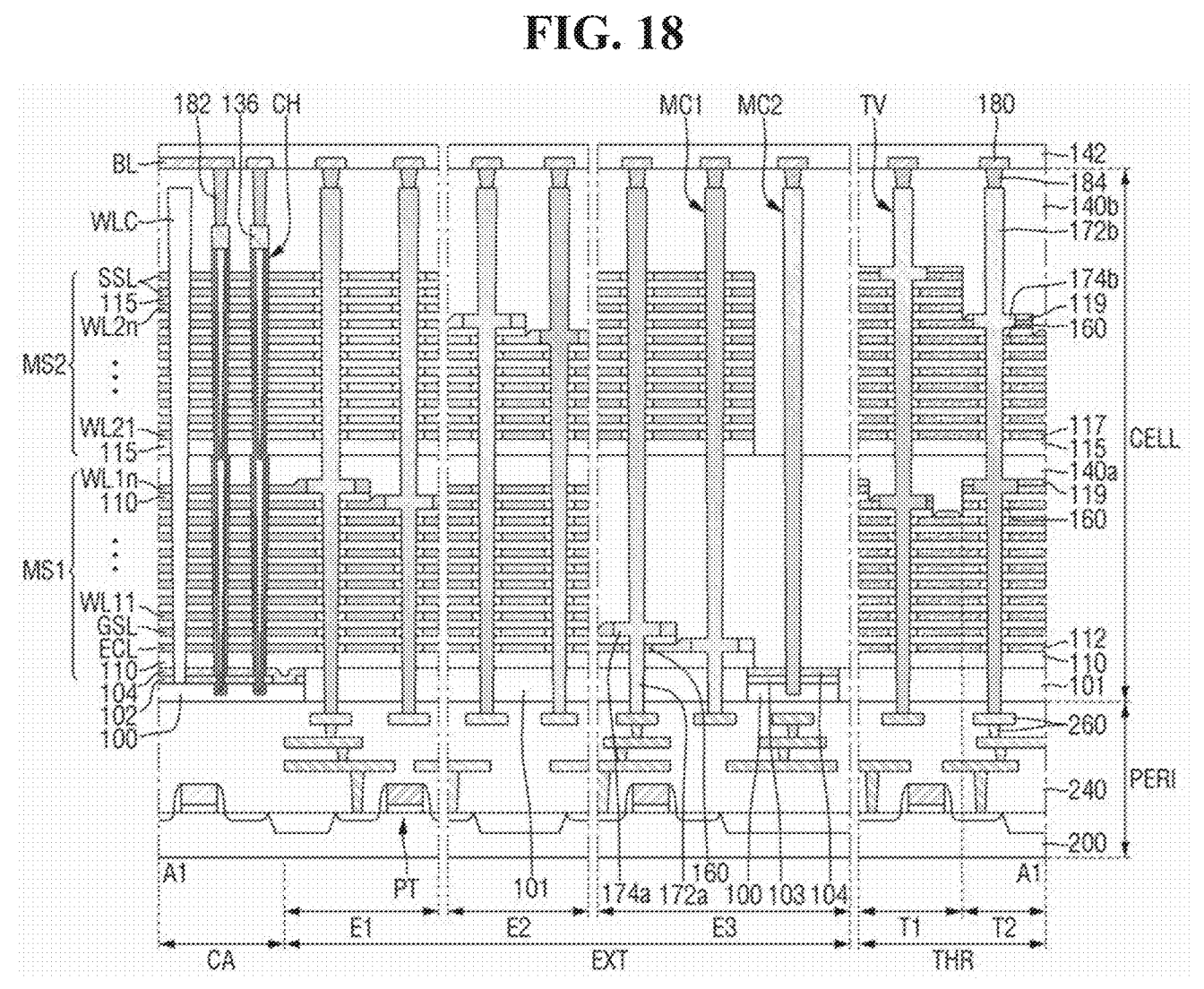

FIG. 17 is a diagram of the semiconductor memory device according to an example embodiment. FIG. 18 is a cross-sectional view taken along A2-A2 of FIG. 17 according to an example embodiment. For convenience of explanation, repeated parts of contents explained above using FIGS. 1 to 8 will be briefly described or omitted.

Referring to FIGS. 17 and 18, in the semiconductor memory device according to some embodiments, the first mold structure MS1 and the second mold structure MS2 on the extended region EXT may alternately have a stepped shape.

For example, the extended region EXT may include a first sub-extended region E1, a second sub-extended region E2, and a third sub-extended region E3. The first sub-extended region E1, the second sub-extended region E2, and the third sub-extended region E3 may be regions adjacent to each other, or may be regions spaced apart from each other. The first mold structure MS1 on the first sub-extended region E1 may be stacked in the step form, and the second mold structure MS2 on the first sub-extended region E1 may not be stacked in the step form. In contrast, the first mold structure MS1 on the second sub-extended region E2 may not be stacked in the step form, and the second mold structure MS2 on the second sub-extended region E2 may be stacked in the step form. In contrast, the first mold structure MS1 on the third sub-extended region E3 may be stacked in the step form, and the second mold structure MS2 on the third sub-extended region E3 may not be stacked in the step form. Such an alternating stepped stacked structure may be used to reduce the area of the extended region EXT.

Figure 19:
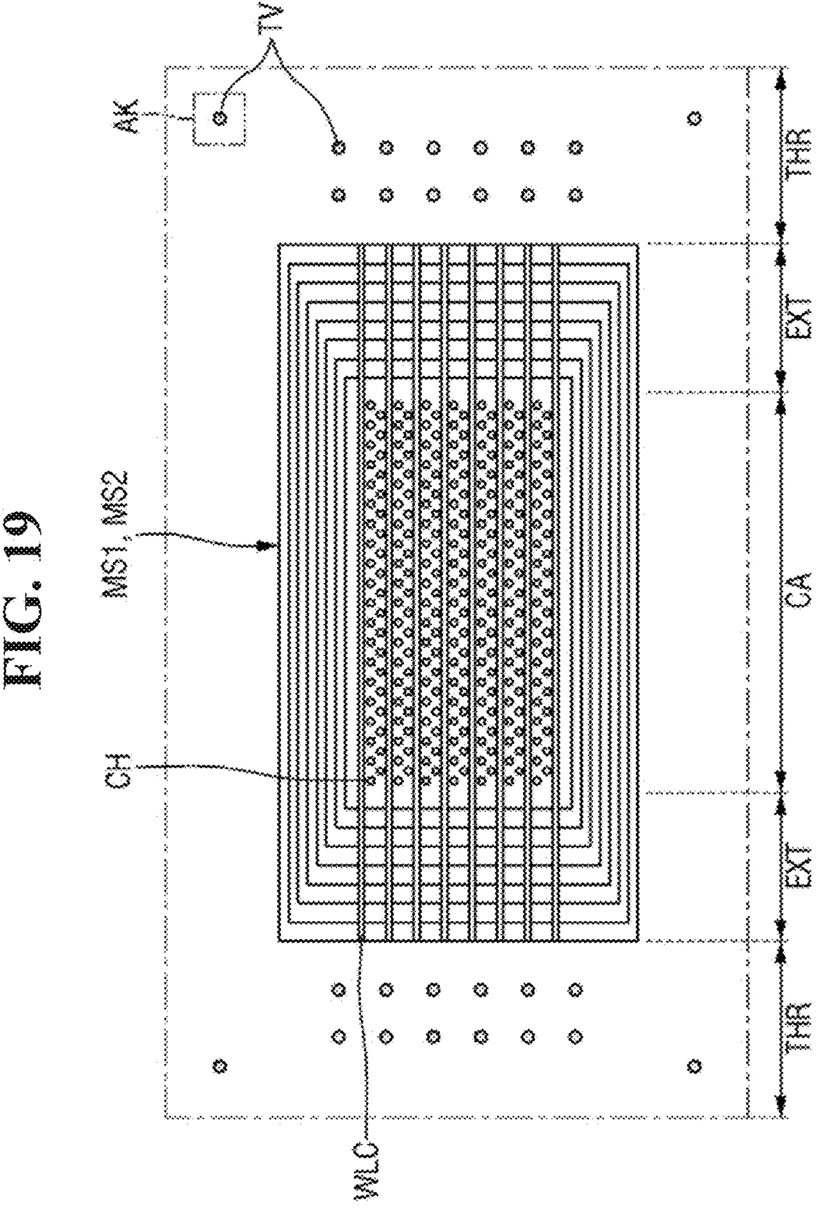
FIG. 19 is a diagram of the semiconductor memory device according to an example embodiment.

FIG. 19 is a diagram of the semiconductor memory device according to an example embodiment. For convenience of explanation, repeated parts of contents explained above using FIGS. 1 to 18 will be briefly described or omitted.

Referring to FIG. 19, in the semiconductor memory device according to some embodiments, at least a part of the plurality of through vias TV may be disposed inside an alignment key region AK.

The alignment key region AK may be defined, for example, in a part of the through region THR that surrounds the cell array region CA and the extended region EXT. For example, the mold sacrifice films 112 and 117, the pad sacrifice film 119, and the through via TV explained above using FIG. 4 may be disposed on the alignment key region AK.

The through via TV disposed in the alignment key region AK may be provided as an alignment key in the fabricating process of the semiconductor memory device according to some embodiments. As an example, the through via TV disposed in the alignment key region AK may be used, but is not limited to, to align the channel structure CH in the first mold structure MS1 and the channel structure CH in the second mold structure MS2.

In some embodiments, a part of the through region THR may be provided as a scribe lane region. The scribe lane region is a region provided so that each chip region may be separated and cut in the dicing process of the semiconductor wafer. The alignment key region AK may be disposed in the scribe lane region.

Hereinafter, a method for fabricating a semiconductor memory device according to an exemplary embodiment will be described referring to FIGS. 1 to 41.

FIGS. 20, 21, 22, 23, 24, 25, 26, 27, 28, 29, 30, 31, 32, 33, 34, 35 and 36 are diagrams of a method for fabricating a semiconductor memory device according to an example embodiment. For convenience of explanation, repeated parts of contents explained above using FIGS. 1 to 18 will be briefly described or omitted.

Figure 20:
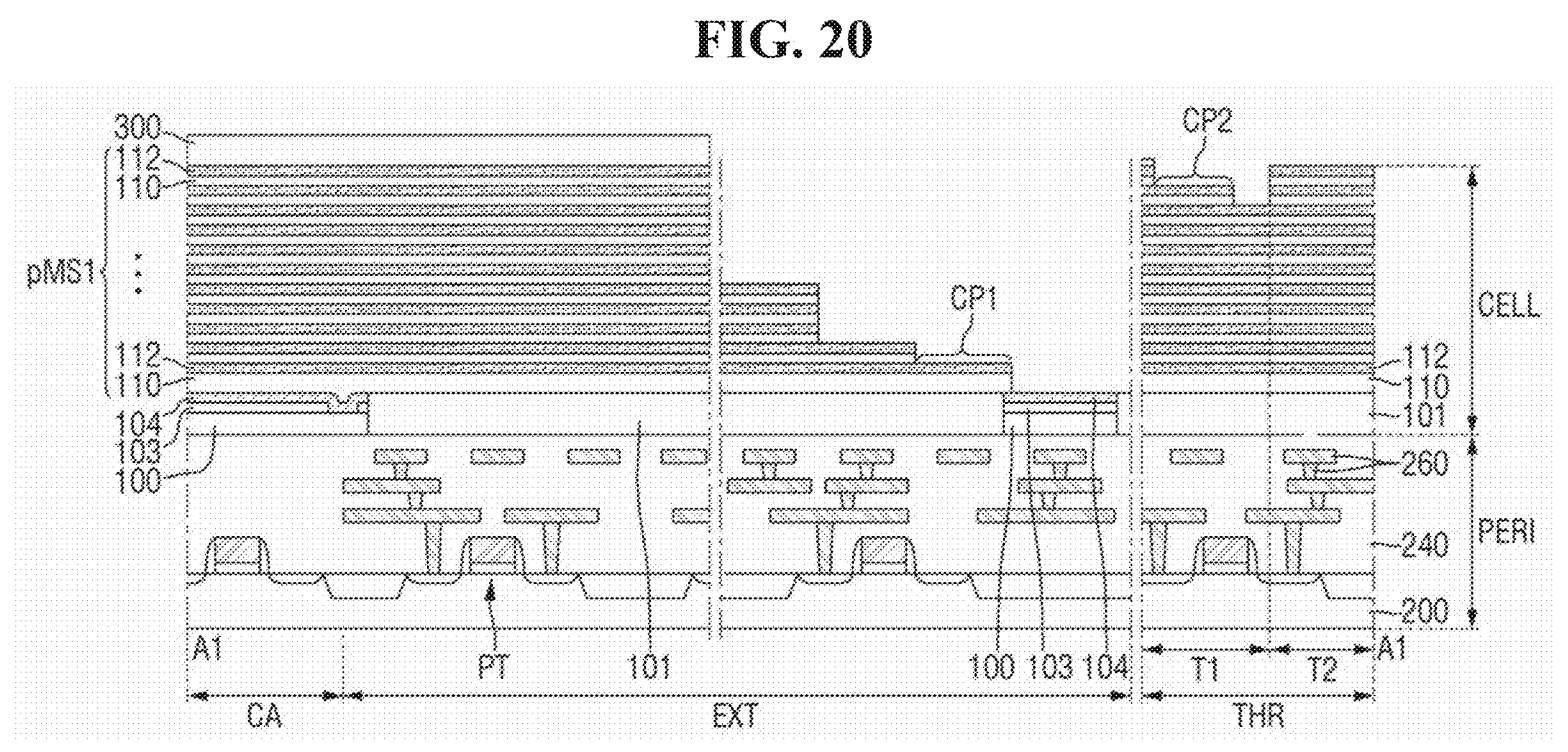

Referring to FIG. 20, a first preliminary mold pMS1 may be formed on the cell substrate 100 and/or the insulating substrate 101.

The first preliminary mold pMS1 may be formed on the front side of the cell substrate 100. The first preliminary mold pMS1 may include a plurality of first mold insulating films 110 and a plurality of first mold sacrifice films 112 that are alternately stacked on the cell substrate 100. The first preliminary mold pMS1 on the extended region EXT may be patterned in the step form. Therefore, each first mold sacrifice film 112 on the extended region EXT may include a first pad region CP1 whose upper surface is exposed on the extended region EXT.

In some embodiments, at least a part of the first preliminary mold pMS1 on the through region THR may be patterned in the step form. Therefore, at least a part of the first mold sacrifice film 112 on the through region THR may include a second pad region CP2 whose upper surface is exposed on the through region THR.

The first mold sacrifice film 112 may include a material having an etching selectivity with respect to the first mold insulating film 110. As an example, the first mold insulating film 110 may include a silicon oxide film, and the first mold sacrifice film 112 may include a silicon nitride film.

The cell substrate 100 and/or the insulating substrate 101 may be stacked on the peripheral circuit structure PER. For example, the peripheral circuit element PT, the second wiring structure 260, and the second inter-wiring insulating film 240 may be formed on the peripheral circuit substrate 200. The cell substrate 100 and/or the insulating substrate 101 may be stacked on the second inter-wiring insulating film 240.

In some embodiments, the source sacrifice layer 103 and the support layer 104 may be formed on the cell substrate 100 before forming the first preliminary mold pMS1. The source sacrifice layer 103 may include a material having an etching selectivity with respect to the first mold insulating film 110. The support layer 104 may include a material having an etching selectivity with respect to the source sacrifice layer 103. As an example, the source sacrifice layer 103 may include a silicon nitride film, and the support layer 104 may include a polysilicon film.

Figure 21:
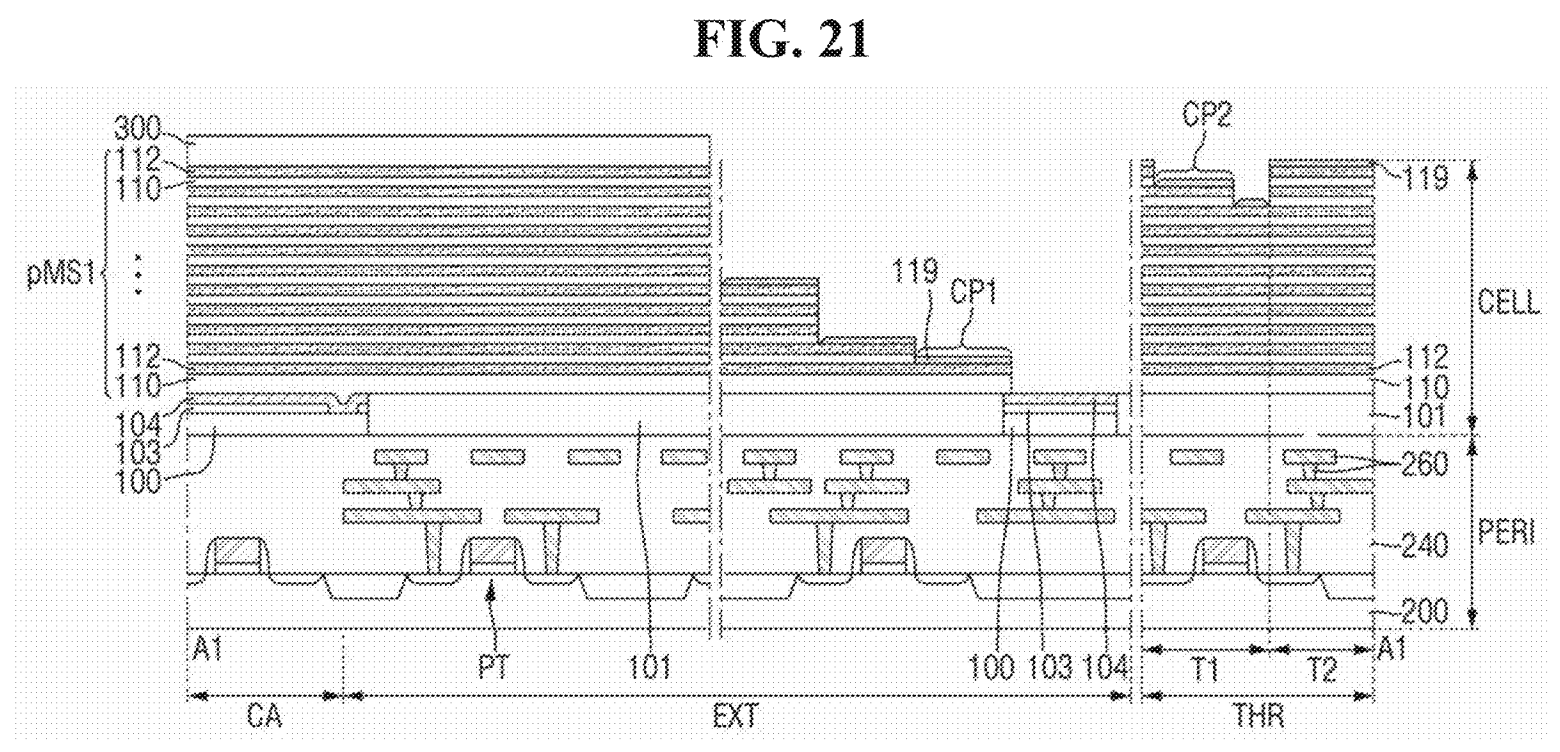

Referring to FIG. 21, the pad sacrifice film 119 may be formed on the first mold sacrifice film 112.

The pad sacrifice film 119 may extend along the exposed upper surface of the first mold sacrifice film 112. For example, the pad sacrifice film 119 may extend along the upper surface of the first mold sacrifice film (112 of the uppermost part) disposed at the uppermost part. Further, for example, the pad sacrifice film 119 may extend along the upper surface of the first pad region CP1 and the upper surface of the second pad region CP2.

The pad sacrifice film 119 may be formed, for example, by a step of forming an insulating layer (e.g., a nitride layer) that covers the exposed upper surface and side surfaces of the first mold sacrifice film 112, and a step of removing a part of the insulating layer and leaving the insulating layer only on the exposed upper surface of the first mold sacrifice film 112. A thickness of the pad sacrifice film 119 may be, but is not limited to, about 20% to about 110% of the thickness of the first mold sacrifice film 112. The removal of a part of the insulating layer may be performed, but is not limited to, for example, after changing the material properties of the horizontally deposited regions of the insulating layer using plasma.

In some embodiments, a mask film 300 may be formed on a part of the upper surface of the first preliminary mold pMS1. The mask film 300 may cover a part of the upper surface of the first mold sacrifice film 112. As a result, a part of the upper surface of the first mold sacrifice film 112 may not be exposed. The pad sacrifice film 119 may extend along the upper surface of the first mold sacrifice film 112 exposed from the mask film 300.

Figure 22:
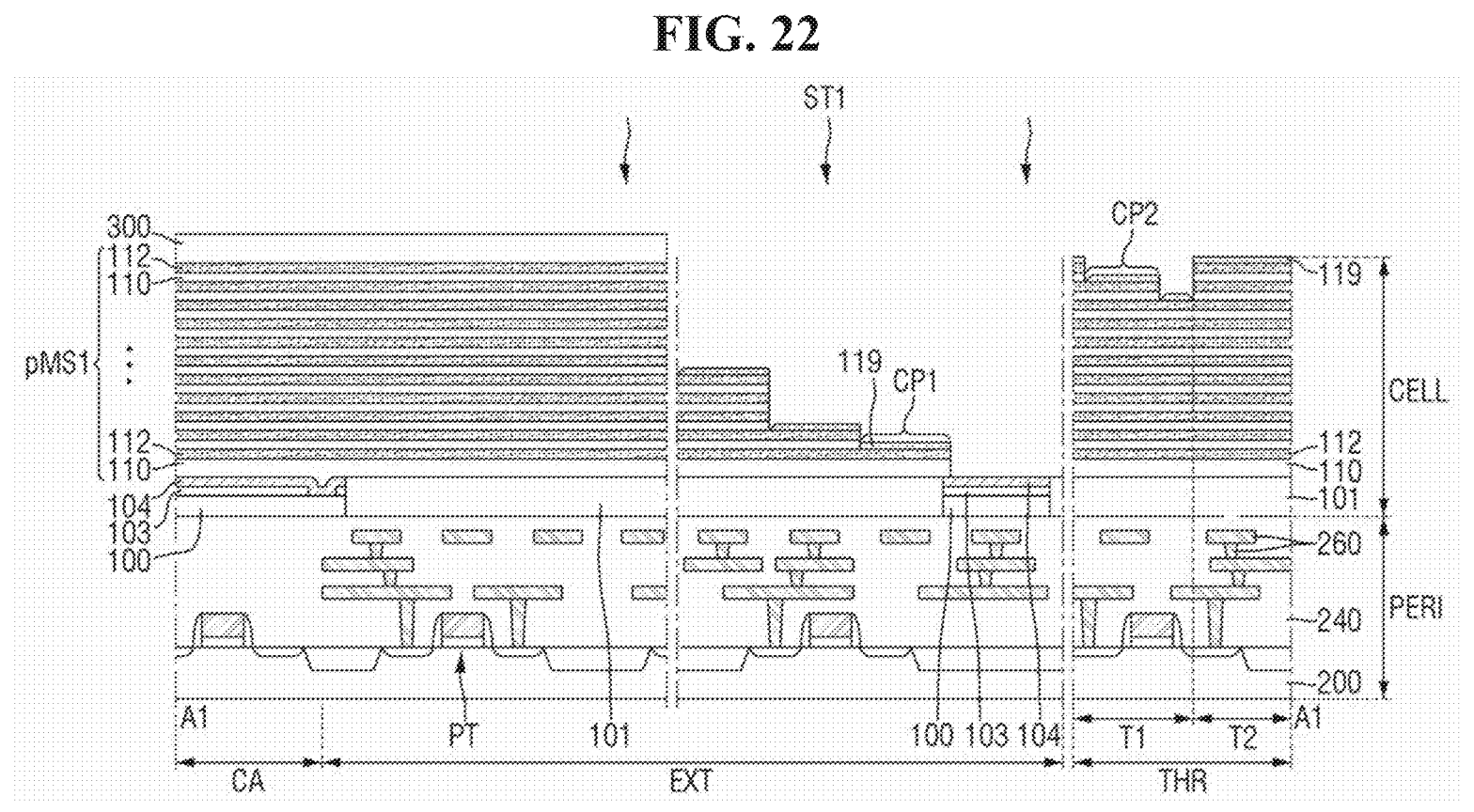

Referring to FIG. 22, a first surface treatment process ST1 may be performed on the pad sacrifice film 119.

As the first surface treatment process ST1 is performed, the material properties of the pad sacrifice film 119 may be adjusted to the level similar to that of the material properties of the first mold sacrifice film 112. In some embodiments, the first surface treatment process ST1 may include an ion implantation process. For example, the impurity elements may be doped to the inside of the pad sacrifice film 119 through the ion implantation process. The impurity elements may include, but are not limited to, for example, at least one of carbon (C), nitrogen (N), oxygen (O), and silicon (Si).

Figure 23:
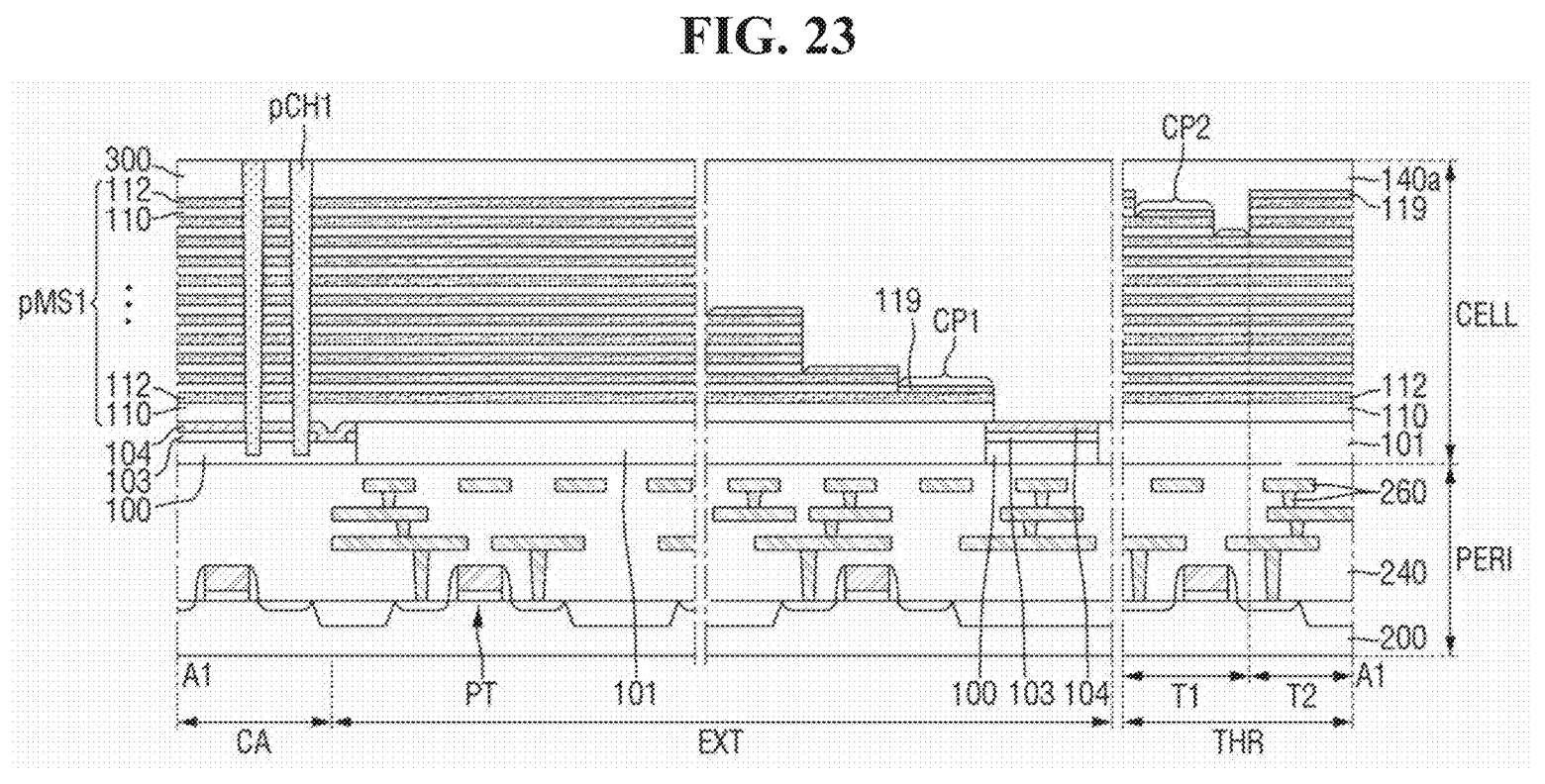

Referring to FIG. 23, a first preliminary channel pCH1 may be formed inside the first preliminary mold pMS1.

For example, the first interlayer insulating film 140*a* that covers the first preliminary mold pMS1 may be formed. The first preliminary channel pCH1 may penetrate the first preliminary mold pMS1 and/or the first interlayer insulating film 140*a*.

The first preliminary channel pCH1 may penetrate the first preliminary mold pMS1 on the cell array region CA. In some embodiments, the first preliminary channel pCH1 may penetrate the source sacrifice layer 103 and the support layer 104 and be connected to the cell substrate 100.

The first preliminary channel pCH1 may include a material having an etching selectivity with respect to the first mold insulating film 110 and the first mold sacrifice film 112. In an example, the first preliminary channel pCH1 may include polysilicon (poly Si).

Figure 24:
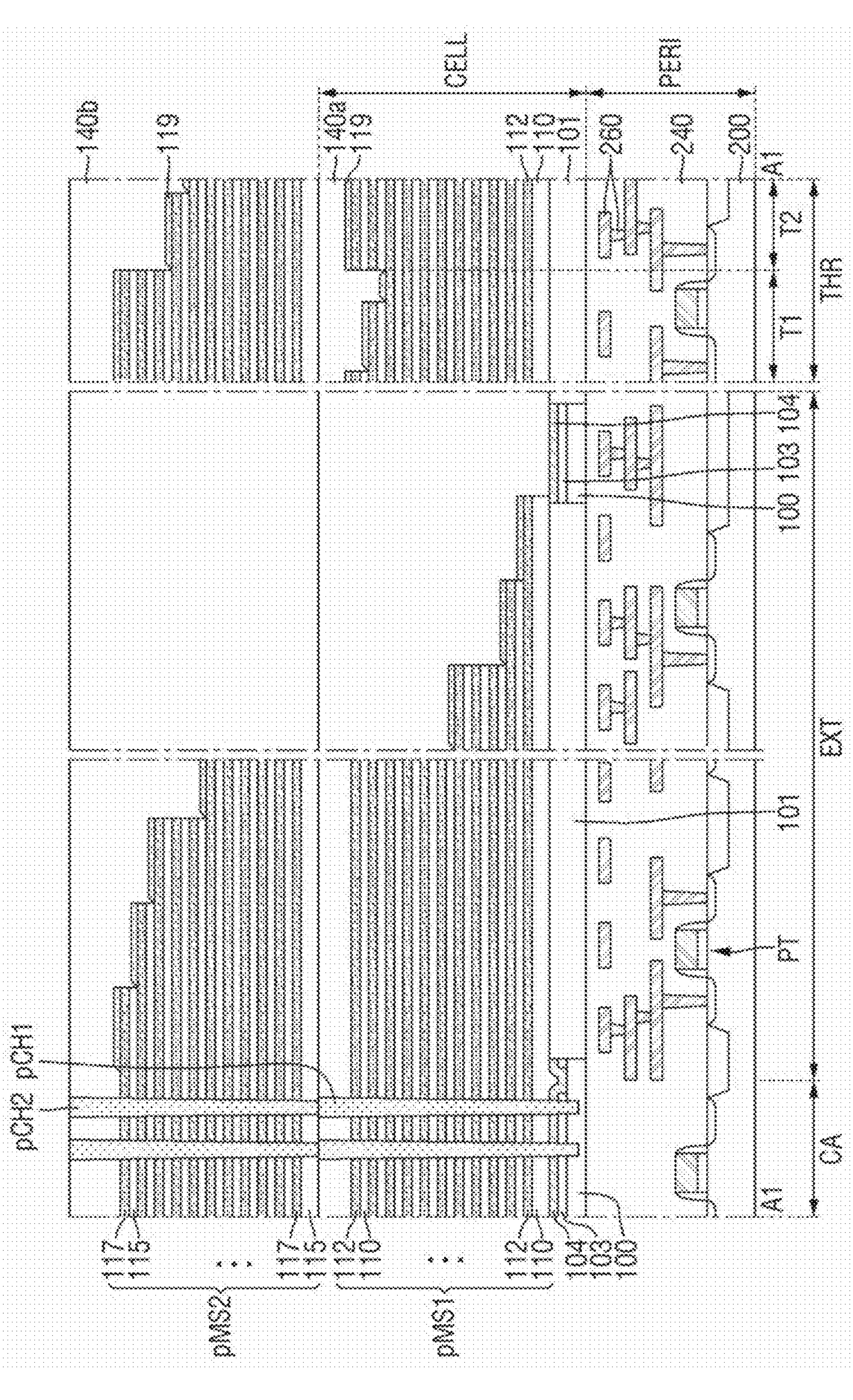

Referring to FIG. 24, a second preliminary mold pMS2 and a second preliminary channel pCH2 may be formed on the first preliminary mold pMS1.

Because formation of the second preliminary mold pMS2 and the second preliminary channel pCH2 may be similar to that explained above using FIGS. 20 to 23, the detailed description will be omitted below.

Figure 25:
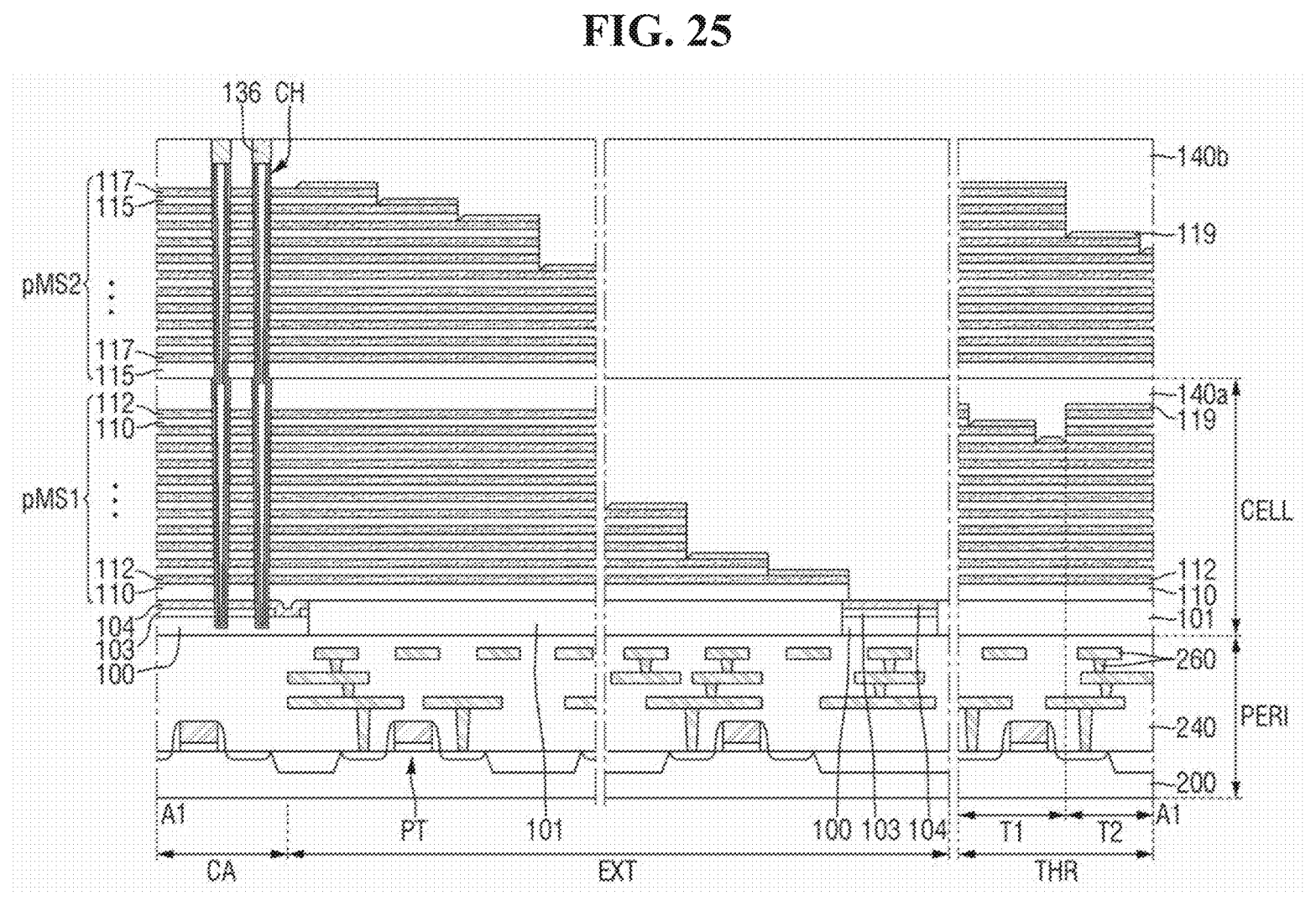

Referring to FIG. 25, a channel structure CH may be formed.

For example, the first preliminary channel pCH1 and the second preliminary channel pCH2 may be selectively removed. Next, the channel structure CH that replaces the region from which the first preliminary channel pCH1 and the second preliminary channel pCH2 is removed may be formed. Accordingly, the channel structure CH that penetrates the first preliminary mold pMS1 and the second preliminary mold pMS2 may be formed in the cell array region CA.

Figure 26:
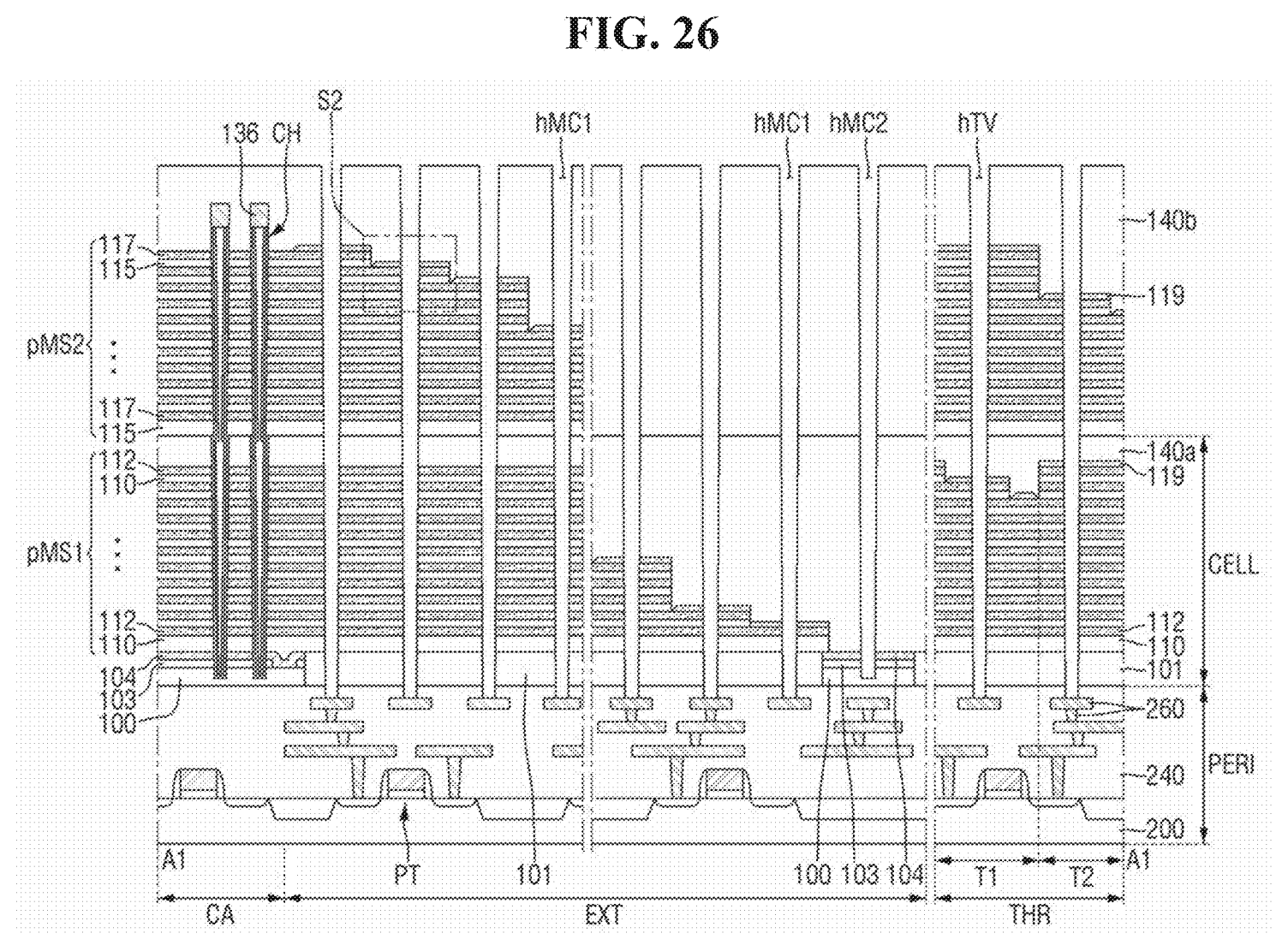
Figure 27:
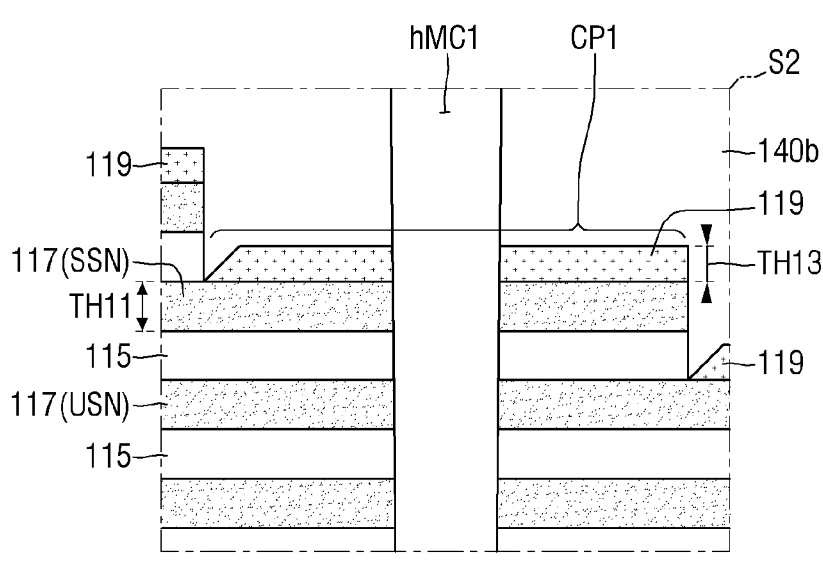

Referring to FIGS. 26 and 27, the cell contact hole hMC1, the substrate contact hole hMC2 and the through via hole hTV may be formed. For reference, FIG. 27 is a partial cross-sectional view for explaining a region S2 of FIG. 26.

The cell contact hole hMC1 may penetrate the first preliminary mold pMS1 and the second mold pMS2 on the extended region EXT. The cell contact hole hMC1 may penetrate the cell substrate 100 and/or the insulating substrate 101 to expose a part of the second wiring structure 260.

The substrate contact hole hMC2 may penetrate the interlayer insulating films 140*a* and 140*b*. In some embodiments, the substrate contact hole hMC2 may penetrate the source sacrifice layer 103 and the support layer 104 to expose a part of the cell substrate 100.

The through via hole hTV may penetrate the first preliminary mold pMS1 and the second mold pMS2 on the through region THR. The through via hole hTV may penetrate the cell substrate 100 and/or the insulating substrate 101 to expose a part of the second wiring structure 260.

Figure 28:
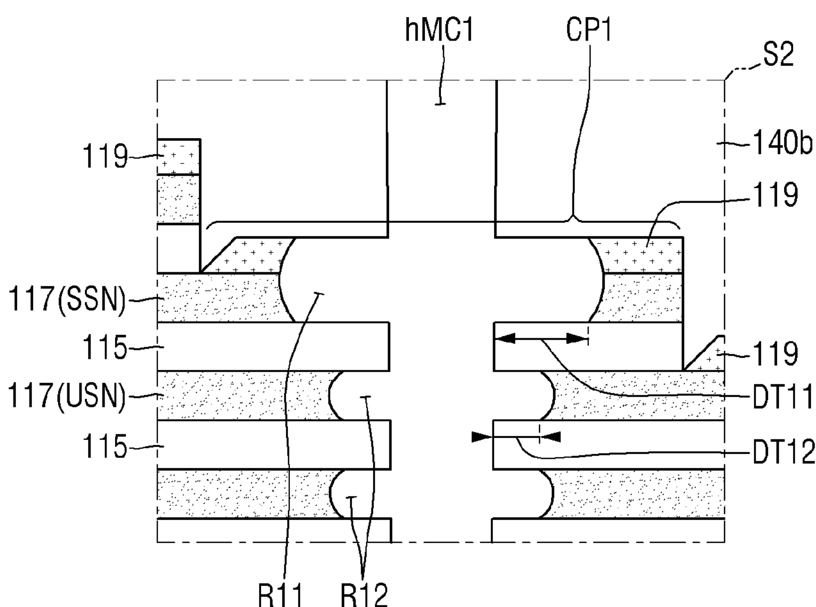

Referring to FIG. 28, the first recess process may be performed on the mold sacrifice films 112 and 117 and the pad sacrifice film 119, using the cell contact hole hMC1 and the through via hole hTV. In the following description, although the extended region EXT in which the cell contact hole hMC1 is formed will be mainly described, those who have ordinary knowledge in the technical field to which the present disclosure belongs may also understand the through region THR in which the through via hole hTV is formed.

As the first recess process is performed, the first recess R11 and the second recess R12 may be formed inside the mold sacrifice films 112 and 117 and the pad sacrifice film 119. Specifically, the first recess R11 may be formed in the selective mold sacrifice film SSN and the pad sacrifice film 119, and the second recess R12 may be formed in the non-selective mold sacrifice film USN. The first recessed process may include, but is not limited to, a wet etching process that uses, for example, phosphoric acid.

As explained above with respect to FIG. 22, because the material properties of the pad sacrifice film 119 may be adjusted to the level similar to that of the material properties of the mold sacrifice films 112 and 117, the first recess R11 may be formed uniformly over the selective mold sacrifice film SSN and the pad sacrifice film 119.

In some embodiments, a depth DT11 at which the first recess R11 is formed may be greater than a depth DT12 at which the second recess R12 is formed. This is because the sum of the thickness (TH11 of FIG. 27) of the selective mold sacrifice film SSN and the thickness (TH13 of FIG. 27) of the pad sacrifice film 119 is greater than the thickness of the non-selective mold sacrifice film USN.

Figure 29:
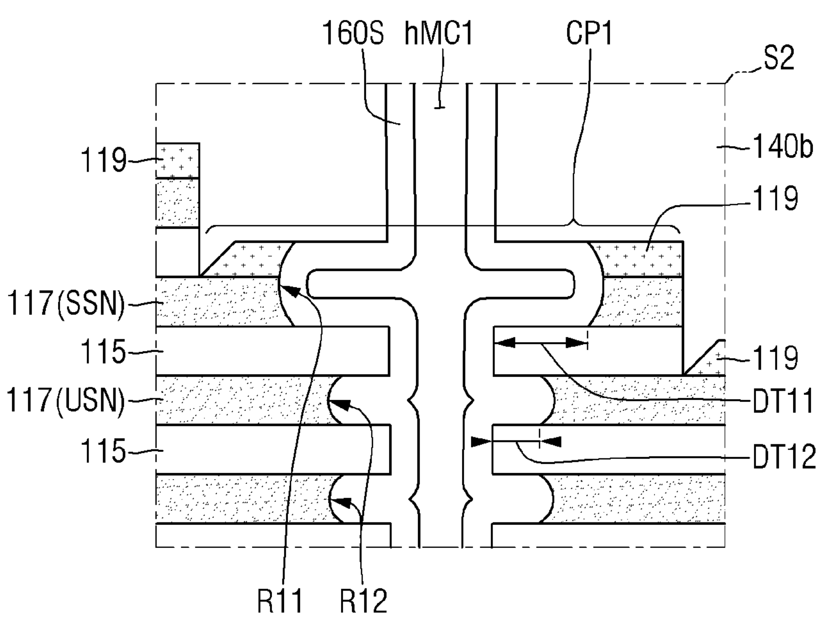

Referring to FIG. 29, a spacer film 160S may be formed inside the cell contact hole hMC1.

The spacer film 160S may extend along the profile of the cell contact hole hMC1. Further, the spacer film 160S may extend along the profiles of the first recess R11 and the second recess R12. The spacer film 160S may fill at least a part of the second recess R12. For example, due to the relatively narrow space of the second recess R12, the spacer film 160S may be formed to be relatively thick by being folded inside the second recess R12. Unlike this, since the first recess R11 has a relatively wide space, the spacer film 160S may be formed to be relatively thin inside the first recess R11.

The spacer film 160S may include, but is not limited to, an insulating material, for example, at least one of silicon oxide, silicon nitride and silicon oxynitride. As an example, the spacer film 160S may include a silicon oxide film.

Figure 30:
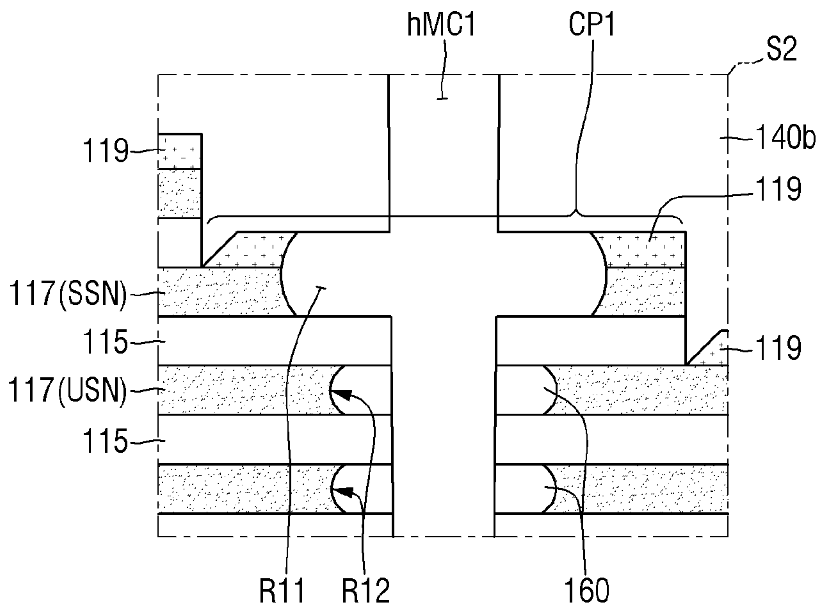

Referring to FIG. 30, the second recess process may be performed on the spacer film 160S.

As the second recess process is performed, the inner surface of the selective mold sacrifice film SSN and the inner surface of the pad sacrifice film 119 may be exposed. For example, the spacer film 160S formed to be relatively thin inside the first recess R11 may be completely removed.

In contrast, as the second recess process is performed, the inner surface of the non-selective mold sacrifice film USN may not be exposed. For example, the spacer film 160S formed to be relatively thick inside the second recess R12 may not be completely removed. Accordingly, the spacer film 160S remains in the second recess R12, and the insulating ring 160 may be formed.

Figure 31:
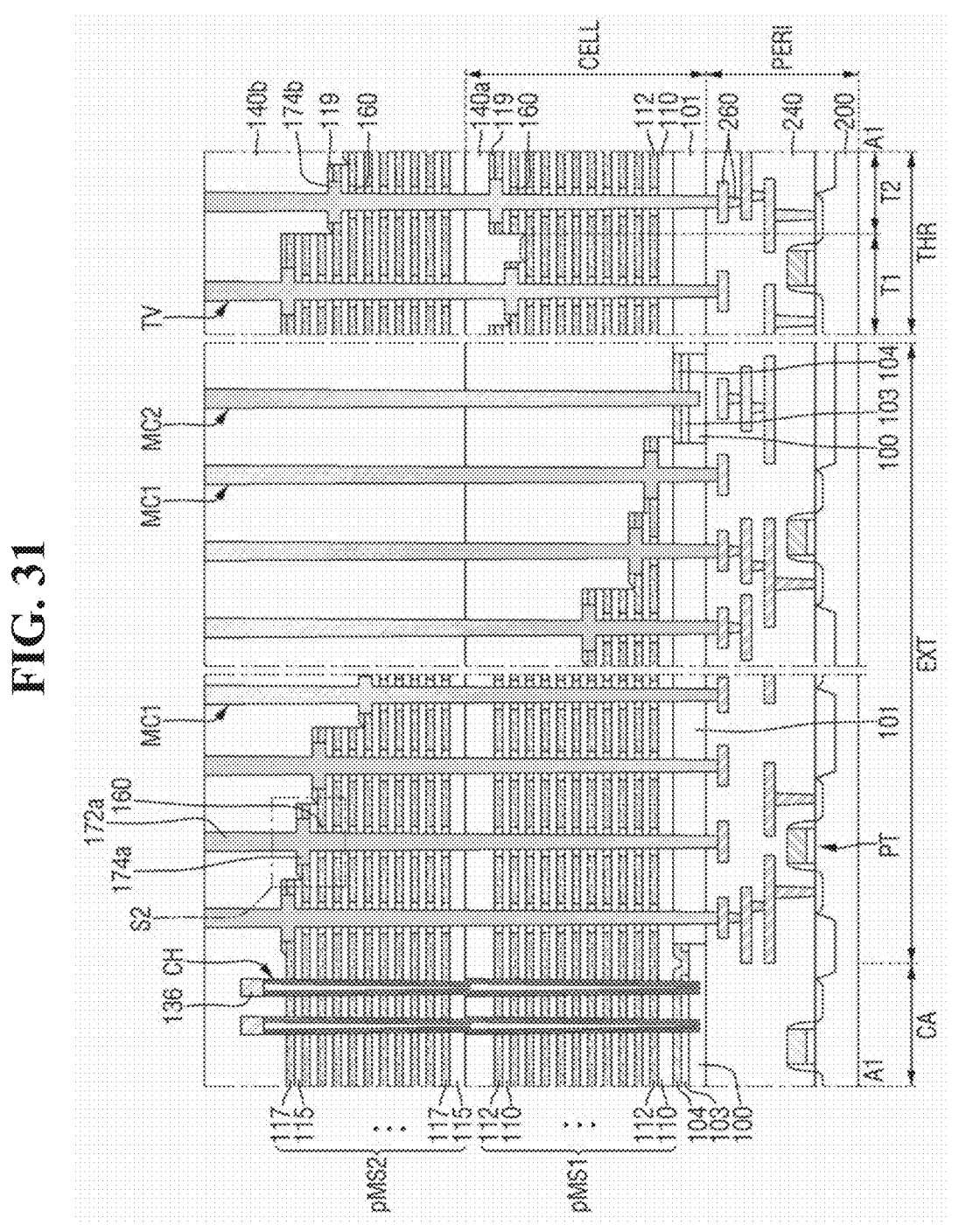
Figure 32:
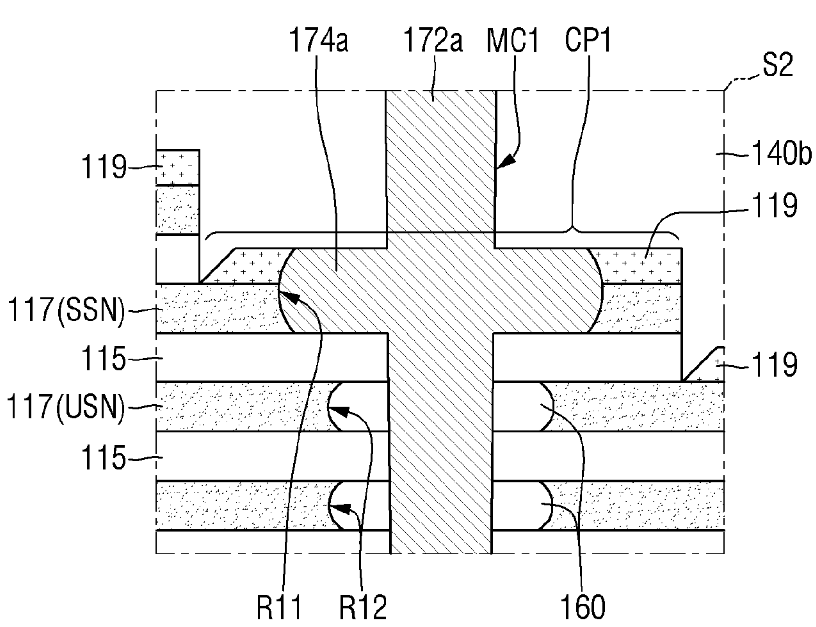

Referring to FIGS. 31 and 32, a cell contact MC1, a substrate contact MC2 and a through via TV may be formed inside the first preliminary mold pMS1 and the second preliminary mold pMS2. For reference, FIG. 32 is a partial cross-sectional view of a region S2 of FIG. 31.

The cell contact MC1 may fill the cell contact hole hMC1. Accordingly, the cell contact MC1 including the first penetration 172_a_ and the first protrusion 174_a_ may be formed. The through via TV may fill the through via hole hTV. As a result, the through via TV including the second penetration 172_b_ and the second protrusion 174_b_ may be formed. Further, the substrate contact MC2 may fill the substrate contact hole hMC2.

The cell contact MC1, the substrate contact MC2, and the through via TV may each include conductive materials, for example, but are not limited to, metals such as tungsten (W), cobalt (Co), and nickel (Ni), and semiconductor materials such as silicon.

Figure 33:
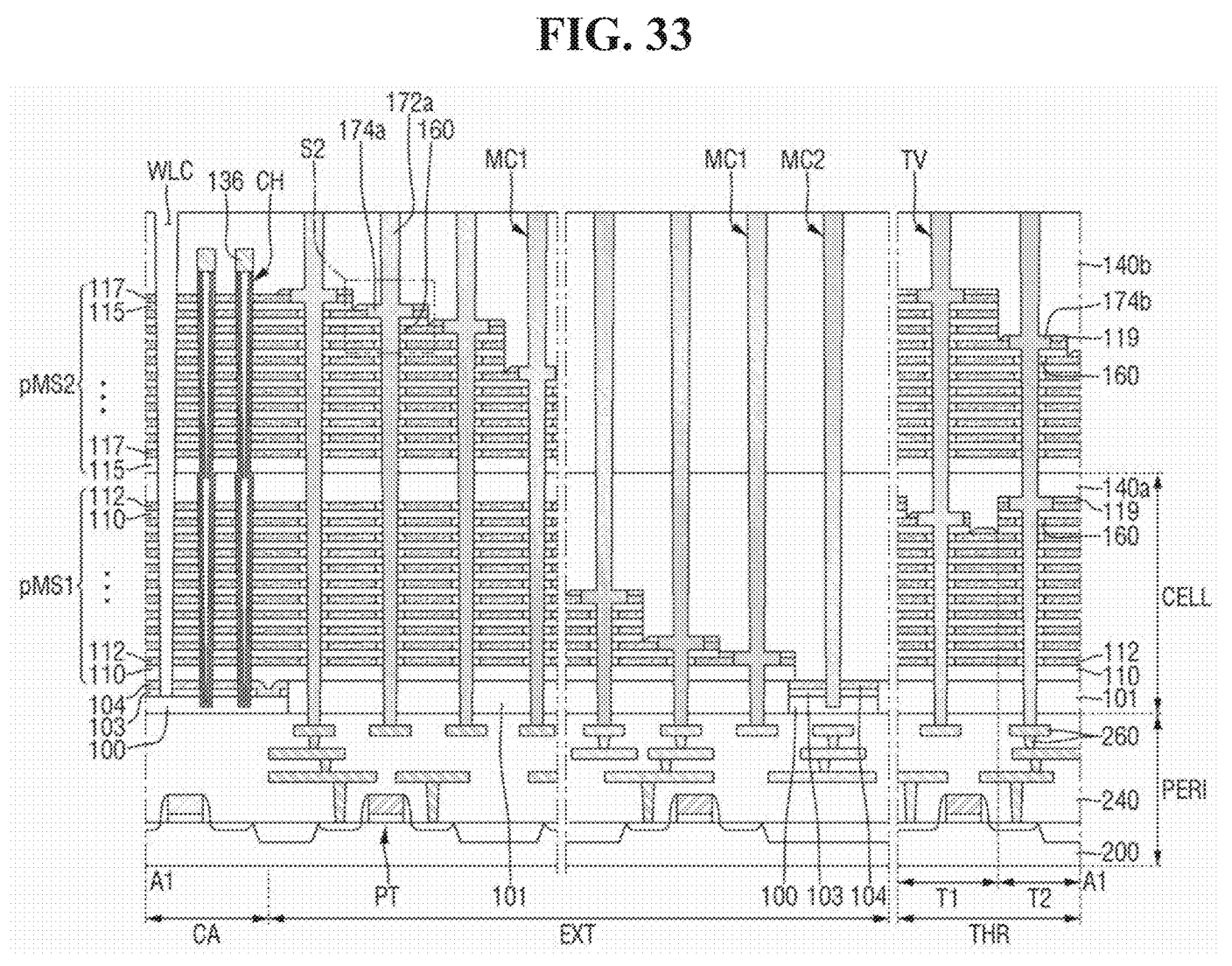

Referring to FIG. 33, a word line cut region WLC is formed.

The word line cut region WLC may extend in the first direction (e.g., X of FIG. 3) to cut the first preliminary mold pMS1 and the second preliminary mold pMS2 on the cell array region CA and the extended region EXT. In some embodiments, the word line cut region WLC may cut the source layer 102 and the support layer 104.

Figure 34:
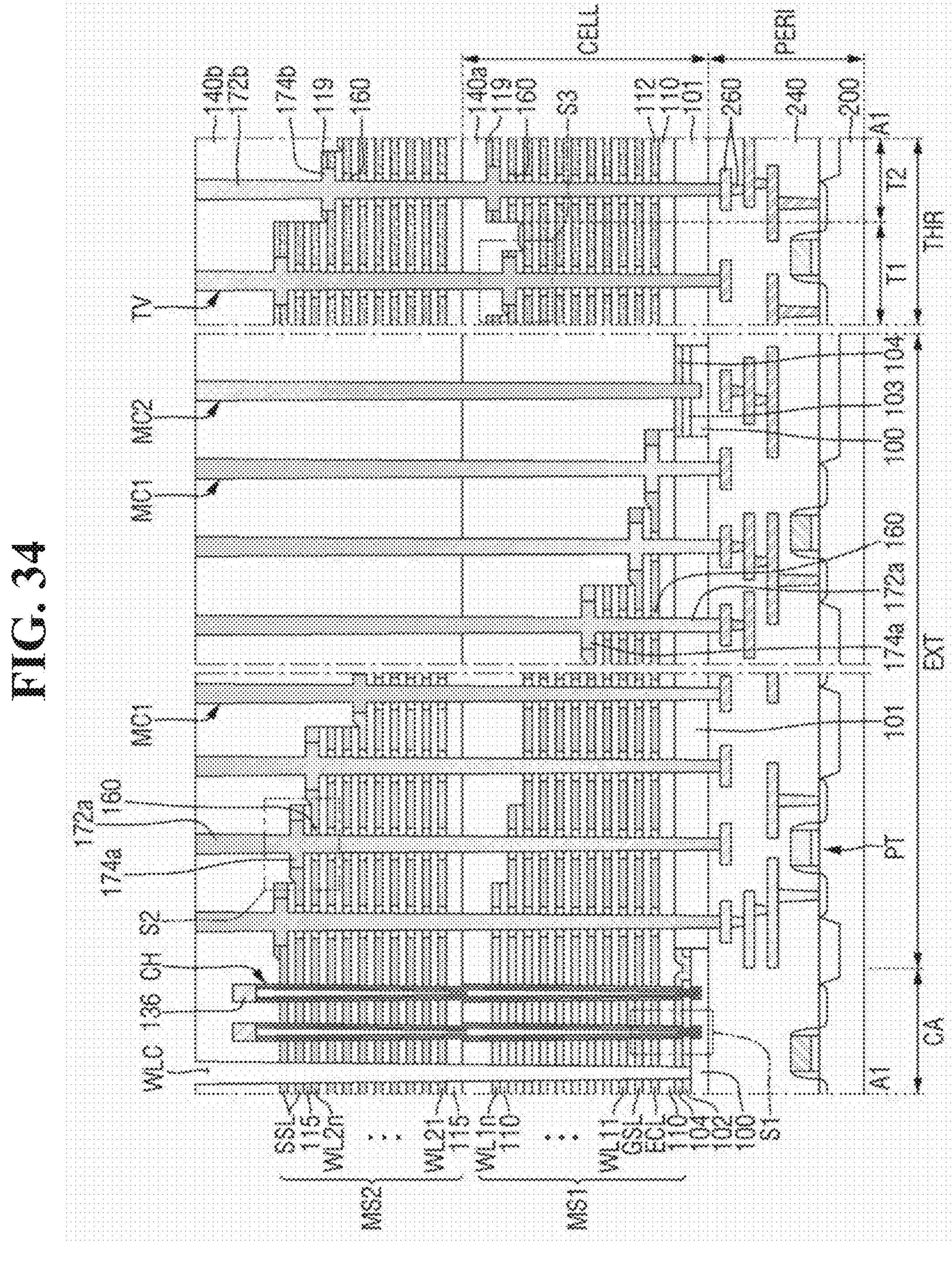
Figure 35:
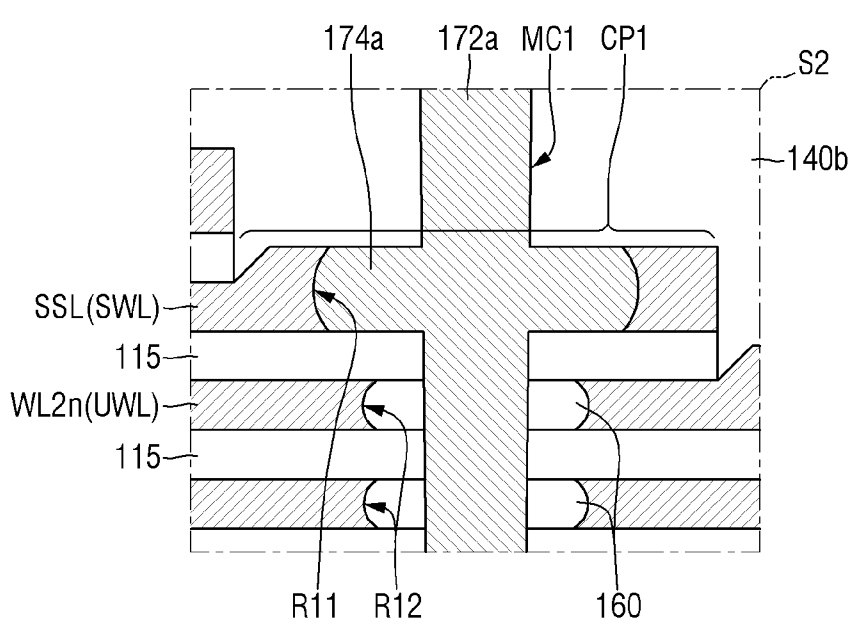
Figure 36:
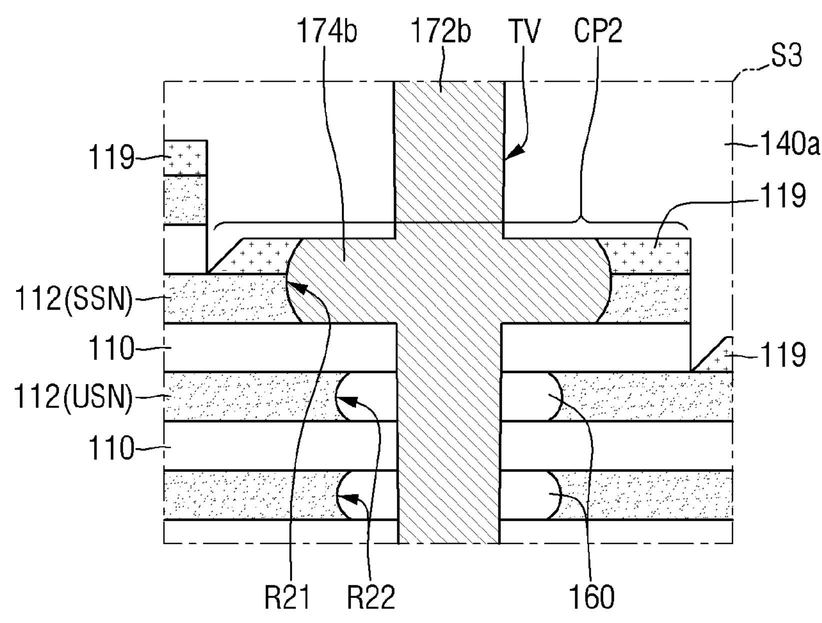

Referring to FIGS. 34 to 36, a plurality of gate electrodes ECL, GSL, WL11 to WL1_n_, WL21 to WL2_n_, and SSL may be formed on the cell array region CA and the extended region EXT. For reference, FIG. 35 is a partial cross-sectional view of a region S2 of FIG. 34, and FIG. 36 is a partial cross-sectional view of a region S3 of FIG. 34.

For example, the mold sacrifice films 112 and 117 may be selectively removed, using the word line cut region WLC. After that, the gate electrodes ECL, GSL, WL11 to WL1_n_, WL21 to WL2_n_, and SSL which replace the region from which the mold sacrifice films 112 and 117 are removed may be formed. Accordingly, the first mold structure MS1 including a plurality of first gate electrodes ECL, GSL, WL11 to WL1_n_ and the second mold structure MS2 including a plurality of second gate electrodes WL21 to WL2_n_ and SSL may be formed. Further, the cell contact MC1 may be electrically connected to each of the gate electrodes ECL, GSL, WL11 to WL1_n_, WL21 to WL2_n_, and SSL through the first pad region CP1. After the first mold structure MS1 and the second mold structure MS2 are formed, the word line cut region WLC may be filled with an insulating material.

The mold sacrifice films 112 and 117 on the through region THR may remain unremoved. Accordingly, the through via TV may come into contact with at least a part of the plurality of mold sacrifice films 112 and 117 and the pad sacrifice film 119.

In some embodiments, the source layer 102 may be formed on the cell array region CA. For example, the source sacrifice layer 103 on the cell array region CA may be selectively removed, using the word line cut region WLC. After that, the source layer 102 which replaces the region from which the source sacrifice layer 103 is removed may be formed.

Next, referring to FIG. 4, the bit line BL and the first wiring structure 180 may be formed on the mold structures MS1 and MS2. Accordingly, the semiconductor memory device explained above using FIGS. 3 to 8 may be fabricated.

Hereinafter, the effects of the semiconductor memory device according to some embodiments will be described referring to FIGS. 37 and 38.

Figure 37:
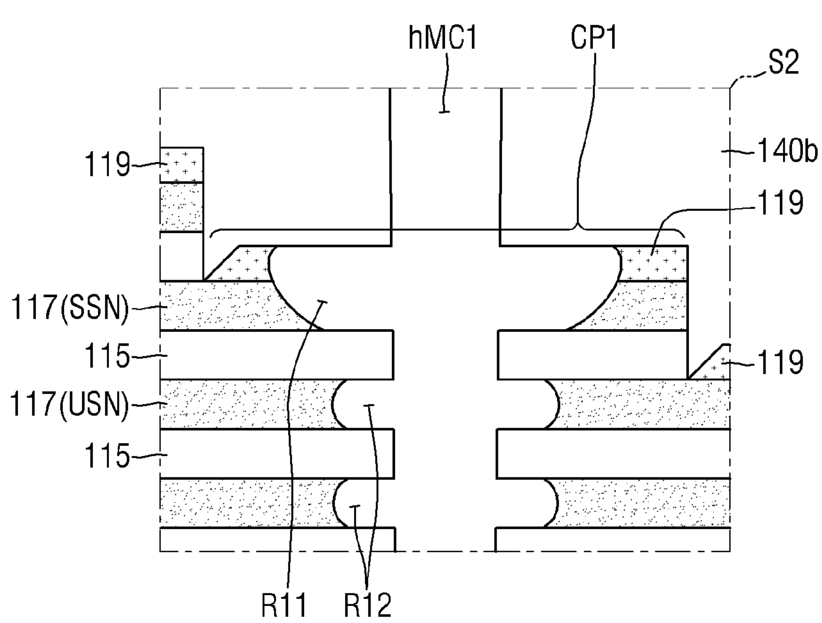
FIGS. 37 and 38 are diagrams of effects of the semiconductor memory device according to an example embodiment.
Figure 38:
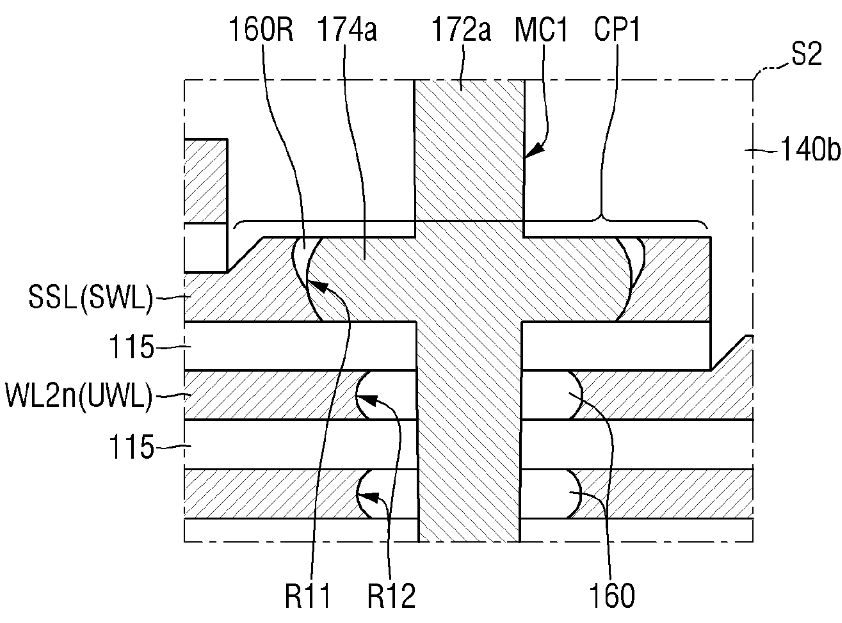

FIGS. 37 and 38 are diagrams of effects of the semiconductor memory device according to an example embodiment. As a reference, FIG. 37 shows a case where the first surface treatment process ST1 explained above using FIG. 22 is not performed in the steps after FIG. 21.

Referring to FIGS. 37 and 38, when the first surface treatment process ST1 is not performed, a defect may occur in the first recess R11.

For example, if the first surface treatment process ST1 explained above using FIG. 22 is not performed, the material properties of the pad sacrifice film 119 may not be adjusted to the level similar to that of the material properties of the mold sacrifice films 112 and 117. As an example, the etching rate of the pad sacrifice film 119 may be greater than the etching rate of the mold sacrifice films 112 and 117 with respect to the first recess process explained above with respect to FIG. 28. In such a case, as shown, the first recess R11 may not be uniformly formed over the selective mold sacrifice film SSN and the pad sacrifice film 119.

The steps explained above using FIGS. 29 to 36 may then be performed. In this case, a residual insulator 160R may remain in the first recess R11. The residual insulator 160R may be formed, for example, by the spacer film 160S that remains without being completely removed in the second recess process explained above using FIG. 30. Such a residual insulator 160R causes a poor connection between the selective gate electrode SWL and the cell contact MC1. Alternatively, an additional process may be required to remove such a residual insulator 160R.

In contrast, as explained above using FIGS. 20 to 36, in the semiconductor memory device according to some embodiments, the material properties of the pad sacrifice film 119 may be adjusted to the level similar to that of material properties of the mold sacrifice films 112 and 117. This makes it possible to provide a semiconductor memory device in which defects can be improved and fabricating costs are reduced, and a method for fabricating the same.

Figure 39:
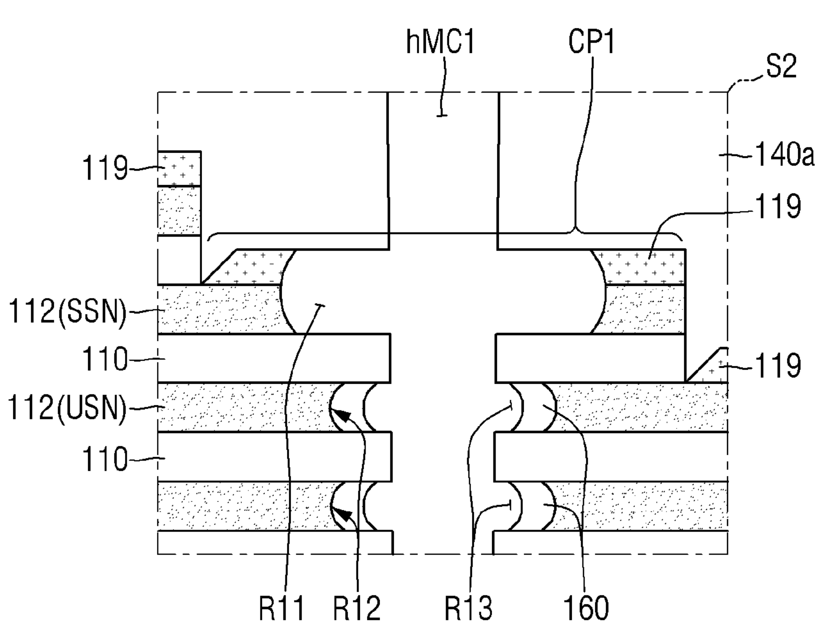
FIG. 39 is a diagram of a method for fabricating the semiconductor memory device according to an example embodiment.

FIG. 39 is a diagram of a method for fabricating the semiconductor memory device according to an example embodiment. For reference, FIG. 39 is an intermediate step diagram of the steps after FIG. 29. For convenience of explanation, repeated parts of contents explained above using FIGS. 1 to 36 will be briefly described or omitted.

Referring to FIG. 39, an inner surface of the insulating ring 160 may be recessed from the inner surfaces of the mold insulating films 110 and 115.

For example, as the second recess process is performed, the spacer film 160S of FIG. 29 formed in the second recess R12 may be recessed from the inner surfaces of the mold insulating films 110 and 115.

Next, the steps explained above using FIGS. 31 to 36 may be performed. Therefore, the semiconductor memory device explained above using FIG. 9 may be fabricated.

FIGS. 40 and 41 are diagrams of a method for fabricating a semiconductor memory device according to an example embodiment. For reference, FIG. 40 is an intermediate step diagram of the steps after FIG. 20. For convenience of explanation, repeated parts of contents explained above using FIGS. 1 to 36 will be briefly described or omitted.

Referring to FIG. 40, a second surface treatment process ST2 may be performed on the first mold sacrifice film 112.

As the second surface treatment process ST2 is performed, a pad portion 112_t_ may be formed inside a part of the first mold sacrifice film 112 whose upper surface is exposed. The material properties of the pad portion 112_t_ may be adjusted to the level similar to that of the material properties of the pad sacrifice film 119 formed in a subsequent process. The second surface treatment process ST2 for forming the pad portion 112_t_ may include, for example, but is not limited to, an ion implantation process, a heat treatment process, a UV/$O_3$ (ultraviolet/ozone) treatment process, and the like.

Referring to FIG. 41, a pad sacrifice film 119 may be formed on the pad portion 112*t*.

Since formation of the pad sacrifice film 119 is similar to that explained above using FIG. 21, the detailed description will be omitted below.

The steps explained above using FIGS. 22 to 36 may then be performed. Therefore, the semiconductor memory device explained above using FIGS. 12 and 13 may be fabricated.

Hereinafter, an electronic system including the semiconductor memory device according to an exemplary embodiment will be described referring to FIGS. 1 to 44.

Figure 42:
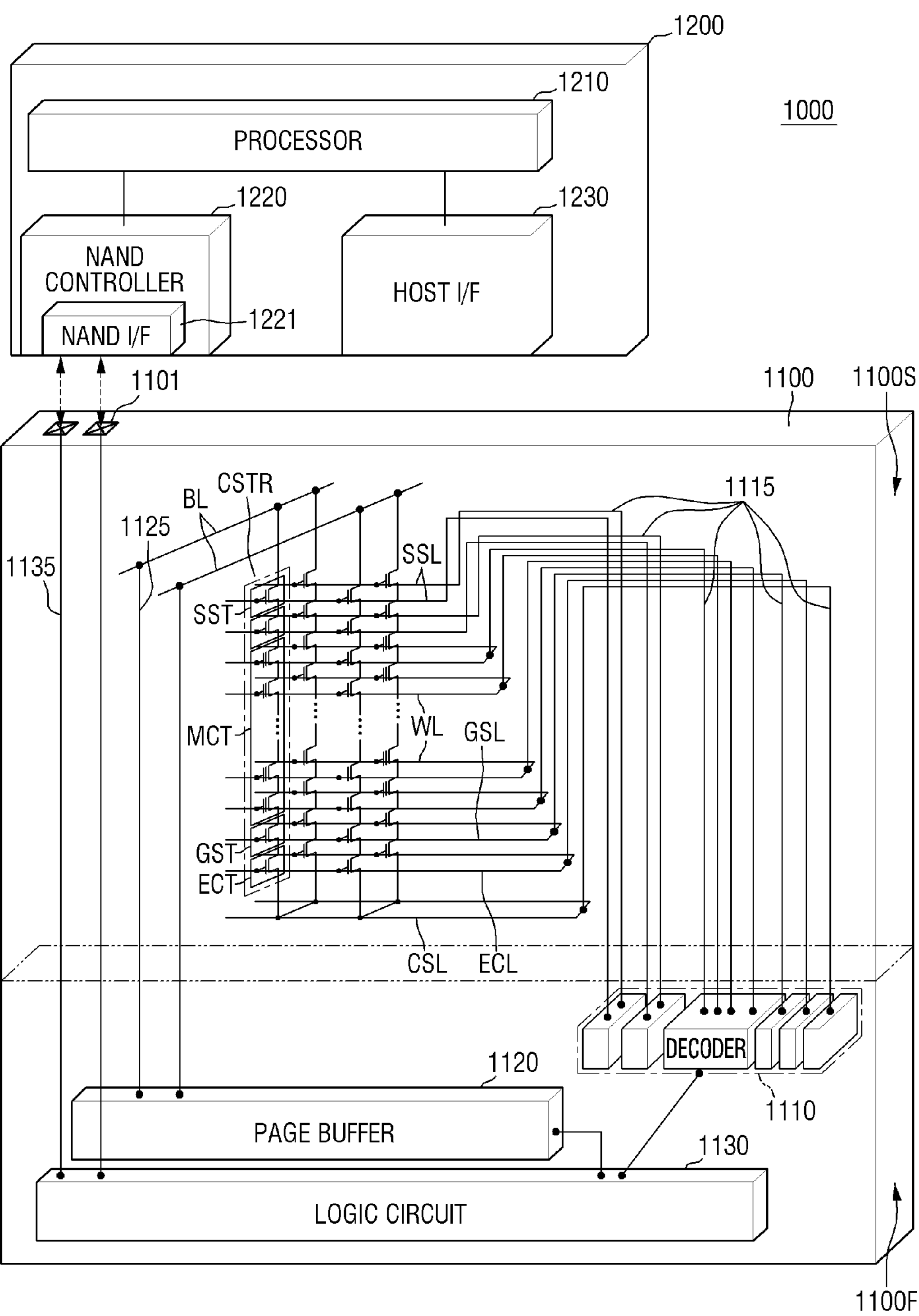
FIG. 42 is a block diagram of an electronic system according to an example embodiment.
Figure 43:
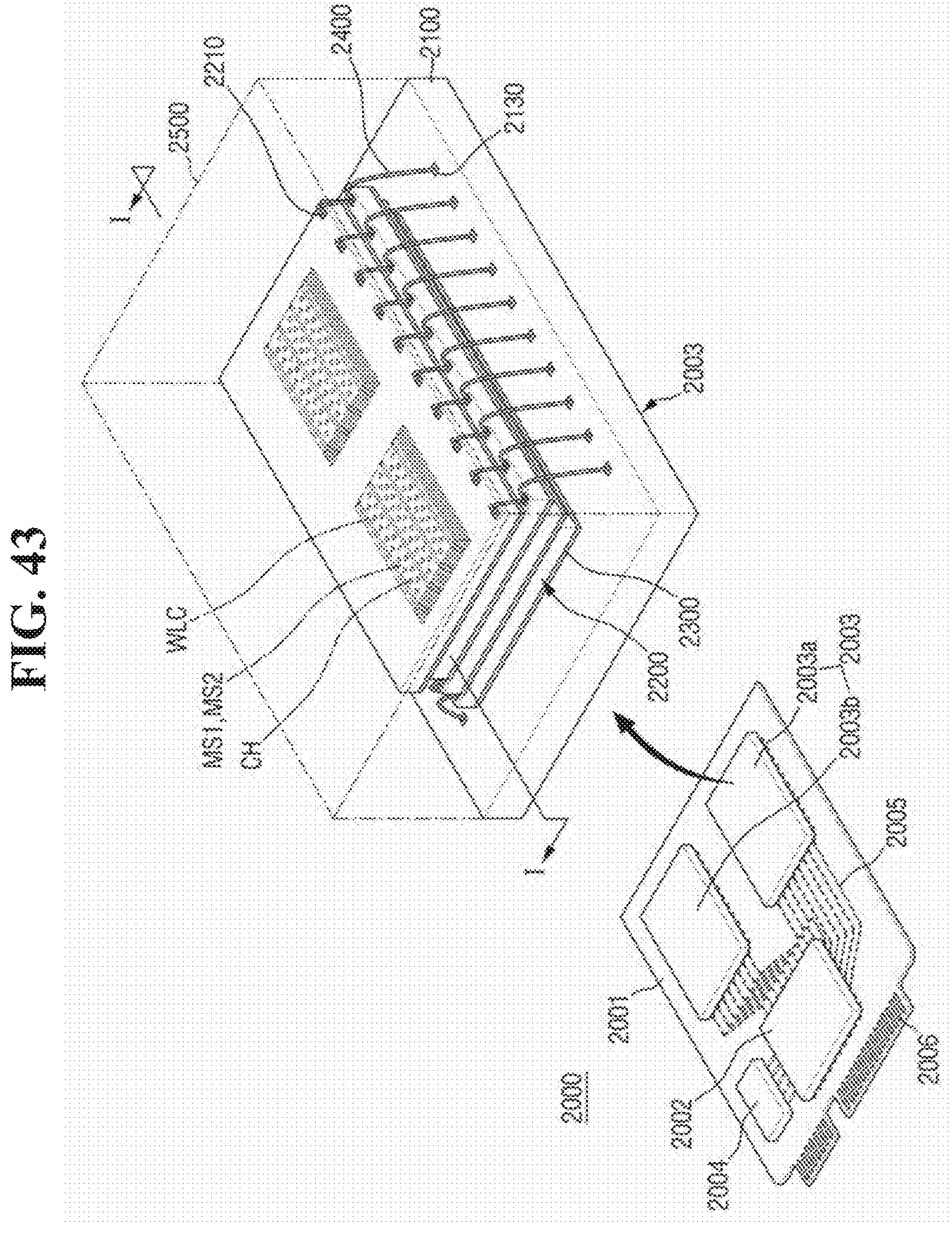
FIG. 43 is a perspective view of an electronic system according to an example embodiment.
Figure 44:
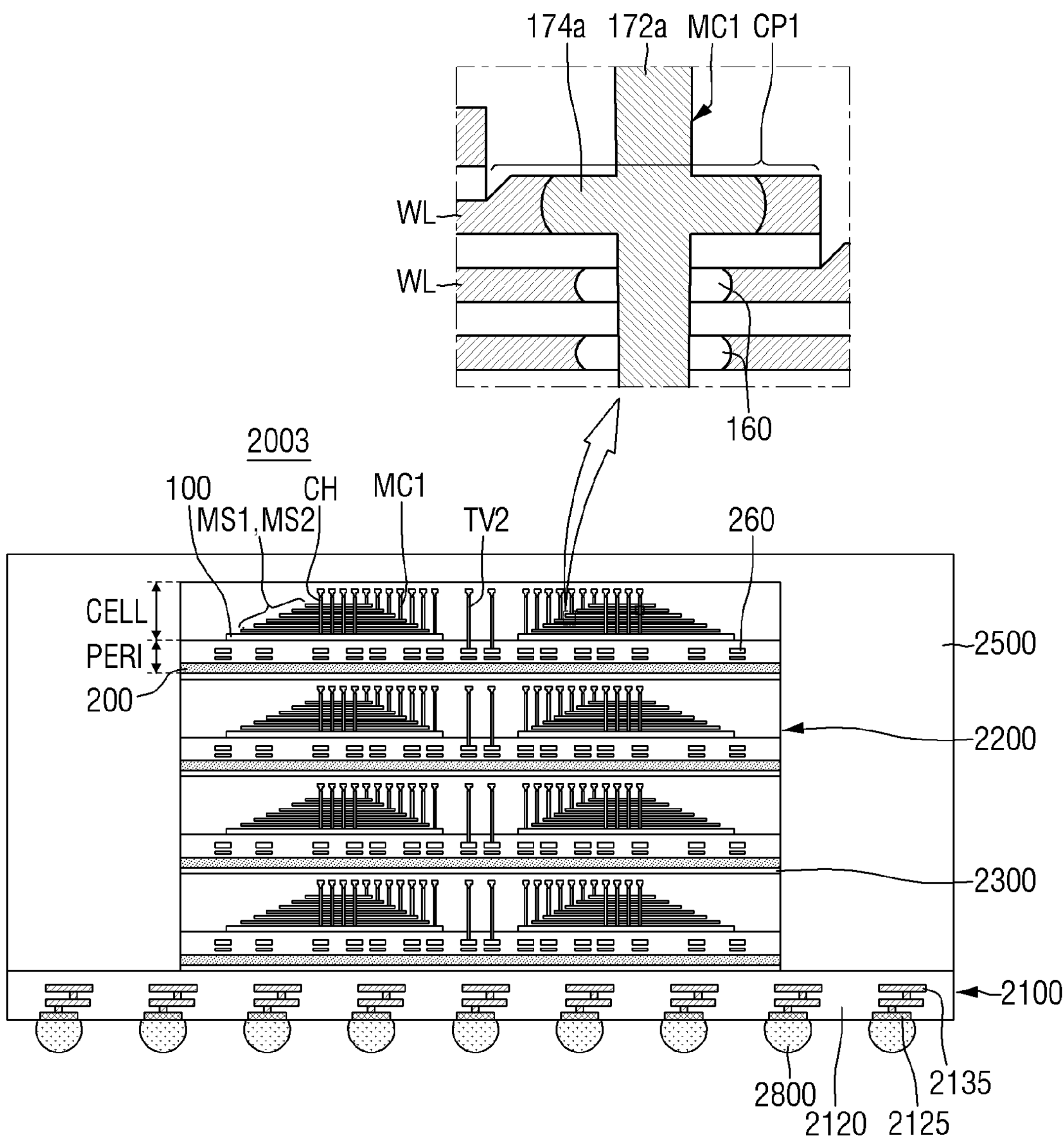
FIG. 44 is a cross-sectional view taken along I-I of FIG. 43 according to an example embodiment.

FIG. 42 is a block diagram of an electronic system according to an example embodiment. FIG. 43 is a perspective view of an electronic system according to an example embodiment. FIG. 44 is a cross-sectional view taken along I-I of FIG. 43 according to an example embodiment.

Referring to FIG. 42, an electronic system 1000 according to some embodiments may include a semiconductor memory device 1100, and a controller 1200 that is electrically connected to the semiconductor memory device 1100. The electronic system 1000 may be a storage device that includes one or multiple semiconductor memory devices 1100, or an electronic device that includes the storage device. For example, the electronic system 1000 may be a solid state drive (SSD) device, a universal serial bus (USB), a computing system, a medical device or a communication device that includes one or multiple semiconductor memory devices 1100.

The semiconductor memory device 1100 may be a non-volatile memory device (e.g., a NAND flash memory device), and may be, for example, the semiconductor memory device explained above using FIG. 1 to 18. The semiconductor memory device 1100 may include a first structure 1100F, and a second structure 1100S on the first structure 1100F.

The first structure 1100F may be a peripheral circuit structure that includes a decoder circuit 1110 (e.g., the row decoder 33 of FIG. 1), a page buffer 1120 (e.g., the page buffer 35 of FIG. 1), and a logic circuit 1130 (e.g., the control logic 37 of FIG. 1).

The second structure 1100S may include the common source line CSL, the plurality of bit lines BL, and the plurality of cell strings CSTR explained above using FIG. 2. The cell strings CSTR may be connected to the decoder circuit 1110 through the word line WL, at least one string selection line SSL, and at least one ground selection line GSL. Further, the cell strings CSTR may be connected to the page buffer 1120 through the bit lines BL.

In some embodiments, the common source line CSL and cell strings CSTR may be electrically connected to the decoder circuit 1110 through first connecting wirings 1115 that extend from the first structure 1100F to the second structure 1100S. The first connecting wiring 1115 may correspond to the through via TV explained above using FIGS. 1 to 18. That is, the through via TV may electrically connect each of the gate electrodes ECL, GSL, WL, and SSL and the decoder circuit 1110 (e.g., the row decoder 33 of FIG. 1).

In some embodiments, the bit lines BL may be electrically connected to the page buffer 1120 through second connecting wirings 1125 that extend from the first structure 1100F to the second structure 1100S. The second connecting wiring 1125 may correspond to the through via TV explained above using FIGS. 1 to 18. That is, the through via TV may electrically connect the bit lines BL and the page buffer 1120 (e.g., the page buffer 35 of FIG. 1).

The semiconductor memory device 1100 may communicate with the controller 1200 through an I/O pad 1101 electrically connected to a logic circuit 1130 (e.g., the control logic 37 of FIG. 1). The I/O pad 1101 may be electrically connected to the logic circuit 1130 through the I/O connecting wiring 1135 that extends from the inside of the first structure 1100F to the second structure 1100S.

The controller 1200 may include a processor 1210, a NAND controller 1220, and a host interface 1230. In some embodiments, the electronic system 1000 may include a plurality of semiconductor memory devices 1100, and in this case, the controller 1200 may control the plurality of semiconductor memory devices 1100.

The processor 1210 may control the operation of the overall electronic system 1000 including the controller 1200. The processor 1210 may operate according to a predetermined firmware, and may control the NAND controller 1220 to access the semiconductor memory device 1100. The NAND controller 1220 may include a NAND interface 1221 that processes communication with the semiconductor memory device 1100. Control command for controlling the semiconductor memory device 1100, data to be recorded in the memory cell transistors MCT of the semiconductor memory device 1100, data to be read from the memory cell transistors MCT of the semiconductor memory device 1100, and the like may be transmitted through the NAND interface 1221. The host interface 1230 may provide a communication function between the electronic system 1000 and an external host. When receiving the control command from the external host through the host interface 1230, the processor 1210 may control the semiconductor memory device 1100 in response to the control command.

Referring to FIGS. 43 and 44, the electronic system according to some embodiments may include a main board 2001, a main controller 2002 mounted on the main board 2001, one or more semiconductor packages 2003, and a dynamic random access memory (DRAM) 2004. The semiconductor package 2003 and the DRAM 2004 may be connected to the main controller 2002 by wiring patterns 2005 formed on the main board 2001.

The main board 2001 may include a connector 2006 including a plurality of pins coupled to the external host. In the connector 2006, the number and arrangement of the plurality of pins may vary depending on the communication interface between the electronic system 2000 and the external host. In some embodiments, the electronic system 2000 may communicate with the external host according to any one of interfaces such as M-Phy for USB, peripheral component interconnect express (PCI Express), serial advanced technology attachment (SATA), and universal flash storage (UFS). In some embodiments, the electronic system 2000 may operate by power supplied from the external host through the connector 2006. The electronic system 2000 may further include a power management integrated circuit (PMIC) that distributes the power supplied from the external host to the main controller 2002 and the semiconductor package 2003.

The main controller 2002 may record data in the semiconductor package 2003 or read data from the semiconductor package 2003, and may improve the operating speed of the electronic system 2000.

The DRAM 2004 may be a buffer memory for relieving a speed difference between the semiconductor package 2003, which is a data storage space, and the external host. The DRAM 2004 included in the electronic system 2000 may also operate as a kind of cache memory, and may also provide a space for temporarily storing data in the control operation on the semiconductor package 2003. When the DRAM 2004 is included in the electronic system 2000, the main controller 2002 may further include a DRAM controller for controlling the DRAM 2004, in addition to a NAND controller for controlling the semiconductor package 2003.

The semiconductor package 2003 may include a first semiconductor package 2003*a* and a second semiconductor package 2003*b* that are spaced apart from each other. The first semiconductor package 2003*a* and the second semiconductor package 2003*b* may each be a semiconductor package that includes a plurality of semiconductor chips 2200. The first semiconductor package 2003*a* and the second semiconductor package 2003*b* may each include a package substrate 2100, semiconductor chips 2200 on the package substrate 2100, adhesive layers 2300 disposed on the lower sides of each of the package chips 220, a connecting structure 2400 for electrically connecting the semiconductor chips 2200 and the package substrate 2100, and a molding layer 2500 that covers the semiconductor chips 2200 and the connecting structure 2400 on the package substrate 2100.

The package substrate 2100 may be a printed circuit board that includes package upper pads 2130. Each semiconductor chip 2200 may include an I/O pad 2210. The I/O pad 2210 may correspond to the I/O pad 1101 of FIG. 42.

In some embodiments, the connecting structure 2400 may be a bonding wire that electrically connects the I/O pad 2210 and the package upper pads 2130. Therefore, in each of the first semiconductor package 2003*a* and the second semiconductor package 2003*b*, the semiconductor chips 2200 may be electrically connected to each other by a bonding wire type, and may be electrically connected to the package upper pads 2130 of the package substrate 2100. In some embodiments, in each of the first semiconductor package 2003*a* and the second semiconductor package 2003*b*, the semiconductor chips 2200 may be electrically connected to each other by a connecting structure including a through electrode (Through Silicon Via, TSV) instead of the connecting structure 2400 of the bonding wire type.

In some embodiments, the main controller 2002 and the semiconductor chips 2200 may also be included in a single package. In some embodiments, the main controller 2002 and the semiconductor chips 2200 are mounted on a separate interposer board different from the main board 2001, and the main controller 2002 and the semiconductor chips 2200 may also be connected to each other by the wiring formed on the interposer board.

In some embodiments, the package substrate 2100 may be a printed circuit board. The package substrate 2100 may include a package substrate body portion 2120, package upper pads 2130 disposed on an upper side of the package substrate body portion 2120, lower pads 2125 disposed on a lower side of the package substrate body portion 2120 or exposed through the lower side, and inner wirings 2135 that electrically connect the upper pads 2130 and the lower pads 2125 inside the package substrate body portion 2120. The upper pads 2130 may be electrically connected to the connecting structure 2400. The lower pads 2125 may be connected to the wiring patterns 2005 of the main board 2001 of the electronic system 2000 through conductive connections 2800 as in FIG. 43.

In the electronic system according to some embodiments, each of the semiconductor chips 2200 may include the semiconductor memory device explained above using FIGS. 1 to 18. For example, each of the semiconductor chips 2200 may include a peripheral circuit structure PERI and a memory cell structure CELL stacked on the peripheral circuit structure PERI. As an example, the peripheral circuit structure PERI may include the peripheral circuit substrate 200 explained above using FIGS. 3 to 8. Further, as an example, the memory cell structure CELL may include the cell substrate 100, the mold structures MS1 and MS2, the channel structure CH, the word line cut region WLC, the bit line BL, and the cell contact MC1 explained above using FIGS. 3 to 8.

At least one of the components, elements, modules or units (collectively "components" in this paragraph) represented by a block in the drawings may be embodied as various numbers of hardware, software and/or firmware structures that execute respective functions described above. At least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Functional aspects of the above example embodiments may be implemented in algorithms that execute on one or more processors. Furthermore, the components represented by a block or processing steps may employ any number of related art techniques for electronics configuration, signal processing and/or control, data processing and the like.

Although the disclosure been described in connection with some embodiments illustrated in the accompanying drawings, it will be understood by one of ordinary skill in the art that variations in form and detail may be made therein without departing from the spirit and essential feature of the disclosure. The above disclosed embodiments should thus be considered illustrative and not restrictive.

What is claimed is:

1. A semiconductor memory device, comprising:

a peripheral circuit structure comprising a peripheral circuit substrate, a peripheral circuit element on the peripheral circuit substrate, and a wiring structure connected to the peripheral circuit element; and a memory cell structure provided on the peripheral circuit structure, wherein the memory cell structure comprises:

a cell substrate comprising a cell array region, an extended region, and a through region, a mold structure comprising a plurality of gate electrodes sequentially provided on the cell array region and on the extended region in a step form, and a plurality of mold sacrifice films sequentially provided on the through region, a channel structure intersecting the plurality of gate electrodes on the cell array region, a cell contact penetrating the mold structure on the extended region and configured to connect at least one of the plurality of gate electrodes and the wiring structure, a pad sacrifice film extending along exposed upper surfaces of the plurality of mold sacrifice films, and a through via penetrating the mold structure and the pad sacrifice film on the through region, the through via being connected to the wiring structure, wherein the plurality of mold sacrifice films comprise a selective mold sacrifice film contacting the through via, and a non-selective mold sacrifice film different from the selective mold sacrifice film, wherein the pad sacrifice film comprises an insulating film doped with an impurity element, or the selective mold sacrifice film comprises material properties different from material properties of the non-selective mold sacrifice film wherein the impurity element comprises at least one of carbon (C), nitrogen (N), oxygen (O), and silicon (Si), wherein each of the plurality of mold sacrifice films comprise a silicon nitride film, and wherein the pad sacrifice film comprises a silicon nitride film doped with the impurity element.

2. The semiconductor memory device of claim 1, wherein the plurality of gate electrodes comprise a selective gate electrode electrically connected to the cell contact, and a non-selective gate electrode different from the selective gate electrode, wherein the selective gate electrode comprises a pad region comprising an upper surface exposed on the extended region, and wherein the selective gate electrode has a first thickness in the pad region which is thicker than a second thickness of a region other than the pad region.

3. The semiconductor memory device of claim 2, wherein the cell contact comprises:

a first penetration part extending in a vertical direction intersecting an upper surface of the cell substrate and penetrating the mold structure, and a first protrusion part protruding from a side surface of the first penetration part and configured to contact the selective gate electrode, and wherein the through via comprises:

a second penetration part extending in the vertical direction and penetrating the mold structure, and a second protrusion part protruding from a side surface of the second penetration part and configured to contact the selective mold sacrifice film and the pad sacrifice film.

4. The semiconductor memory device of claim 3, further comprising:

an insulating ring provided between the non-selective gate electrode and the first penetration part, and between the non-selective mold sacrifice film and the second penetration part.

5. The semiconductor memory device of claim 1, wherein the selective mold sacrifice film comprises a pad portion provided below the pad sacrifice film, and wherein the pad portion and the non-selective mold sacrifice film comprise different material properties.

6. The semiconductor memory device of claim 5, wherein, in a wet etching process that uses phosphoric acid, a first etching rate of the pad portion and a second etching rate of the pad sacrifice film are greater than a third etching rate of the non-selective mold sacrifice film.

7. The semiconductor memory device of claim 1, wherein the pad sacrifice film comprises a first sub-pad sacrifice film and a second sub-pad sacrifice film sequentially provided on an upper surface of the selective mold sacrifice film, and wherein the first sub-pad sacrifice film and the second sub-pad sacrifice film comprise different material properties.

8. The semiconductor memory device of claim 7, wherein, in a wet etching process that uses phosphoric acid, a first etching rate of the first sub-pad sacrifice film is greater than a second etching rate of the second sub-pad sacrifice film.

9. A semiconductor memory device, comprising:

a cell substrate comprising a cell array region, an extended region, and a through region;

a mold structure comprising a plurality of gate electrodes sequentially provided on the cell array region and on the extended region in a step form, each of the plurality of gate electrodes comprising a pad region in which an upper surface is exposed, and a plurality of mold sacrifice films sequentially provided on the through region;

a channel structure provided on the cell array region, extending in a vertical direction intersecting an upper surface of the cell substrate and intersecting the plurality of gate electrodes;

a cell contact extending in the vertical direction, penetrating the mold structure on the extended region, and connected to the pad region;

a pad sacrifice film extending along exposed upper surfaces of the plurality of mold sacrifice films; and a through via extending in the vertical direction, and penetrating the mold structure and the pad sacrifice film on the through region, wherein each of the plurality of gate electrodes has a first thickness in the pad region thicker than a second thickness in a region other than the pad region, wherein the pad sacrifice film comprises an insulating film doped with at least one impurity element among carbon (C), nitrogen (N), oxygen (O), and silicon (Si)

wherein each of the plurality of mold sacrifice films comprises a silicon nitride film, and wherein the pad sacrifice film comprises a silicon nitride film doped with the at least one impurity element.

10. The semiconductor memory device of claim 9, wherein the cell contact comprises:

a penetration part extending in the vertical direction and penetrating the mold structure, and a protrusion part protruding from a side surface of the penetration part and contacting a side surface of the pad region.

11. The semiconductor memory device of claim 10, further comprising:

an insulating ring provided between a non-selective gate electrode among the plurality of gate electrodes and the penetration part, the non-selective gate electrode being provided below the pad region.

12. The semiconductor memory device of claim 9, wherein the plurality of mold sacrifice films comprise a selective mold sacrifice film contacting the through via, and a non-selective mold sacrifice film, and wherein the through via comprises:

a penetration part extending in the vertical direction and penetrating the mold structure, and a protrusion part protruding from a side surface of the penetration part and contacting a side surface of the selective mold sacrifice film and a side surface of the pad sacrifice film.

13. The semiconductor memory device of claim 12, further comprising:

an insulating ring provided between the non-selective mold sacrifice film and the penetration part.

14. The semiconductor memory device of claim 9, wherein at least a part of the pad sacrifice film extends along an upper surface of an uppermost mold sacrifice film among the plurality of mold sacrifice films.

15. An electronic system comprising:

a main board;

a semiconductor memory device on the main board; and a controller electrically connected to the semiconductor memory device on the main board, wherein the semiconductor memory device comprises:

a cell substrate comprising a cell array region, an extended region, and a through region, a mold structure comprising a plurality of gate electrodes sequentially provided on the cell array region and on the extended region in a step form, and a plurality of mold sacrifice films sequentially provided on the through region, a channel structure intersecting the plurality of gate electrodes on the cell array region, a cell contact penetrating the mold structure on the extended region and configured to connect at least one of the plurality of gate electrodes and the controller, a pad sacrifice film extending along exposed upper surfaces of the plurality of mold sacrifice films, and a through via penetrating the mold structure and the pad sacrifice film on the through region, the through via configured to be connected to the controller, wherein the plurality of mold sacrifice films comprises a selective mold sacrifice film contacting the through via, and a non-selective mold sacrifice film different from the selective mold sacrifice film, wherein the pad sacrifice film comprises an insulating film doped with an impurity element, or the selective mold sacrifice film comprises material properties different from material properties of the non-selective mold sacrifice film wherein the impurity element comprises at least one of carbon (C), nitrogen (N), oxygen (O), and silicon (Si), wherein each of the plurality of mold sacrifice films comprise a silicon nitride film, and wherein the pad sacrifice film comprises a silicon nitride film doped with the impurity element.

16. The electronic system of claim 15, further comprising:

a word line cut region extending in a first direction parallel to an upper surface of the cell substrate and cutting the mold structure; and a bit line extending in a second direction intersecting the first direction, and connected to the channel structure.

17. The electronic system of claim 16, wherein the through via connects the cell contact and the controller or the bit line and the controller.

* * * * *